United States Patent
Frey et al.

(10) Patent No.: US 11,309,495 B2
(45) Date of Patent: Apr. 19, 2022

(54) SEMICONDUCTING MATERIAL COMPRISING A PHOSPHINE OXIDE MATRIX AND METAL SALT

(71) Applicant: Novaled GmbH, Dresden (DE)

(72) Inventors: Julien Frey, Dresden (DE); Domagoj Pavicic, Dresden (DE); Ulrich Denker, Dresden (DE); Vygintas Jankus, Dresden (DE); Carsten Rothe, Dresden (DE); Francois Cardinali, Dresden (DE); Katja Gräf, Dresden (DE); Ulrich Heggemann, Dresden (DE); Omrane Fadhel, Dresden (DE)

(73) Assignee: Novaled GmbH, Dresden (DE)

( * ) Notice: Subject to any disclaimer, the term of this patent is extended or adjusted under 35 U.S.C. 154(b) by 475 days.

(21) Appl. No.: 15/564,782

(22) PCT Filed: Apr. 7, 2016

(86) PCT No.: PCT/EP2016/057656
§ 371 (c)(1),
(2) Date: Oct. 6, 2017

(87) PCT Pub. No.: WO2016/162440
PCT Pub. Date: Oct. 13, 2016

(65) Prior Publication Data
US 2018/0114914 A1    Apr. 26, 2018

(30) Foreign Application Priority Data
Apr. 8, 2015 (EP) ..................... 15162784

(51) Int. Cl.
*H01L 51/00*     (2006.01)
*C07F 9/53*      (2006.01)
(Continued)

(52) U.S. Cl.
CPC ........ *H01L 51/0052* (2013.01); *C07F 9/5325* (2013.01); *C07F 9/65517* (2013.01);
(Continued)

(58) Field of Classification Search
None
See application file for complete search history.

(56) References Cited

FOREIGN PATENT DOCUMENTS

EP      2790236 A1    10/2014
JP    2004-204140 A     7/2004
(Continued)

OTHER PUBLICATIONS

Machine English translation of Shin et al. (KR-10-2012-0138671). Translated Jan. 30, 2020.*
(Continued)

*Primary Examiner* — Jay Yang
(74) *Attorney, Agent, or Firm* — Eversheds Sutherland (US) LLP

(57) ABSTRACT

The present invention is directed to a semiconducting material comprising: i) a compound according to formula (I) wherein $R^1$, $R^2$ and $R^3$ are independently selected from $C_1$-$C_{30}$-alkyl, $C_3$-$C_{30}$ cycloalkyl, $C_2$-$C_{30}$-heteroalkyl, $C_6$-$C_{30}$-aryl, $C_2$-$C_{30}$-heteroaryl, $C_1$-$C_{30}$-alkoxy, $C_3$-$C_{30}$-cycloalkyloxy, $C_6$-$C_{30}$ aryloxy, and from structural unit having general formula E-A-, wherein—A is a $C_6$-$C_{30}$ phenylene spacer unit, and—E is an electron transporting unit that is selected from $C_{10}$-$C_{60}$ aryl and $C_6$-$C_{60}$ heteroaryl comprising up to 6 heteroatoms independently selected from O, S, P, Si and B and that comprises a conjugated system of at least 10 delocalized electrons, and—at least one group selected from $R^1$, $R^2$ and $R^3$ has the general formula E-A-; and ii) at least one complex of a monovalent metal having formula (II) wherein—$M^+$ is a positive metal ion bearing a
(Continued)

single elementary charge, and each of $A^1$, $A^2$, $A^3$ and $A^4$ is independently selected from H, substituted or unsubstituted $C_6$-$C_{20}$ aryl and substituted or unsubstituted $C_2$-$C_{20}$ heteroaryl, wherein a heteroaryl ring of at least 5 ring-forming atoms of the substituted or unsubstituted $C_2$-$C_{20}$ heteroaryl comprises at least one hetero atom selected from O, S and N.

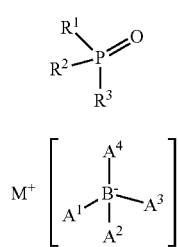

(I)

(II)

15 Claims, 1 Drawing Sheet

(51) Int. Cl.
  *C07F 9/655* (2006.01)
  *H01L 51/50* (2006.01)

(52) U.S. Cl.
  CPC ........ *H01L 51/008* (2013.01); *H01L 51/0054* (2013.01); *H01L 51/0058* (2013.01); *H01L 51/0073* (2013.01); *H01L 51/0077* (2013.01); *H01L 51/5072* (2013.01); *H01L 51/5076* (2013.01); *H01L 51/5092* (2013.01); *H01L 51/5096* (2013.01); *H01L 2251/552* (2013.01)

(56) References Cited

FOREIGN PATENT DOCUMENTS

| JP | 2006-073581 A | | 3/2006 |
|----|---|---|---|
| KR | 10-2012-0138671 | * | 12/2012 |
| WO | WO-2012/173370 A2 | * | 12/2012 |
| WO | WO-2013/079676 A1 | * | 6/2013 |

OTHER PUBLICATIONS

Mallesham et al. (J. Mater. Chem. C 2015, 3, p. 1208).*
PCT International Search Report and Written Opinion for PCT Application No. PCT/EP2016/057656 dated Aug. 2, 2016 (18 pages).

* cited by examiner

SEMICONDUCTING MATERIAL COMPRISING A PHOSPHINE OXIDE MATRIX AND METAL SALT

CROSS REFERENCE TO RELATED APPLICATIONS

This application is a U.S. national stage application of PCT/EP2016/057656, filed Apr. 7, 2016, which claims priority to European Application No. 15162784.1, filed Apr. 8, 2015. The contents of these applications are hereby incorporated by reference.

The present invention concerns organic semiconducting material with improved electrical properties, compound suitable for this organic semiconducting material and electronic device utilizing the improved electrical properties of the inventive semiconducting material.

I. BACKGROUND OF THE INVENTION

Among the electronic devices comprising at least a part based on material provided by organic chemistry, organic light emitting diodes (OLEDs) have a prominent position. Since the demonstration of efficient OLEDs by Tang et al. in 1987 (C. W. Tang et al., Appl. Phys. Lett. 51 (12), 913 (1987)), OLEDs developed from promising candidates to high-end commercial displays. An OLED comprises a sequence of thin layers substantially made of organic materials. The layers typically have a thickness in the range of 1 nm to 5 μm. The layers are usually formed either by means of vacuum deposition or from a solution, for example by means of spin coating or jet printing.

OLEDs emit light after the injection of charge carriers in the form of electrons from the cathode and in form of holes from the anode into organic layers arranged in between. The charge carrier injection is effected on the basis of an applied external voltage, the subsequent formation of excitons in a light emitting zone and the radiative recombination of those excitons. At least one of the electrodes is transparent or semitransparent, in the majority of cases in the form of a transparent oxide, such as indium tin oxide (ITO), or a thin metal layer.

II. SUMMARY OF THE INVENTION

It is an object of the invention to overcome the drawbacks of the prior art and to provide compounds which can be successfully embedded in electrically doped semiconducting materials for use in electronic devices. The inventive semiconducting materials shall afford devices with better characteristics, especially with low voltage and higher efficiency, more specifically, OLEDs with higher power efficiency.

According to one aspect, there is provided a semiconducting material comprising:
i) a compound according to formula (I):

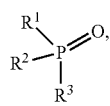

(I)

wherein
$R^1$, $R^2$ and $R^3$ are independently selected from $C_1$-$C_{30}$-alkyl, $C_3$-$C_{30}$ cycloalkyl, $C_2$-$C_{30}$ heteroalkyl, $C_6$-$C_{30}$-aryl, $C_2$-$C_{30}$-heteroaryl, $C_1$-$C_{30}$-alkoxy, $C_3$-$C_{30}$-cycloalkyloxy, $C_6$-$C_{30}$-aryloxy, and from structural unit having general formula E-A-, wherein
A is a $C_6$-$C_{30}$ phenylene spacer unit, and
E is an electron transporting unit that is selected from $C_{10}$-$C_{60}$ aryl and $C_6$-$C_{60}$ heteroaryl comprising up to 6 heteroatoms independently selected from O, S, P, Si and B and that comprises a conjugated system of at least 10 delocalized electrons, and
at least one group selected from $R^1$, $R^2$ and $R^3$ has the general formula E-A-; and ii) at least one complex of a monovalent metal having formula (II):

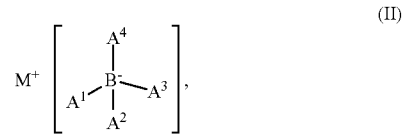

(II)

wherein
$M^+$ is a positive metal ion bearing a single elementary charge, and
each of $A^1$, $A^2$, $A^3$ and $A^4$ is independently selected from H, substituted or unsubstituted $C_6$-$C_{20}$ aryl and substituted or unsubstituted $C_2$-$C_{20}$ heteroaryl, wherein a heteroaryl ring of at least 5 ring-forming atoms of the substituted or unsubstituted $C_2$-$C_{20}$ heteroaryl comprises at least one hetero atom selected from O, S and N.

The wording "alkyl", "cycloalkyl", "aryl" refers to a substituent that is free of a hetero atom.

According to another aspect, there is provided a semiconducting material comprising:
i) a compound according to formula (I):

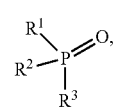

(I)

wherein
$R^1$, $R^2$ and $R^3$ are independently selected from $C_6$-$C_{30}$-aryl or $C_2$-$C_{30}$-heteroaryl; and from structural unit having general formula E-A-,
wherein
A is a $C_6$-$C_{30}$ phenylene spacer unit, and
E is an electron transporting unit that is selected from $C_{10}$-$C_{60}$ aryl;
wherein
in compound (I), at least one of substituents $R^1$, $R^2$ and/or $R^3$ is phenyl,
at least one group selected from $R^1$, $R^2$ and $R^3$ has the general formula E-A-; and ii) at least one complex of a monovalent metal having formula (II):

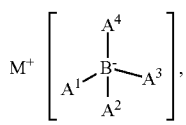

wherein
M⁺ is a lithium cation (Li⁺), and
each of $A^1$, $A^2$, $A^3$ and $A^4$ is a heteroaryl ring of at least 5 ring-forming atoms comprises at least one hetero atom N.

According to another aspect, there is provided a semiconducting material comprising:
i) a compound according to formula (I):

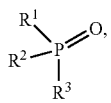

wherein
$R^1$, $R^2$ and $R^3$ are independently selected from $C_6$-$C_{30}$-aryl or $C_2$-$C_{30}$-heteroaryl; and from structural unit having general formula E-A-,
wherein
A is a $C_6$-$C_{30}$ phenylene spacer unit, and
E is an electron transporting unit that is selected from $C_{10}$-$C_{60}$ aryl;
wherein
in compound (I), at least one of substituents $R^1$, $R^2$ and/or $R^3$ is phenyl,
at least one group selected from $R^1$, $R^2$ and $R^3$ has the general formula E-A-; and
ii) at least one complex of a monovalent metal having formula (II):

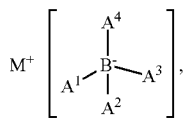

wherein
M⁺ is a lithium cation (Li⁺), and
each of $A^1$, $A^2$, $A^3$ and $A^4$ is a heteroaryl ring of at least 5 ring-forming atoms comprises at least one hetero atom N.

Semiconducting material according to claim 1, comprising:
i) a compound according to formula (I):

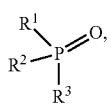

wherein
$R^1$, $R^2$ and $R^3$ are independently selected from $C_6$-$C_{30}$-aryl or $C_2$-$C_{30}$-heteroaryl, wherein the $C_2$-$C_{30}$-heteroaryl is free of N; and from structural unit having general formula E-A-,
wherein
A is a $C_6$-$C_{30}$ phenylene spacer unit, and
E is an electron transporting unit that is selected from $C_{10}$-$C_{60}$ aryl;
wherein
in compound (I), at least one of substituents $R^1$, $R^2$ and/or $R^3$ is phenyl,
at least one group selected from $R^1$, $R^2$ and $R^3$ has the general formula E-A-; and
ii) at least one complex of a monovalent metal having formula (II):

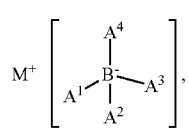

wherein
M⁺ is a lithium cation (Li⁺), and
each of $A^1$, $A^2$, $A^3$ and $A^4$ is a heteroaryl ring of at least 5 ring-forming atoms comprises at least one hetero atom N.

According to another aspect, there is provided a semiconducting material comprising:
i) a compound according to formula (I):

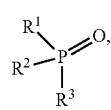

wherein
$R^1$, $R^2$ and $R^3$ are independently selected from $C_6$-$C_{30}$-aryl; and from structural unit having general formula E-A-,
wherein
A is a $C_6$-$C_{30}$ phenylene spacer unit, and
E is an electron transporting unit that is selected from $C_{10}$-$C_{60}$ aryl;
wherein
in compound (I), at least one of substituents $R^1$, $R^2$ and/or $R^3$ is phenyl,
at least one group selected from $R^1$, $R^2$ and $R^3$ has the general formula E-A-; and
ii) at least one complex of a monovalent metal having formula (II):

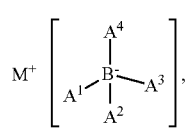

wherein
M⁺ is a lithium cation (Li⁺), and
each of $A^1$, $A^2$, $A^3$ and $A^4$ is a heteroaryl ring of at least 5 ring-forming atoms comprises at least one hetero atom N.

According to another aspect, there is provided a semiconducting material comprising:

i) a compound according to formula (I):

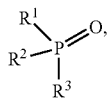
(I)

wherein
$R^1$, $R^2$ and $R^3$ are independently selected from $C_6$-$C_{30}$-aryl or $C_2$-$C_{30}$-heteroaryl; and from structural unit having general formula E-A-,
wherein
    A is a $C_6$-$C_{30}$ phenylene spacer unit, and
    E is an electron transporting unit that is selected from $C_{10}$-$C_{60}$ aryl;
wherein
    in compound (I), at least one of substituents $R^1$, $R^2$ and/or $R^3$ is phenyl,
    at least one group selected from $R^1$, $R^2$ and $R^3$ has the general formula E-A-; and
ii) at least one complex of a monovalent metal having formula (II):

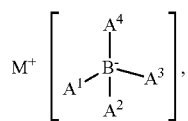
(II)

wherein
    $M^+$ is a lithium cation ($Li^+$), and
    each of $A^1$, $A^2$, $A^3$ and $A^4$ is a heteroaryl ring of at least 5 ring-forming atoms comprises at least one hetero atom N.

According to another aspect, there is provided a semiconducting material comprising:
i) a compound according to formula (I):

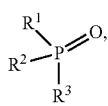
(I)

wherein
$R^1$, $R^2$ and $R^3$ are independently selected from $C_6$-$C_{30}$-aryl or $C_2$-$C_{30}$-heteroaryl; and from structural unit having general formula E-A-,
wherein
    A is a $C_6$-$C_{30}$ phenylene spacer unit, and
    E is an electron transporting unit that is selected from $C_{10}$-$C_{60}$ aryl;
wherein
    in compound (I), at least one of substituents $R^1$, $R^2$ and/or $R^3$ is phenyl,
    at least one group selected from $R^1$, $R^2$ and $R^3$ has the general formula E-A-; and
ii) at least one complex of a monovalent metal having formula (II):

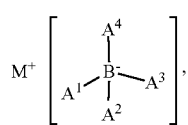
(II)

wherein
    $M^+$ is a lithium cation ($Li^+$), and
    each of $A^1$, $A^2$, $A^3$ and $A^4$ is a heteroaryl ring of at least 5 ring-forming atoms comprises at least one hetero atom N.

According to another aspect, there is provided a semiconducting material comprising:
i) a compound according to formula (I):

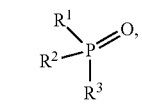
(I)

wherein
$R^1$, $R^2$ and $R^3$ are independently selected from $C_6$-$C_{30}$-aryl or $C_2$-$C_{30}$-heteroaryl; and from structural unit having general formula E-A-,
wherein
    A is a spacer unit selected from the group comprising a phenylene spacer unit, m-phenylene spacer unit, p-phenylene spacer unit, biphenyl spacer unit, m-biphenyl spacer unit, p-biphenyl spacer unit, terphenyl spacer unit, m-terphenyl spacer unit or p-terphenyl spacer unit, and
    E is an electron transporting unit that is selected from $C_{10}$-$C_{60}$ aryl;
wherein
    in compound (I), at least one of substituents $R^1$, $R^2$ and/or $R^3$ is phenyl,
    at least one group selected from $R^1$, $R^2$ and $R^3$ has the general formula E-A-; and
ii) at least one complex of a monovalent metal having formula (II):

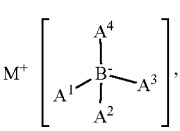
(II)

wherein
    $M^+$ is a lithium cation ($Li^+$), and
    each of $A^1$, $A^2$, $A^3$ and $A^4$ is a heteroaryl ring of at least 5 ring-forming atoms comprises at least one hetero atom N.

According to another aspect A can be preferably a spacer unit selected from the group comprising a m-phenylene spacer unit, p-phenylene spacer unit, m-biphenyl spacer unit, p-biphenyl spacer unit, m-terphenyl spacer unit or p-terphenyl spacer unit.

The phenylene spacer unit A has the formula IIIa:

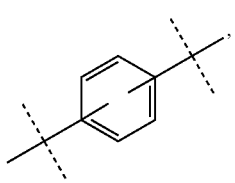
(IIIa)

The p-phenylene spacer unit A has the formula IIIb:

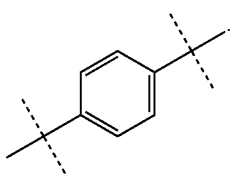
(IIIb)

The m-phenylene spacer unit A has the formula (IIIc):

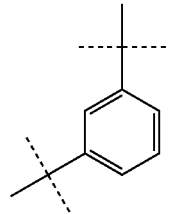
(IIIc)

The biphenyl spacer unit spacer unit A has the formula IVa:

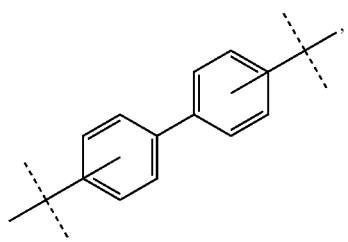
(IVa)

The p-biphenyl spacer unit A has the formula IVb:

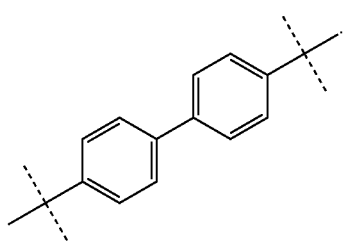
(IVb)

The m-biphenyl spacer unit A has the formula IVc:

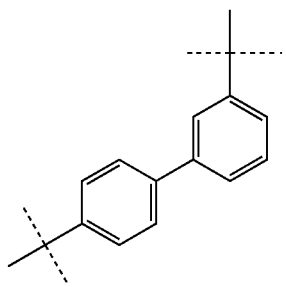
(IVc)

The terphenyl spacer unit spacer unit A has the formula Va:

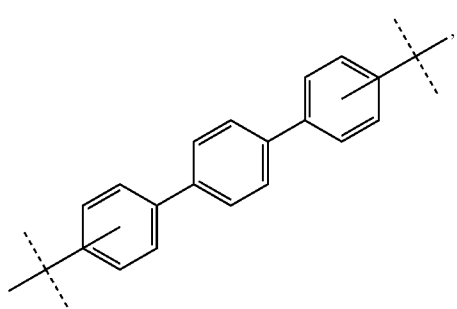
(Va)

The p-terphenyl spacer unit A has the formula Vb:

(Vb)

The m-terphenyl spacer unit A has the formula Vc:

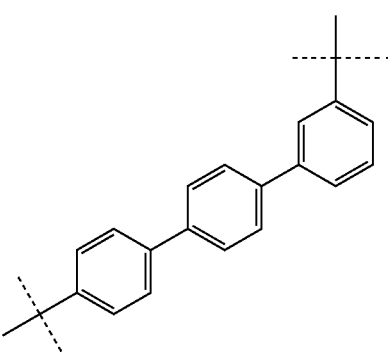
(Vc)

According to another aspect the general formula E-A- is represented by any of the following formulas VIa to VIj:

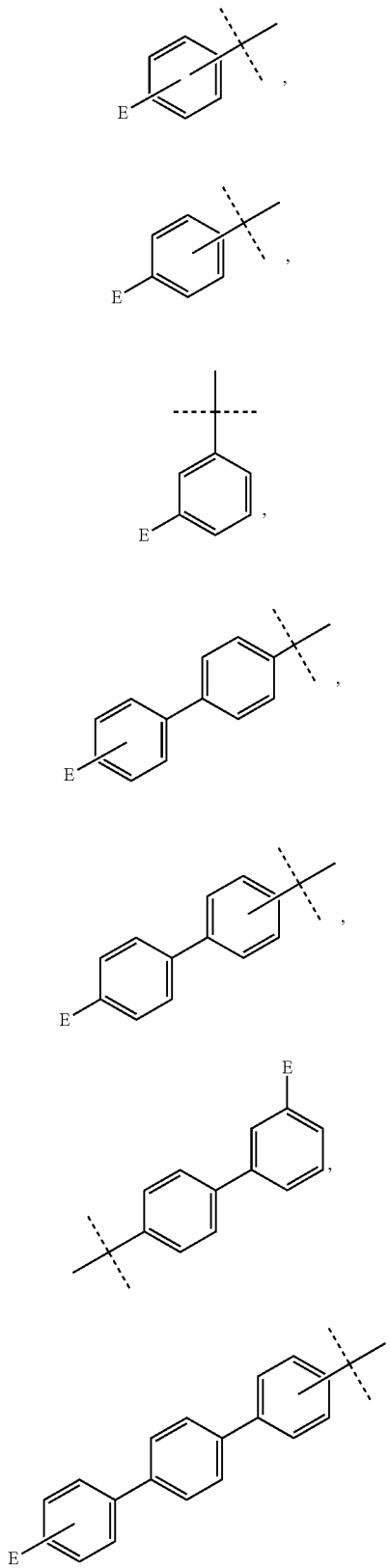

(VIa)
(VIb0)
(VIc)
(VId)
(VIe)
(IVf)
(VIg)

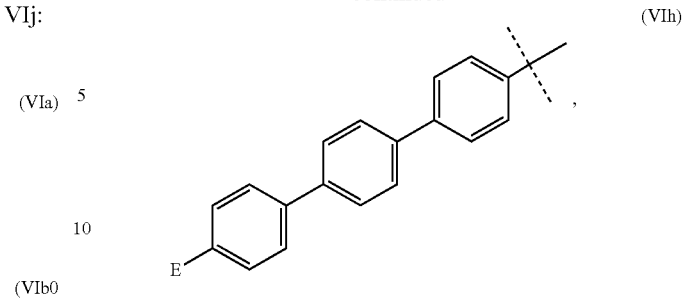

(VIh)

wherein
E is an electron transporting unit that is selected from $C_{10}$-$C_{60}$ aryl and $C_6$-$C_{60}$ heteroaryl comprising up to 6 heteroatoms independently selected from O, S, P, Si and B and that comprises a conjugated system of at least 10 delocalized electrons; and preferably E can be an electron transporting unit that is selected from $C_{10}$-$C_{60}$ aryl.

According to another aspect the general formula E-A- is represented by any of the following formulas VIa to Vij; wherein E is an electron transporting unit that is selected from $C_{10}$-$C_{60}$ aryl.

According to another aspect, there is provided a semiconducting material comprising:

i) a compound according to formula (I):

(I)

wherein
$R^1$, $R^2$ and $R^3$ are independently selected from $C_6$-$C_{30}$-aryl or $C_2$-$C_{30}$-heteroaryl; and from structural unit having general formula E-A-,
wherein
A is spacer unit selected from a group comprising phenylene, biphenyl, naphthalen-1,8-diyl, naphthalen-2,6-diyl, 9,9'-dialkylfluoren-2,7-diyl, 9,9'-diarylfluoren-2,7-diyl, 9-alkyl-9'-arylfluoren-2,7-diyl, 9,9'-dialkylfluoren-3,6-diyl, 9,9'-diarylfluoren-3,6-diyl and 9-alkyl-9'-arylfluoren-3,6-diyl, wherein alkyl is C1-C12 alkyl and aryl is C6-C20 aryl, and E is an electron transporting unit that is selected from $C_{10}$-$C_{60}$ aryl;
wherein
in compound (I), at least one of substituents $R^1$, $R^2$ and/or $R^3$ is phenyl,
at least one group selected from $R^1$, $R^2$ and $R^3$ has the general formula E-A-; and ii) at least one complex of a monovalent metal having formula (II):

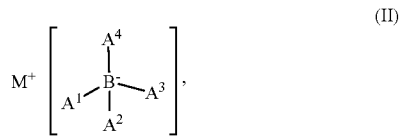

(II)

wherein
M⁺ is a lithium cation (Li⁺), and
each of $A^1$, $A^2$, $A^3$ and $A^4$ is a heteroaryl ring of at least 5 ring-forming atoms comprises at least one hetero atom N.

The metal borate complex (II) works in the inventive semiconducting material as an electrical dopant, whereas the compound of formula (I) has the function of a charge transporting matrix.

Preferably, the semiconducting material comprising compounds of formula (I) and (II) serves as an electron transporting material or as an electron injecting material.

Preferably, compound of formula (I) is used as matrix compound in the electron transport layer or electron injection layer. Compound (I) comprises a phenylene spacer unit A which separates the electron transport group E from the phosphine oxide group.

According to another aspect, there is provided a semiconducting material, wherein in the compound (I) A is a $C_6$-$C_{30}$ m-phenylene or p-phenylene spacer unit. The phenylene spacer unit A is preferably selected from unsubstituted ortho-, meta- and para-phenylene, however, phenylenes substituted with alkyl, aryl, alkoxy or aryloxy groups with overall C-atom count of the phenylene spacer unit up to $C_{30}$. Also branched structural units, e.g. 1,3,5-benzene-triyl, which may bear more than one electron transport unit E, do fall in the scope of definition of the phenylene spacer unit as understood in this application. The substituents on the unbranched or branched phenylene structural units may be connected to form a ring, however, the formation of aromatic or heteroaromatic rings by connection of substituents is excluded. For sterical reasons, m- and p-phenylene spacers are preferred. Particularly preferred as spacer unit A are $C_6$ m- and p-phenylene.

According to one aspect, A is selected from the group comprising a phenylene spacer unit, m-phenylene spacer unit, p-phenylene spacer unit, biphenyl spacer unit, m-biphenyl spacer unit, p-biphenyl spacer unit, terphenyl spacer unit, m-terphenyl spacer unit or p-terphenyl spacer unit.

According to one aspect, there is provided a semiconducting material, wherein in the compound (I), the electron transporting unit E is a $C_{14}$-$C_{50}$ aryl or a $C_8$-$C_{50}$ heteroaryl.

According to one aspect, there is provided a semiconducting material, wherein in the compound (I), the electron transporting unit E is a $C_{15}$-$C_{44}$ aryl.

If not explicitly stated that a group or structural unit is unsubstituted, the given count of atoms (e.g., given count of carbon atoms) comprises also possible substituents.

Examples of an appropriate electron transporting unit are aryls and heteroaryls (arene or heteroarene radicals comprising at least two condensed aromatic rings). The term radical means an organic residue derived from an organic molecule by a formal hydrogen abstraction.

According to one aspect, there is provided a semiconducting material, wherein in the compound (I), at least one electron transporting unit E is a $C_{16}$-$C_{44}$ pyrenyl or a $C_{14}$-$C_{38}$ anthryl.

Preferably, the electron transporting unit E comprises an aromatic or heteroaromatic skeleton having 2 to 5 condensed aromatic rings. More specifically, examples of the preferable electron transporting units are naphthyl, anthracenyl, phenanthrenyl and pyrenyl. 1,1'-biphenylyl and 9,9'-dialkyl-, 9,9'-diaryl- and 9-alkly-9'-aryl-fluorenyl are also preferable, although its aryl rings are not condensed. Electron transporting unit E comprising phenyl and naphthyl are also preferred if attached to a branching group, for example in formula (Ie). Both the spacer A as well as the electron transporting unit E may be unsubstituted or appropriately substituted by electron withdrawing or electron donating groups which allow further tuning of the frontier orbital energy levels of the molecule. Typical examples of electron withdrawing groups are phenyl, halogen, carbonyl, nitrile, haloalkyl or haloaryl groups and six-membered nitrogen-containing heterocyclic radicals like pyridyl, diazinyl or triazinyl. Halogen means fluorine, chlorine, bromine or iodine; specific examples of haloalkyl and haloaryl groups are perhaloalkyl and perhaloaryl groups, like trichloromethyl, trifluoromethyl, pentafluoroethyl, heptafluoroisopropyl, perfluoro-tert-butyl or pentafluorophenyl. Examples of electron donating groups are alkyl groups like methyl, ethyl, propyl, isopropyl, heteroalkyl groups wherein one or more non-adjacent methylene units in the alkyl chain are replaced by a heteroatom, alkoxy groups, alkylthio groups, and five-membered heterocycles comprising up to three heteroatoms selected from N, O and S. Typical examples of heteroatoms comprised in heteroalkyls are O, S and Si, represented by ether, sulphide or dialkylsilylene groups. Cycloalkyl has the meaning of a hydrocarbyl substituent which comprises at least one carbocyclic structure which is not aromatic. It is understood that the terms alkyl and cycloalkyl comprise also unsaturated and branched hydrocarbyl groups.

E is an electron transporting unit that is selected from $C_{10}$-$C_{60}$ aryl and $C_6$-$C_{60}$ heteroaryl comprising up to 6 heteroatoms that comprises a conjugated system of at least 10 delocalized electrons.

Examples of conjugated systems of delocalized electrons are systems of alternating pi- and sigma bonds, wherein, optionally, one or more two-atom structural units having the pi-bond between its atoms can be replaced by an atom bearing at least one lone electron pair, typically by a divalent O or S atom. Alternatively or in an addition, the system of alternating pi- and sigma bonds may embed one or more isolated boron atoms having only six valence electrons and one vacant orbital. Preferably, the conjugated system of delocalized electrons comprises at least one aromatic ring adhering to the Hückel rule. More preferably, the conjugated system of delocalized electrons comprises a condensed aromatic skeleton comprising at least 10 delocalized electrons, e.g. a naphthalene, anthracene, phenanthrene, pyrene, benzofurane or benzothiophene skeleton. Also preferably, the conjugated system of delocalized electrons may consist of at least two directly attached aromatic rings, the simplest examples of such systems being biphenyl, bithienyl, phenylthiophene, furylthiophene and like.

It is preferable that the lowest unoccupied molecular orbital (LUMO) of the compound (I) is localized mainly on its electron transporting units E. The presence of at least 10 delocalized electrons in the conjugated system makes the lowest unoccupied molecular orbital of the whole compound of formula (I) localized mainly on the electron transporting unit E.

More specifically, the localization of a frontier orbital like LUMO in the molecule can be assigned by a skilled person to that part of the molecule which contains the largest conjugated pi-electron system. In case that two or more pi-electron systems with the same extent (given by the number of pi electrons in conjugation) occur in the molecule, the lowest energy can be assigned to the system linked with strongest electron withdrawing groups and/or weakest electron donating groups. The electron withdrawing and/or electron accepting effects of various substituents are commensurate to experimentally accessible parameters like Hammet or Taft constants which are tabulated for large number of substituents most frequently occurring in aromatic or heteroaromatic organic compounds. In most cases, the above mentioned parameters are sufficient for a reliable LUMO localization, because the overall effect of more substituents attached to the same aromatic system is additive. In case of uncertainty, the ultimate method for the correct LUMO localization in the molecule is quantum chemical calculation. Reliable results with relatively low demand for computational capacity provide for example the methods based on density functional theory (DFT).

It is desirable that the LUMO level of compound (I), measured as a redox potential by cyclic voltammetry (CV) in tetrahydrofuran (THF) against ferrocenium/ferrocene redox couple as a reference, is in the range −1.8 to −3.1 V. It is preferred that the energy of this LUMO is in the range −2.0 to −2.9 V, more preferably in the range −2.15 to −2.75 V, even more preferably in the range −2.25 to −2.6 V. Modern quantum chemical methods allow also a reliable estimation of relative LUMO energies for different molecules. The computed relative values can be recalculated to absolute scale corresponding to the electrochemical potentials measured in a concrete CV experimental setting, if the calculated value is compared with the value measured for the same compound and the obtained difference is taken into account as a correction for the values calculated for other compounds.

According to one aspect, there is provided a semiconducting material, wherein in the compound (I), in any general formula E-A-
  i) A is a $C_6$-$C_{30}$ m-phenylene or a p-phenylene spacer unit and E is a $C_{16}$-$C_{44}$ pyrenyl; or
  ii) A is a $C_6$-$C_{30}$ m-phenylene spacer unit and E is a $C_{14}$-$C_{34}$ anthryl.

According to one aspect, there is provided a semiconducting material, wherein in compound (I), at least one of substituents $R^1$, $R^2$ and/or $R^3$ is a phenyl.

According to one aspect, there is provided a semiconducting material, wherein in compound (II), the positive metal ion M+ bearing a single elementary charge is a lithium cation (Li+).

According to one aspect, there is provided a semiconducting material, wherein in the compound (II), at least three of $A^1$, $A^2$, $A^3$ and $A^4$ are independently selected from substituted or unsubstituted $C_2$-$C_{20}$ heteroaryl, wherein the heteroaryl ring of at least 5 ring-forming atoms of the substituted or unsubstituted $C_2$-$C_{20}$ heteroaryl comprises at least one hetero atom selected from O, S and/or N.

According to one aspect, there is provided a semiconducting material, wherein in the compound (II), each substituted or unsubstituted $C_2$-$C_{20}$ heteroaryl, wherein the heteroaryl ring of at least 5 ring-forming atoms of the substituted or unsubstituted $C_2$-$C_{20}$ heteroaryl comprises at least one hetero atom selected from O, S and/or N.

According to one aspect, there is provided a semiconducting material, wherein in the compound (II), each nitrogen containing heteroaryl is attached to the central boron atom through a boron-nitrogen bond.

It is further preferred that in the compound (II), each substituted or unsubstituted $C_2$-$C_{20}$ heteroaryl comprising at least one atom selected from O, S and N in an aromatic ring having at least five ring atoms is independently selected from nitrogen containing heteroaryls. More preferably, each nitrogen containing heteroaryl is attached to the central boron atom through a boron-nitrogen bond. Preferable heteroaryls are heteroaryls with five ring-forming atoms, and in the nitrogen containing heteroaryl, preferred number of nitrogen atoms in the ring is 2 or 3. Most preferred nitrogen containing heteroaryl is pyrazolyl.

According to one aspect, there is provided a semiconducting material wherein
  A is a $C_6$-$C_{30}$ phenylene spacer unit, and
  E is an electron transport unit having the structure (Ib), (Ic), (Id) and/or (Ie):

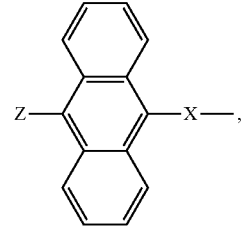

(Ib)

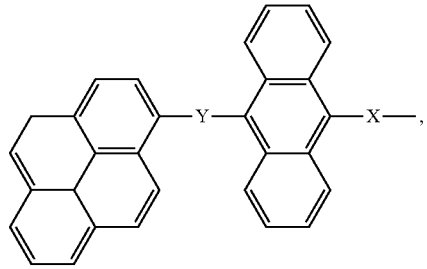

(Ic)

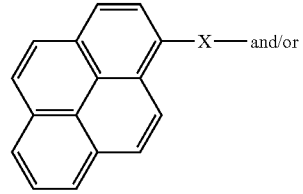

(Id)

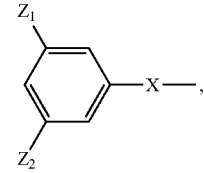

(Ie)

wherein in structure (Ib)
  X is a single bond and
  Z is selected from a group comprising dibenzo[b,d]furanyl, dibenzo[b,d]thiophenyl, 9-anthranyl, pyren-1-yl, pyren-2-yl, 9,9'-dialkylfluoren-2-yl, 9,9'-diarylfluoren-2-yl, 9-alkyl-9'-arylfluoren-2-yl, 9,9'-dialkylfluoren-3-yl, 9,9'-diarylfluoren-3-yl, 9-alkyl-9'-arylfluoren-3-yl, phenanthren-1-yl and phenanthren-3-yl; or
wherein in structure (Ib)
  X is selected from a group comprising, phenylene, biphenyl, naphthalen-1,8-diyl, naphthalen-2,6-diyl, 9,9'-dialkylfluoren-2,7-diyl, 9,9'-diarylfluoren-2,7-diyl, 9-alkyl-9'-arylfluoren-2,7-diyl, 9,9'-dialkylfluoren-3,6-diyl, 9,9'-diarylfluoren-3,6-diyl and 9-alkyl-9'-arylfluoren-3,6-diyl; and
  Z is selected from a group comprising hydrogen, naphtyl, biphenylyl, dibenzo[b,d]furanyl, dibenzo[b,d]thiophenyl, 9-anthranyl, pyren-1-yl, pyren-2-yl, 9,9'-dialkylfluoren-2-yl, 9,9'-diarylfluoren-2-yl, 9-alkyl-9'-arylfluoren-2-yl, 9,9'-dialkylfluoren-3-yl, 9,9'-diarylfluoren-3-yl, 9-alkyl-9'-arylfluoren-3-yl, phenanthren-1-yl and phenanthren-3-yl;

wherein in structure (Ic)

X is selected from a single bond, phenylene and biphenyl and

Y is phenylene;

wherein in structure (Id)

X is selected from a group comprising a single bond, phenylene, biphenyl, naphthalen-1,8-diyl, naphthalen-2,6-diyl, 9,9'-dialkylfluoren-2,7-diyl, 9,9'-diarylfluoren-2,7-diyl, 9-alkyl-9'-arylfluoren-2,7-diyl, 9,9'-dialkylfluoren-3,6-diyl, 9,9'-diarylfluoren-3,6-diyl and 9-alkyl-9'-arylfluoren-3,6-diyl;

wherein in structure (Ie)

X is a single bond; and $Z_1$ and $Z_2$ are independently selected from a group comprising phenyl, naphthyl, dibenzo[b,d]furanyl, dibenzo[b,d]thiophenyl, 9-anthranyl, pyren-1-yl, pyren-2-yl, 9,9'-dialkylfluoren-2-yl, 9,9'-diarylfluoren-2-yl, 9-alkyl-9'-arylfluoren-2-yl, 9,9'-dialkylfluoren-3-yl, 9,9'-diarylfluoren-3-yl, 9-alkyl-9'-arylfluoren-3-yl, phenanthrene-1-yl and phenanthrene-3-yl.

According to one aspect, there is provided a semiconducting material wherein

A is a $C_6$-$C_{30}$ phenylene spacer unit, and

E is an electron transport unit having the structure (Ib), (Ic), (Id) and/or (Ie):

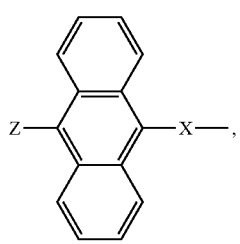

(Ib)

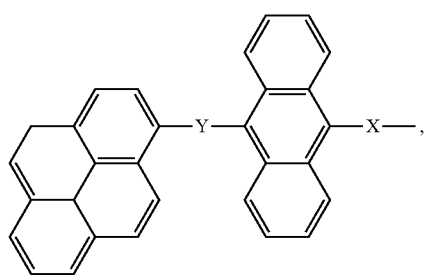

(Ic)

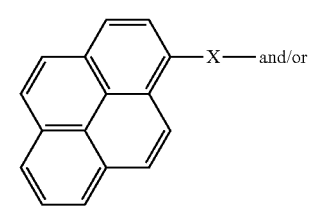

(Id)

and/or

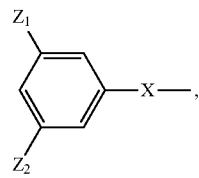

(Ie)

wherein in structure (Ib)

X is selected from a group comprising a single bond, phenylene, biphenyl, naphthalen-1,8-diyl, naphthalen-2,6-diyl, 9,9'-dialkylfluoren-2,7-diyl, 9,9'-diarylfluoren-2,7-diyl, 9-alkyl-9'-arylfluoren-2,7-diyl, 9,9'-dialkylfluoren-3,6-diyl, 9,9'-diarylfluoren-3,6-diyl and 9-alkyl-9'-arylfluoren-3,6-diyl; and Z is selected from a group comprising dibenzo[b,d]furanyl, dibenzo[b,d]thiophenyl, 9-anthranyl, pyren-1-yl, pyren-2-yl, 9,9'-dialkylfluoren-2-yl, 9,9'-diarylfluoren-2-yl, 9-alkyl-9'-arylfluoren-2-yl, 9,9'-dialkylfluoren-3-yl, 9,9'-diarylfluoren-3-yl, 9-alkyl-9'-arylfluoren-3-yl, phenanthren-1-yl and phenanthren-3-yl;

wherein in structure (Ic)

X is selected from a single bond, phenylene and biphenyl, naphthalen-1,8-diyl, naphthalen-2,6-diyl, 9,9'-dialkylfluoren-2,7-diyl, 9,9'-diarylfluoren-2,7-diyl, 9-alkyl-9'-arylfluoren-2,7-diyl, 9,9'-dialkylfluoren-3,6-diyl, 9,9'-diarylfluoren-3,6-diyl and 9-alkyl-9'-arylfluoren-3,6-diyl; and Y is phenylene;

wherein in structure (Id)

X is selected from a group comprising a single bond, phenylene, biphenyl, naphthalen-1,8-diyl, naphthalen-2,6-diyl, 9,9'-dialkylfluoren-2,7-diyl, 9,9'-diarylfluoren-2,7-diyl, 9-alkyl-9'-arylfluoren-2,7-diyl, 9,9'-dialkylfluoren-3,6-diyl, 9,9'-diarylfluoren-3,6-diyl and 9-alkyl-9'-arylfluoren-3,6-diyl;

wherein in structure (Ie)

X is a single bond, phenylene and biphenyl, naphthalen-1,8-diyl, naphthalen-2,6-diyl, 9,9'-dialkylfluoren-2,7-diyl, 9,9'-diarylfluoren-2,7-diyl, 9-alkyl-9'-arylfluoren-2,7-diyl, 9,9'-dialkylfluoren-3,6-diyl, 9,9'-diarylfluoren-3,6-diyl and 9-alkyl-9'-arylfluoren-3,6-diyl; and $Z_1$ and $Z_2$ are independently selected from a group comprising phenyl, naphthyl, dibenzo[b,d]furanyl, dibenzo[b,d]thiophenyl, 9-anthranyl, pyren-1-yl, pyren-2-yl, 9,9'-dialkylfluoren-2-yl, 9,9'-diarylfluoren-2-yl, 9-alkyl-9'-arylfluoren-2-yl, 9,9'-dialkylfluoren-3-yl, 9,9'-diarylfluoren-3-yl, 9-alkyl-9'-arylfluoren-3-yl, phenanthrene-1-yl and phenanthrene-3-yl.

According to one aspect, there is provided a semiconducting material wherein the compound of formula (I) is represented by any of the following formulas:

A1 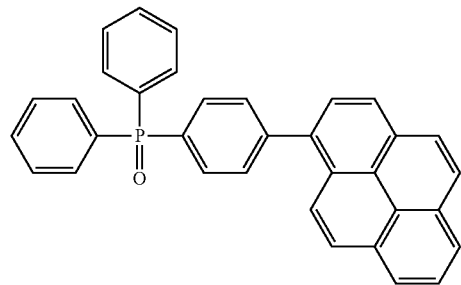
A2 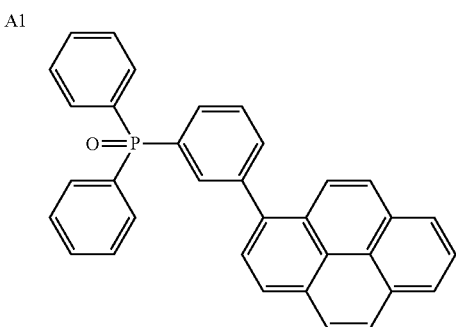
A3 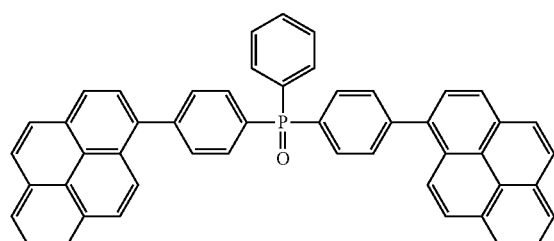
A4 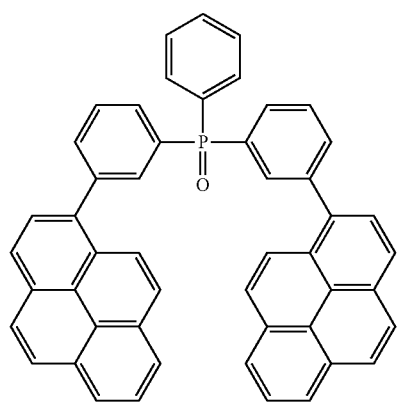
A5 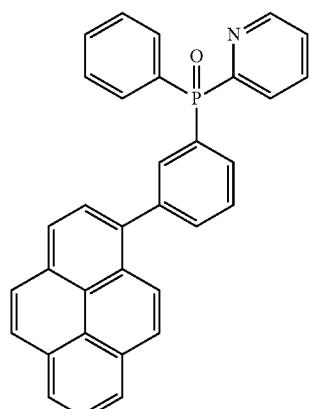
A6 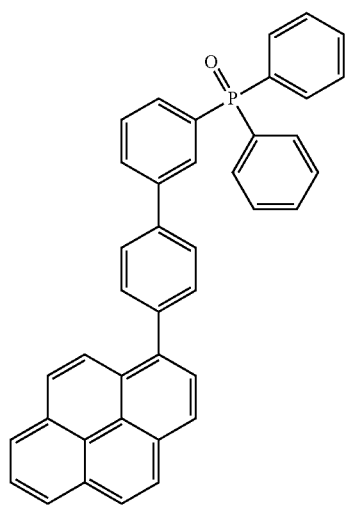
A7 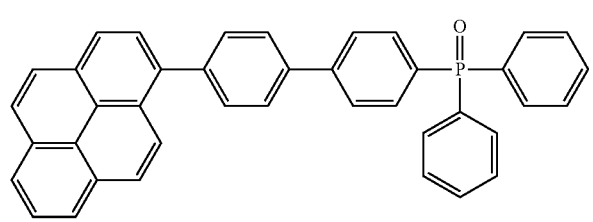
A8 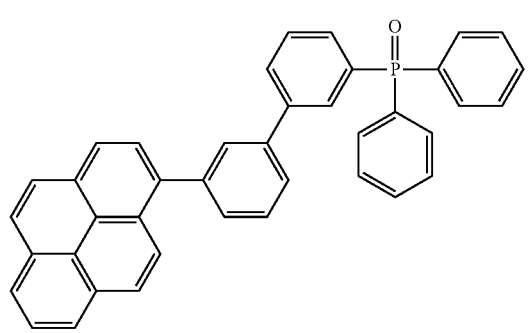

-continued
A9
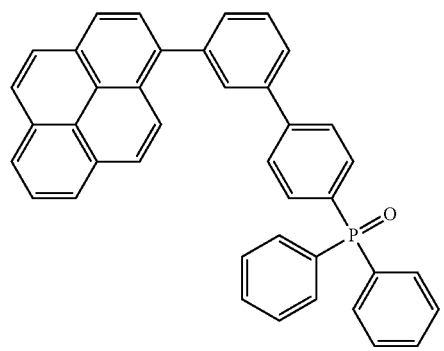
A10
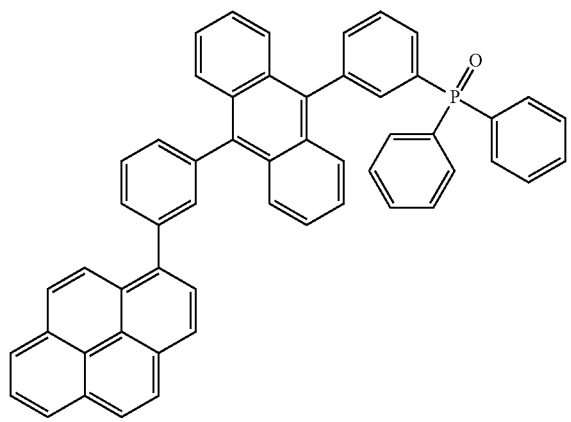
A11
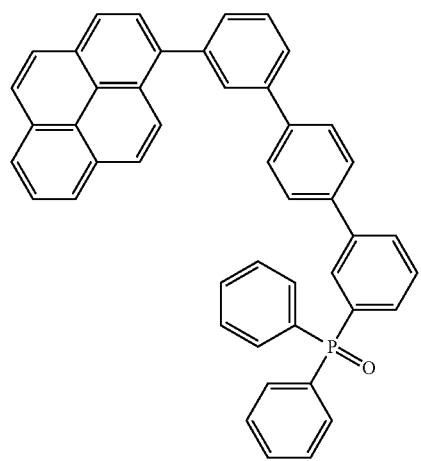
A12
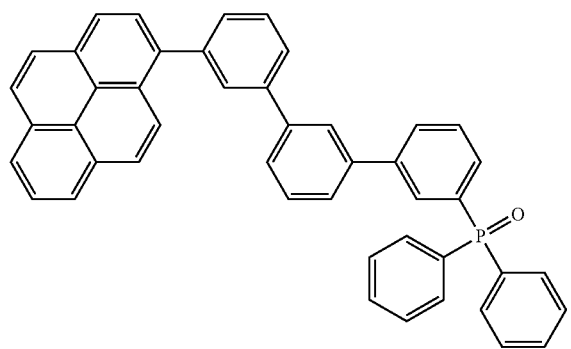
A13
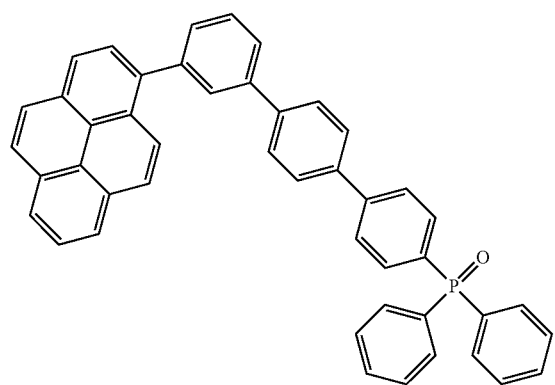
A14
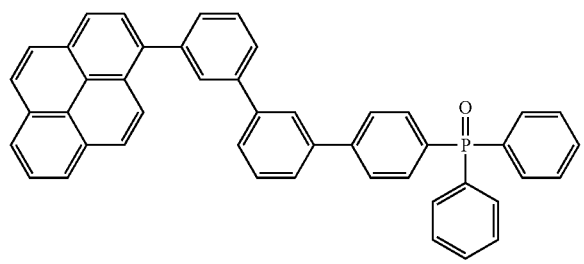

-continued
A15
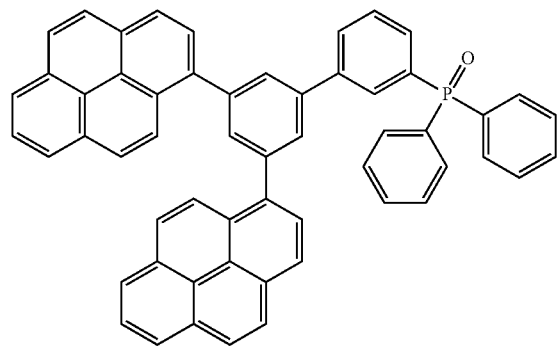
A16
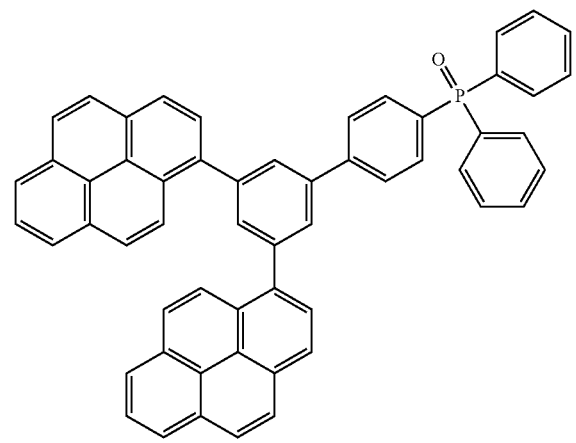
B1
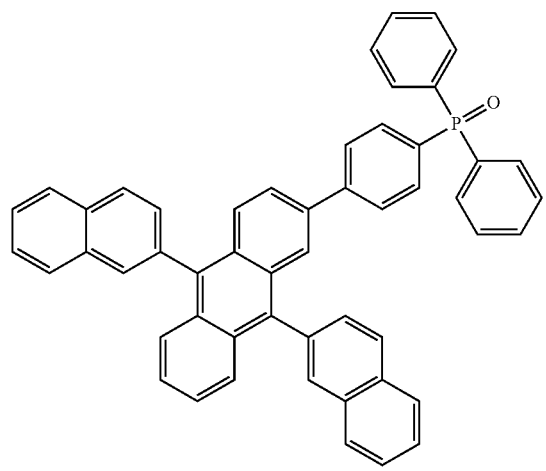
B2
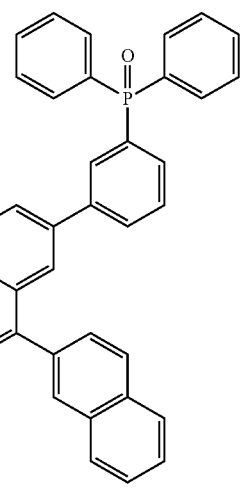
B3
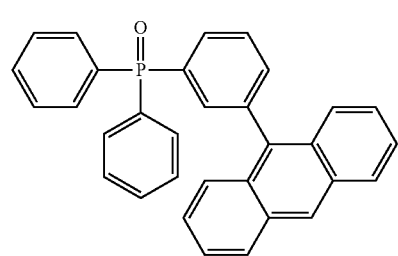
B4
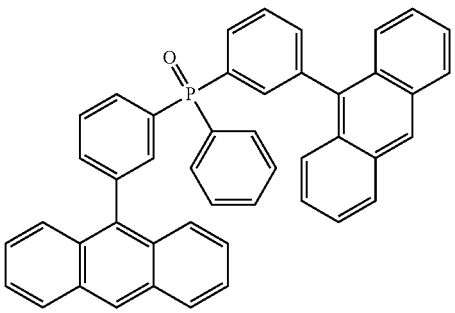
B5
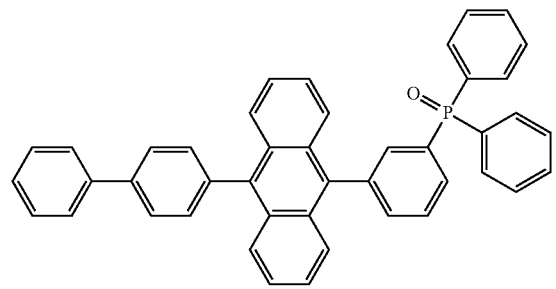
B6
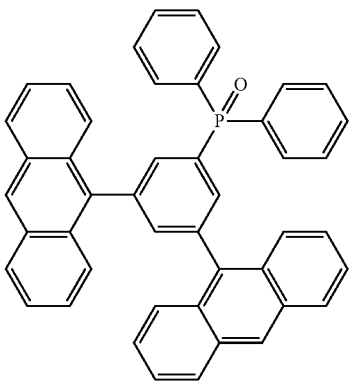

-continued
B7
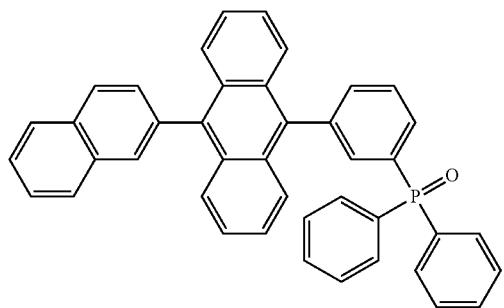
B8
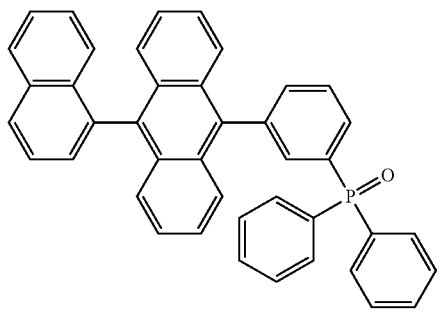
B9
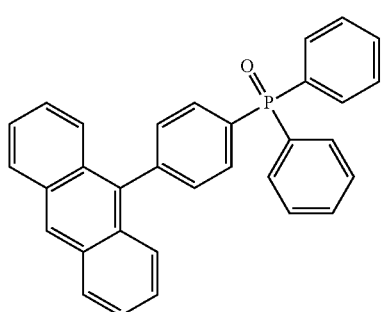
B10
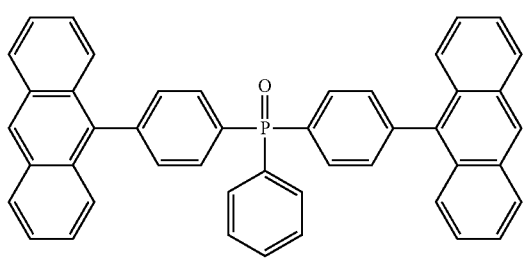
B12
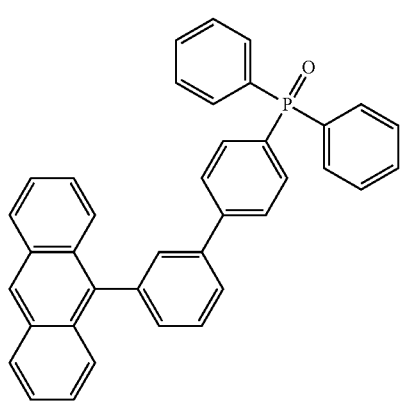
B16
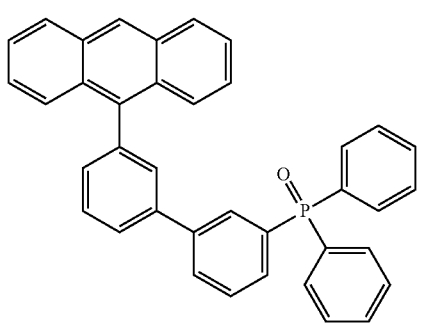
B17
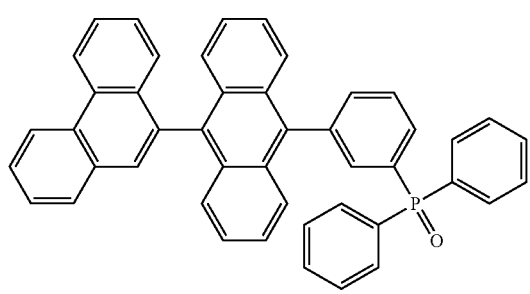
B18
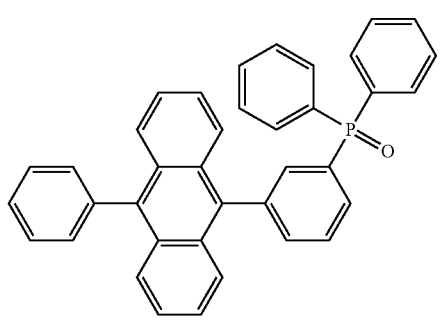
B7
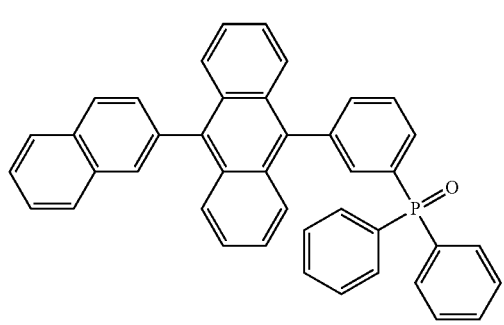
B8
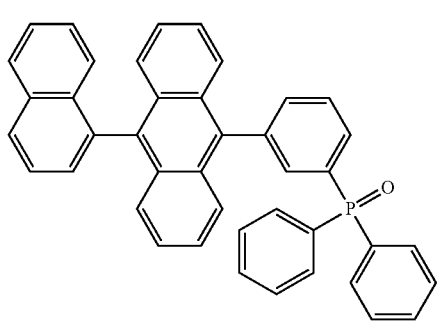

-continued
B19
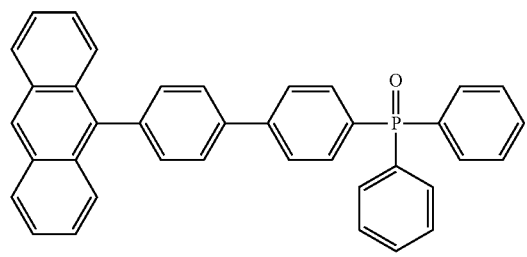
B20
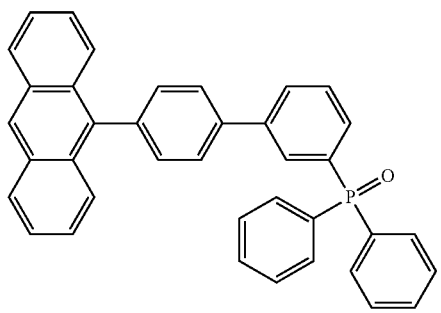
B21
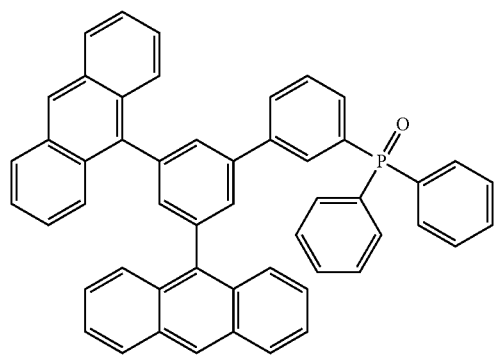
B22
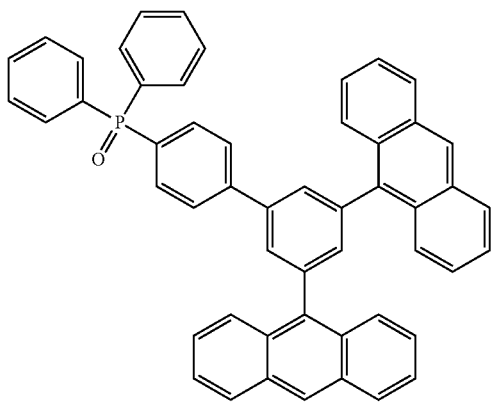
B23
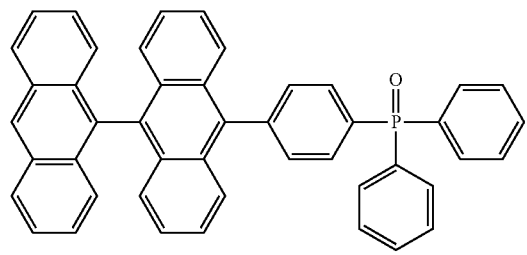
B24
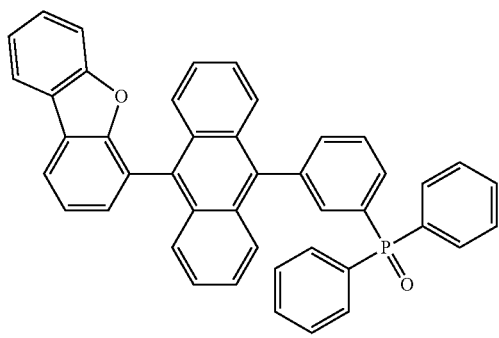
B25
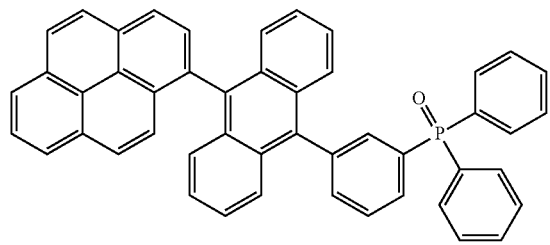
B26
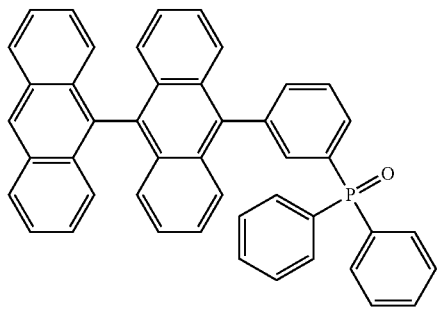

-continued
B27
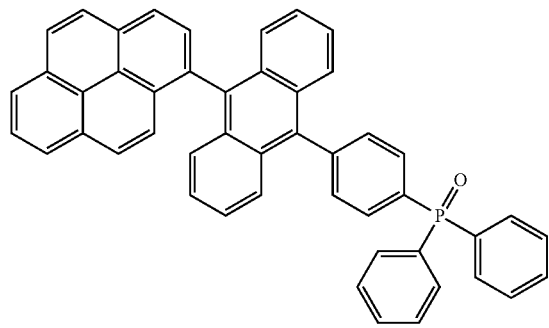
B28
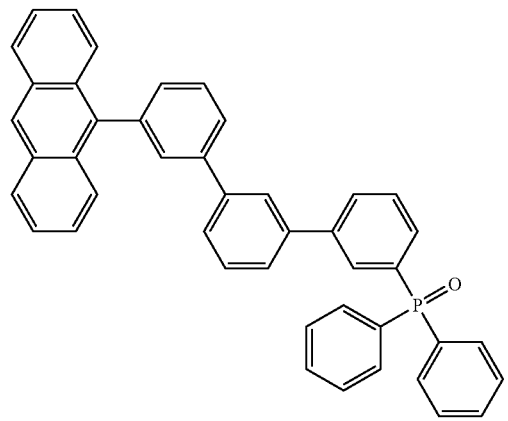
B29
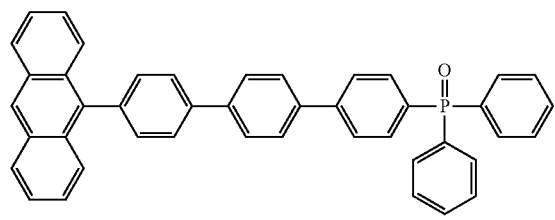
B30
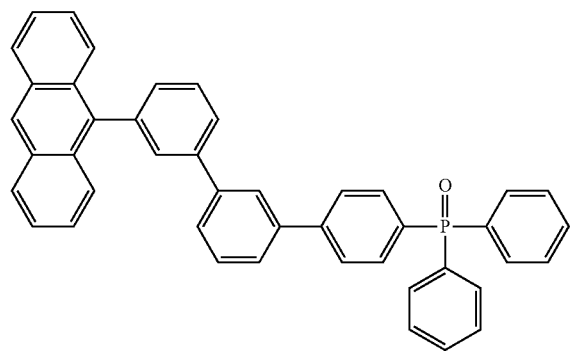
B31
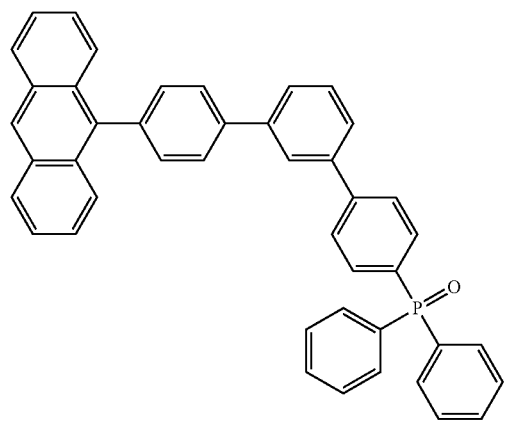
B32
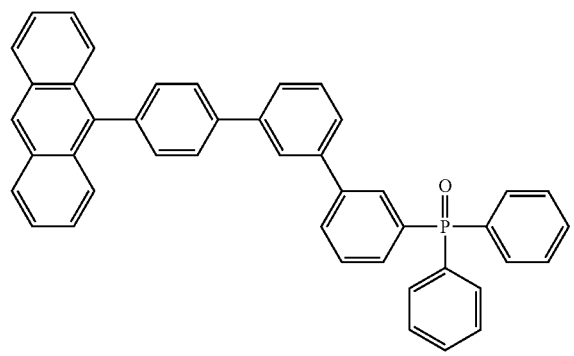

-continued

B33
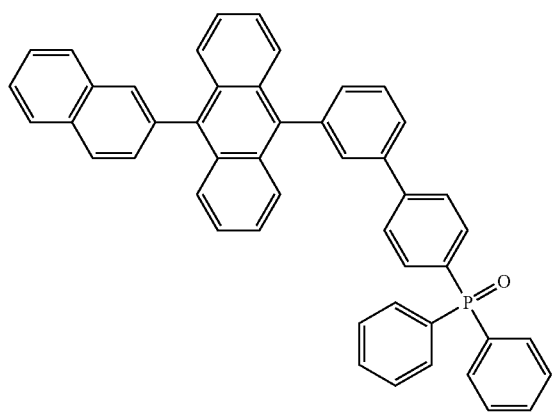

B34
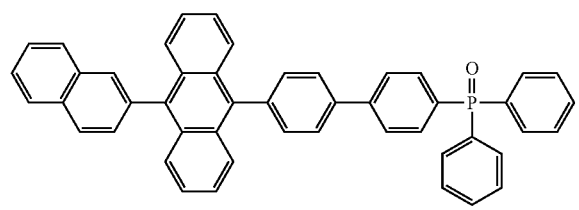

B35
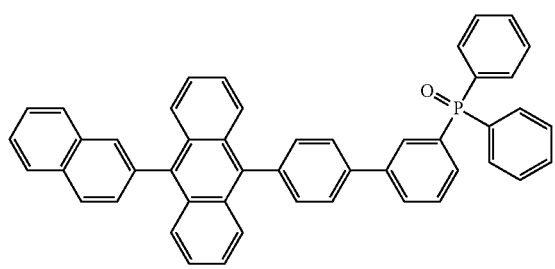

B36
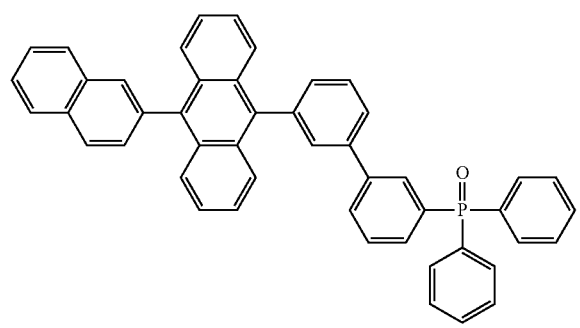

B37
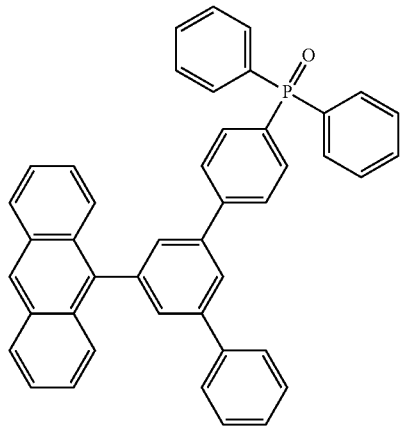

B38
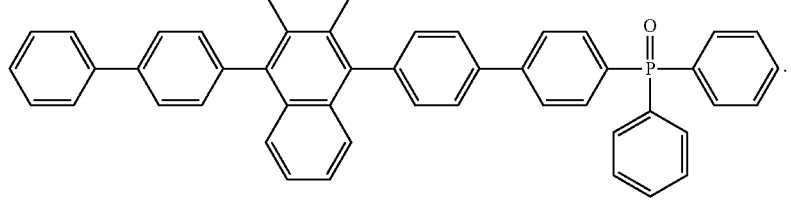

Another object the invention is achieved by an electronic device comprising at least one semiconducting material according to the invention, preferably in form of an electronic device wherein the inventive semiconducting material forms at least one layer between a cathode and an anode.

It is preferred that the semiconducting material according to the invention comprises the salt (II) and a compound according to formula (I) at least partly in form of a homogeneous mixture, wherein both components are molecularly dispersed in each other.

Specifically, another aspect of the invention is represented by an electronic device comprising at least one semiconducting layer comprising the semiconducting material according to the invention or consisting of it. More specifically, the semiconducting material according to the invention is used in the electronic device as an electron transporting layer, as an electron injecting layer, or as a layer having double electron transporting and hole blocking function. In specific cases, the semiconducting material according to the invention may also possess exciton blocking functionality.

Preferably, the arrangement of the inventive device does not allow that the inventive semiconducting layer emits light. In other words, it is preferred that only electrons enter the inventive semiconducting layer, whereas the access of holes is blocked, preventing thus exciton formation.

In another aspect, there is provided an electronic device, which is a light-emitting device. Preferably, the light-emitting device may be part of a pixel array in a display or part of a light source.

According to another aspect there is provided a compound having the structure according to formula (I)

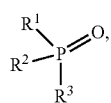

(I)

wherein in structure (I):

$R^1$, $R^2$ and $R^3$ are independently selected from $C_1$-$C_{30}$-alkyl, $C_3$-$C_{30}$ cycloalkyl, $C_2$-$C_{30}$-heteroalkyl, $C_6$-$C_{30}$-aryl, $C_2$-$C_{30}$-heteroaryl, $C_1$-$C_{30}$-alkoxy, $C_3$-$C_{30}$-cycloalkyloxy, $C_6$-$C_{30}$-aryloxy, and from a structural unit having general formula E-A-, and at least one group selected from $R^1$, $R^2$ and $R^3$ has the general formula E-A-, wherein A is a $C_6$-$C_{30}$ phenylene spacer unit, and E is an electron transport unit having the structure (Ib), (Ic), (Id) and/or (Ie):

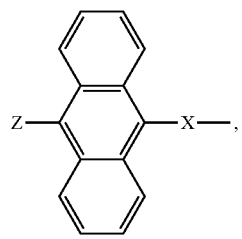

(Ib)

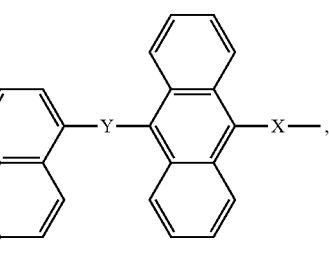

(Ic)

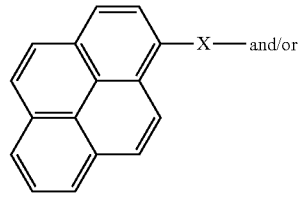

(Id) and/or

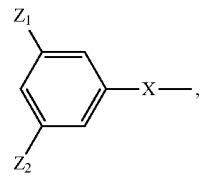

(Ie)

wherein in structure (Ib)

X is a single bond and

Z is selected from a group comprising dibenzo[b,d]furanyl, dibenzo[b,d]thiophenyl, 9-anthranyl, pyren-1-yl, pyren-2-yl, 9,9'-dialkylfluoren-2-yl, 9,9'-diarylfluoren-2-yl, 9-alkyl-9'-arylfluoren-2-yl, 9,9'-dialkylfluoren-3-yl, 9,9'-diarylfluoren-3-yl, 9-alkyl-9'-arylfluoren-3-yl, phenanthren-1-yl and phenanthren-3-yl; or wherein in structure (Ib)

X is selected from a group comprising phenylene, biphenyl, naphthalen-1,8-diyl, naphthalen-2,6-diyl, 9,9'-dialkylfluoren-2,7-diyl, 9,9'-diarylfluoren-2,7-diyl, 9-alkyl-9'-arylfluoren-2,7-diyl, 9,9'-dialkylfluoren-3,6-diyl, 9,9'-diarylfluoren-3,6-diyl and 9-alkyl-9'-arylfluoren-3,6-diyl; and Z is selected from a group comprising hydrogen, naphtyl, biphenylyl, dibenzo[b,d]furanyl, dibenzo[b,d]thiophenyl, 9-anthranyl, pyren-1-yl, pyren-2-yl, 9,9'-dialkylfluoren-2-yl, 9,9'-diarylfluoren-2-yl, 9-alkyl-9'-arylfluoren-2-yl, 9,9'-dialkylfluoren-3-yl, 9,9'-diarylfluoren-3-yl, 9-alkyl-9'-arylfluoren-3-yl, phenanthren-1-yl and phenanthren-3-yl;

wherein in structure (Ic)

X is selected from a single bond, phenylene and biphenyl and

Y is phenylene;

wherein in structure (Id)

X is selected from a group comprising phenylene, biphenyl, naphthalen-1,8-diyl, naphthalen-2,6-diyl, 9,9'-dialkylfluoren-2,7-diyl, 9,9'-diarylfluoren-2,7-diyl, 9-alkyl-9'-arylfluoren-2,7-diyl, 9,9'-dialkylfluoren-3,6-diyl, 9,9'-diarylfluoren-3,6-diyl and 9-alkyl-9'-arylfluoren-3,6-diyl;

wherein in structure (Ie)

X is a single bond and $Z_1$ and $Z_2$ are independently selected from a group comprising phenyl, naphthyl, dibenzo[b,d]furanyl, dibenzo[b,d]thiophenyl, 9-anthranyl, pyren-1-yl, pyren-2-yl, 9,9'-dialkylfluoren-2-yl, 9,9'-diarylfluoren-2-yl, 9-alkyl-9'-arylfluoren-2-yl, 9,9'-dialkylfluoren-3-yl, 9,9'-diarylfluoren-3-yl, 9-alkyl-9'-arylfluoren-3-yl, phenanthrene-1-yl and phenanthrene-3-yl;

and excluding structures

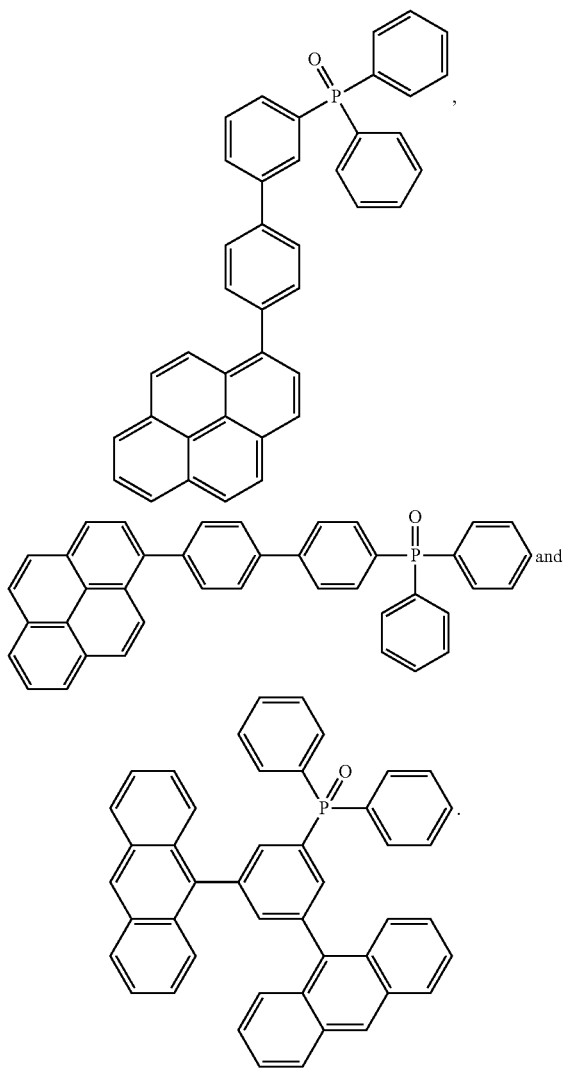

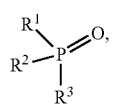

According to another aspect there is provided a compound having the structure according to formula (I)

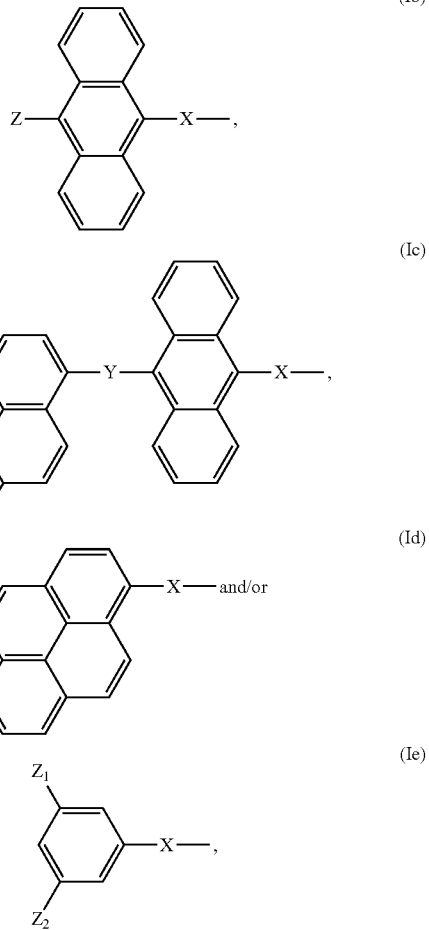

wherein in structure (I):
R$^1$, R$^2$ and R$^3$ are independently selected from C$_6$-C$_{30}$-aryl, C$_2$-C$_{30}$-heteroaryl, C$_6$-C$_{30}$-aryloxy, preferably C$_6$-C$_{30}$-aryl, C$_6$-C$_{30}$-aryloxy, and further preferred C$_6$-C$_{30}$-aryl, and more preferred from a structural unit having general formula E-A-; and at least one group selected from R$^1$, R$^2$ and R$^3$ has the general formula E-A-, wherein
A is a C$_6$-C$_{30}$ phenylene spacer unit, and preferably A is a spacer unit selected from the group comprising a phenylene spacer unit, m-phenylene spacer unit, p-phenylene spacer unit, biphenyl spacer unit, m-biphenyl spacer unit, p-biphenyl spacer unit, terphenyl spacer unit, m-terphenyl spacer unit or p-terphenyl spacer unit, and
E is an electron transport unit having the structure (Ib), (Ic), (Id) and/or (Ie):

wherein in structure (Ib)
X is a single bond and
Z is selected from a group comprising dibenzo[b,d]furanyl, dibenzo[b,d]thiophenyl, 9-anthranyl, pyren-1-yl, pyren-2-yl, 9,9'-dialkylfluoren-2-yl, 9,9'-diarylfluoren-2-yl, 9-alkyl-9'-arylfluoren-2-yl, 9,9'-dialkylfluoren-3-yl, 9,9'-diarylfluoren-3-yl, 9-alkyl-9'-arylfluoren-3-yl, phenanthren-1-yl and phenanthren-3-yl; or
wherein in structure (Ib)
X is selected from a group comprising phenylene, biphenyl, naphthalen-1,8-diyl, naphthalen-2,6-diyl, 9,9'-dialkylfluoren-2,7-diyl, 9,9'-diarylfluoren-2,7-diyl, 9-alkyl-9'-arylfluoren-2,7-diyl, 9,9'-dialkylfluoren-3,6-diyl, 9,9'-diarylfluoren-3,6-diyl and 9-alkyl-9'-arylfluoren-3,6-diyl; and
Z is selected from a group comprising hydrogen, naphtyl, biphenylyl, dibenzo[b,d]furanyl, dibenzo[b,d]thiophenyl, 9-anthranyl, pyren-1-yl, pyren-2-yl, 9,9'-dialkylfluoren-2-yl, 9,9'-diarylfluoren-2-yl, 9-alkyl-9'-arylfluoren-2-yl, 9,9'-dialkylfluoren-3-yl, 9,9'-diarylfluoren-3-yl, 9-alkyl-9'-arylfluoren-3-yl, phenanthren-1-yl and phenanthren-3-yl;

wherein in structure (Ic)
  X is selected from a single bond, phenylene and biphenyl; and
  Y is phenylene;
wherein in structure (Id)
  X is selected from a group comprising phenylene, biphenyl, naphthalen-1,8-diyl, naphthalen-2,6-diyl, 9,9'-dialkylfluoren-2,7-diyl, 9,9'-diarylfluoren-2,7-diyl, 9-alkyl-9'-arylfluoren-2,7-diyl, 9,9'-dialkylfluoren-3,6-diyl, 9,9'-diarylfluoren-3,6-diyl and 9-alkyl-9'-arylfluoren-3,6-diyl;
wherein in structure (Ie)
  X is a single bond and
  $Z_1$ and $Z_2$ are independently selected from a group comprising phenyl, naphthyl, dibenzo[b,d]furanyl, dibenzo[b,d]thiophenyl, 9-anthranyl, pyren-1-yl, pyren-2-yl, 9,9'-dialkylfluoren-2-yl, 9,9'-diarylfluoren-2-yl, 9-alkyl-9'-arylfluoren-2-yl, 9,9'-dialkylfluoren-3-yl, 9,9'-diarylfluoren-3-yl, 9-alkyl-9'-arylfluoren-3-yl, phenanthrene-1-yl and phenanthrene-3-yl; and excluding structures

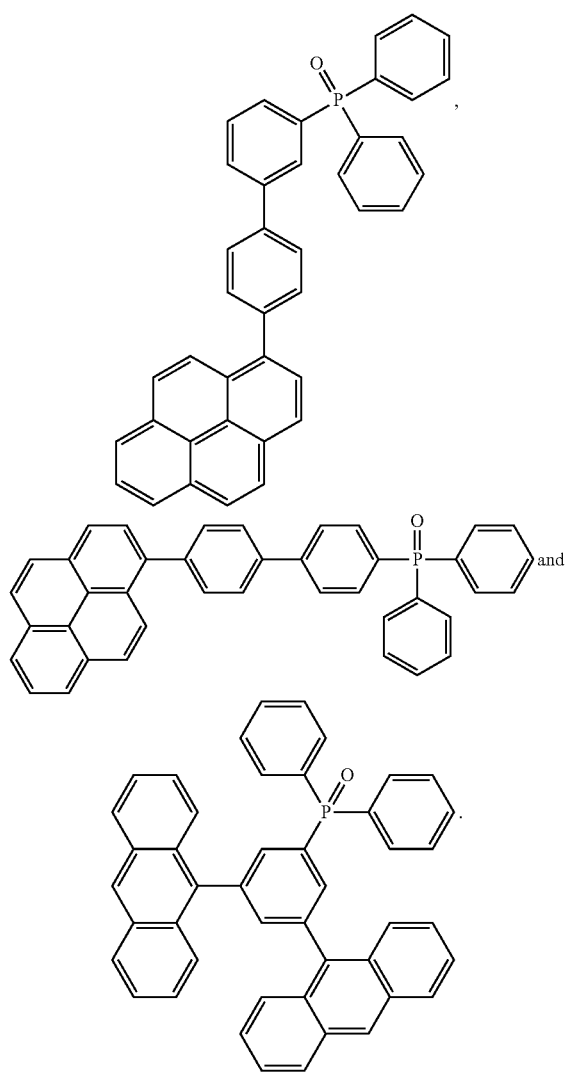

According to another aspect, there is provided a compound having the structure according to formula (I), wherein A is a $C_6$-$C_{30}$ m-phenylene or p-phenylene spacer unit.

According to another aspect, there is provided a compound having the structure according to formula (I), wherein at least one of substituents $R^1$, $R^2$ and/or $R^3$ is a phenyl.

According to another aspect, there is provided a compound having the structure according to formula (I), wherein A is a spacer unit selected from the group comprising a phenylene spacer unit, m-phenylene spacer unit, p-phenylene spacer unit, biphenyl spacer unit, m-biphenyl spacer unit, p-biphenyl spacer unit, terphenyl spacer unit, m-terphenyl spacer unit or p-terphenyl spacer unit.

According to another aspect, there is provided a compound having the structure according to formula (I),
wherein in structure (Ib)
  X is selected from a group comprising a single bond, phenylene, biphenyl, naphthalen-1,8-diyl, naphthalen-2,6-diyl, 9,9'-dialkylfluoren-2,7-diyl, 9,9'-diarylfluoren-2,7-diyl, 9-alkyl-9'-arylfluoren-2,7-diyl, 9,9'-dialkylfluoren-3,6-diyl, 9,9'-diarylfluoren-3,6-diyl and 9-alkyl-9'-arylfluoren-3,6-diyl; wherein alkyl is C1-C12 alkyl and aryl is C6-C20 aryl;
and
  Z is selected from a group comprising dibenzo[b,d]furanyl, dibenzo[b,d]thiophenyl, 9-anthranyl, pyren-1-yl, 9,9'-dialkylfluoren-2-yl, 9,9'-diarylfluoren-2-yl, 9-alkyl-9'-arylfluoren-2-yl, 9,9'-dialkylfluoren-3-yl, 9,9'-diarylfluoren-3-yl, 9-alkyl-9'-arylfluoren-3-yl, phenanthren-1-yl and phenanthren-3-yl; wherein alkyl is C1-C12 alkyl and aryl is C6-C20 aryl;
wherein in structure (Id)
  X is selected from a group comprising phenylene, biphenyl, naphthalen-1,8-diyl, naphthalen-2,6-diyl, 9,9'-dialkylfluoren-2,7-diyl, 9,9'-diarylfluoren-2,7-diyl, 9-alkyl-9'-arylfluoren-2,7-diyl, 9,9'-dialkylfluoren-3,6-diyl, 9,9'-diarylfluoren-3,6-diyl and 9-alkyl-9'-arylfluoren-3,6-diyl; wherein alkyl is C1-C12 alkyl and aryl is C6-C20 aryl;
wherein in structure (Ie)
  $Z_1$ and $Z_2$ are independently selected from a group comprising phenyl, naphthyl, dibenzo[b,d]furanyl, dibenzo[b,d]thiophenyl, 9-anthranyl, pyren-1-yl, 9,9'-dialkylfluoren-2-yl, 9,9'-diarylfluoren-2-yl, 9-alkyl-9'-arylfluoren-2-yl, 9,9'-dialkylfluoren-3-yl, 9,9'-diarylfluoren-3-yl, 9-alkyl-9'-arylfluoren-3-yl, phenanthrene-1-yl and phenanthrene-3-yl; wherein alkyl is C1-C12 alkyl and aryl is C6-C20 aryl.

According to another aspect, there is provided a compound having the structure according to formula (I), wherein the compound of formula (I) is represented by any of the following formulas:

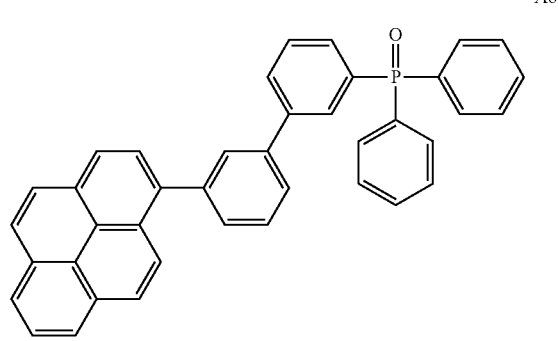

A8

-continued
A9
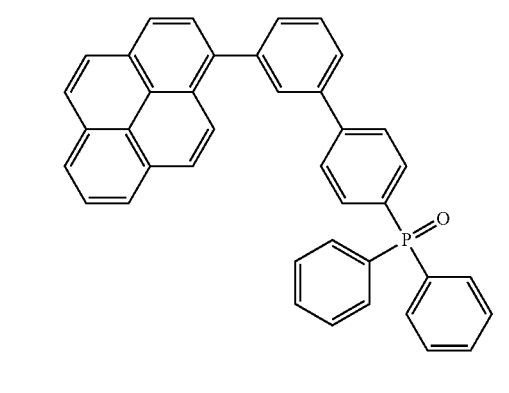
A10
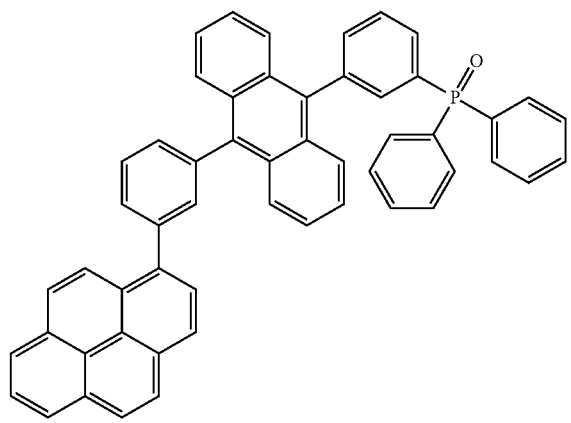
A11
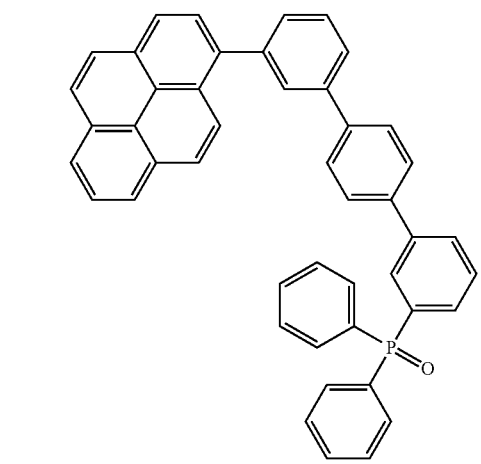
A12
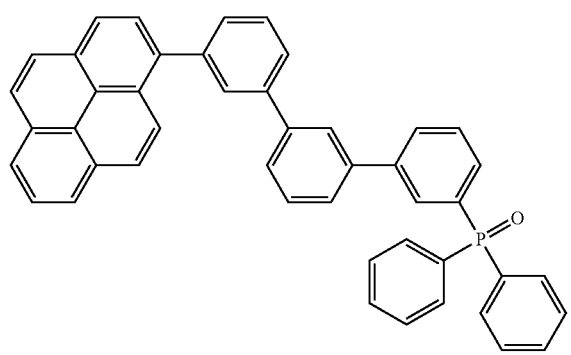
-continued
A13
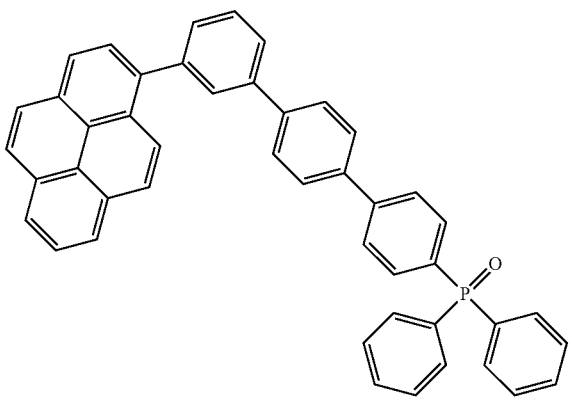
A14
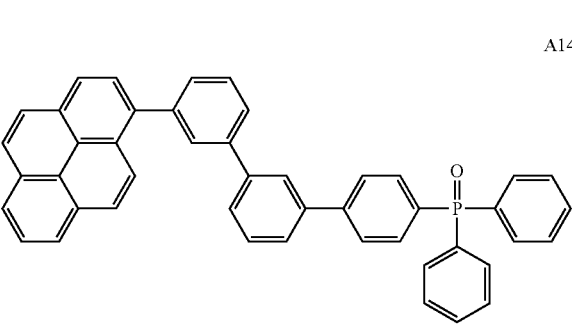
A15
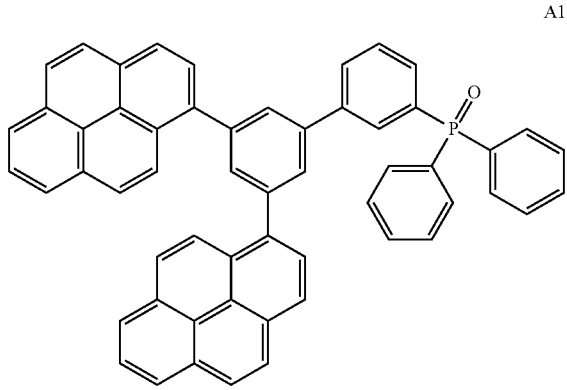
B12
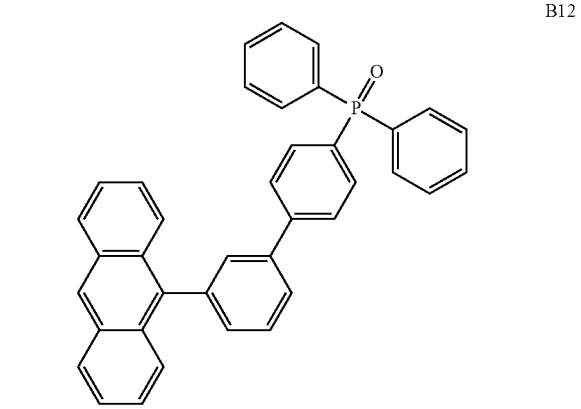

-continued
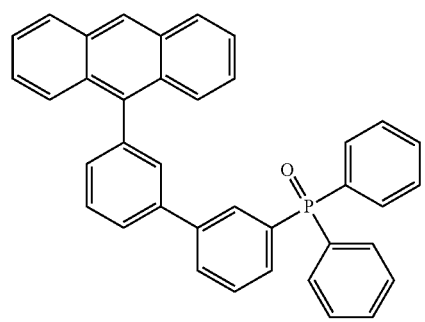
B16
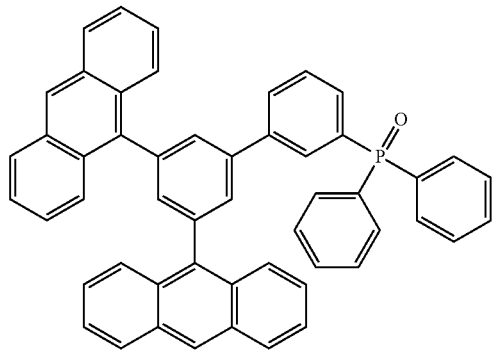
B21
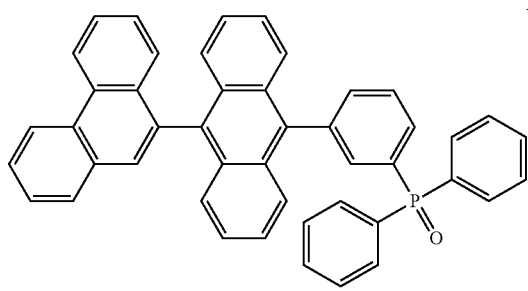
B17
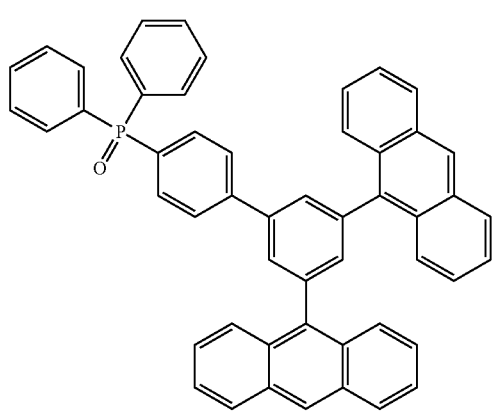
B22
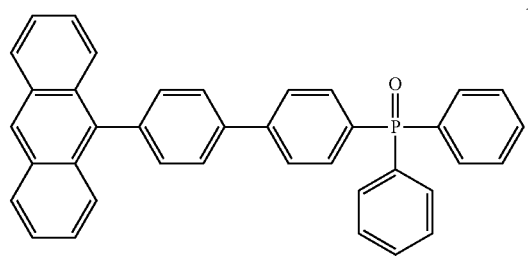
B19
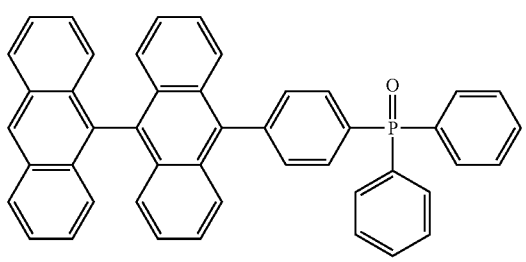
B23
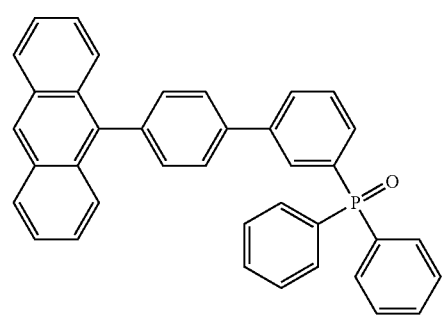
B20
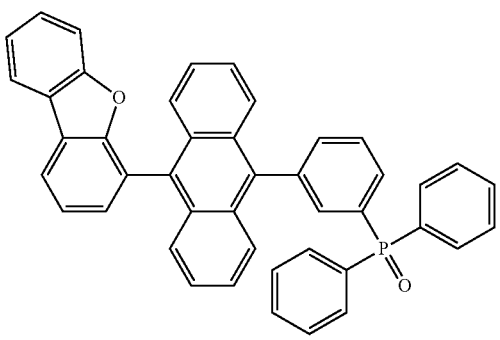
B24

B25
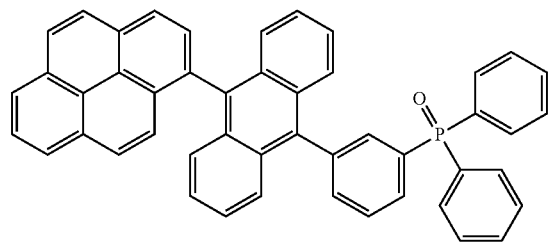
B26
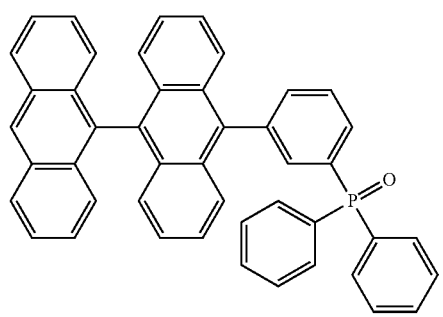
B27
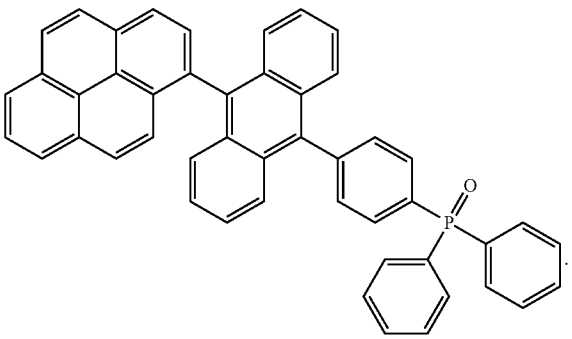
According to another aspect, there are provided more preferred compounds having the structure according to formula (I), wherein the compound of formula (I) is represented by any of the following formulas:
A8
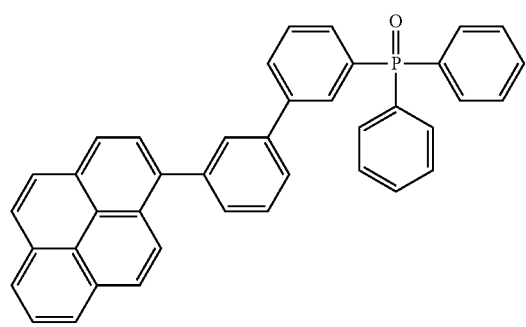
A9
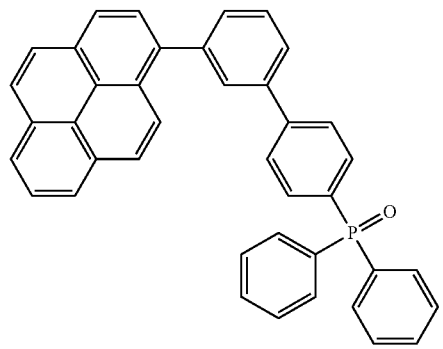
A10
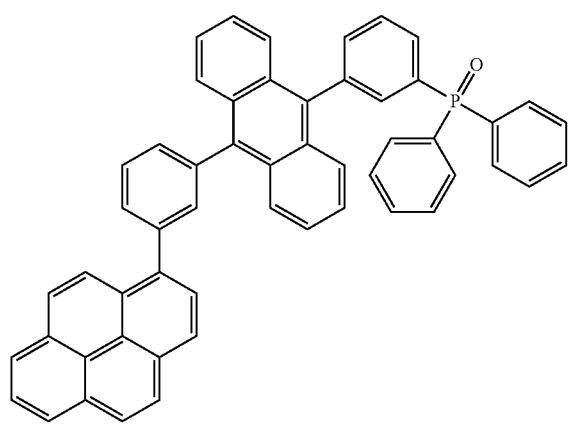
A11
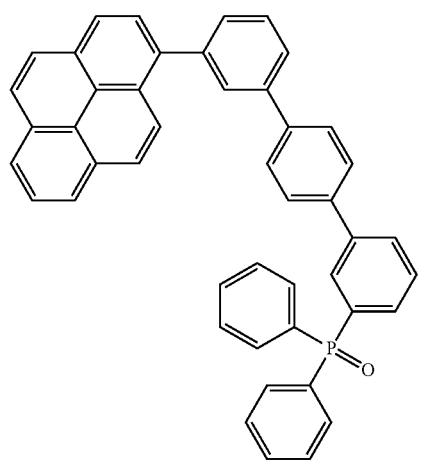

-continued
A12
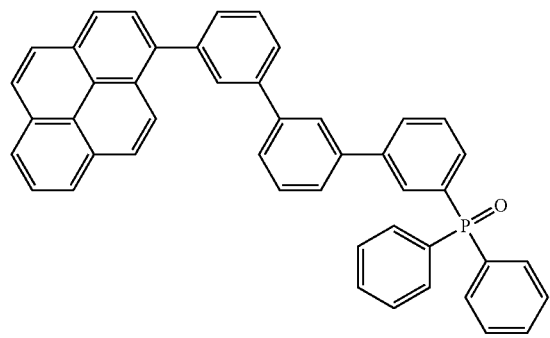
A13
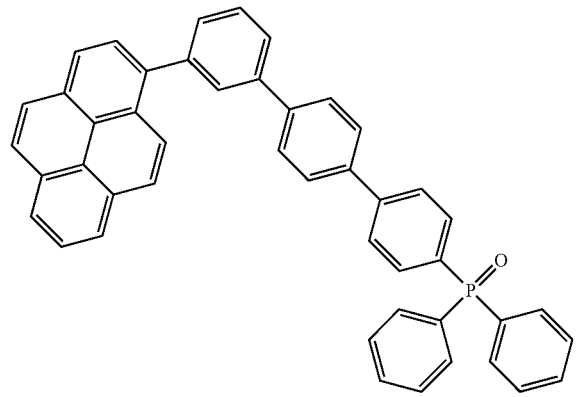
A14
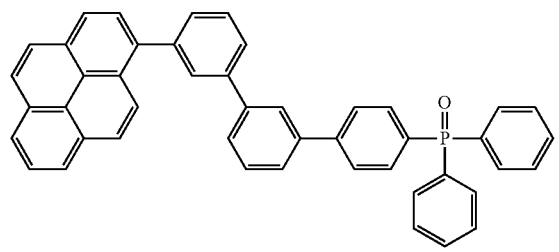
A15
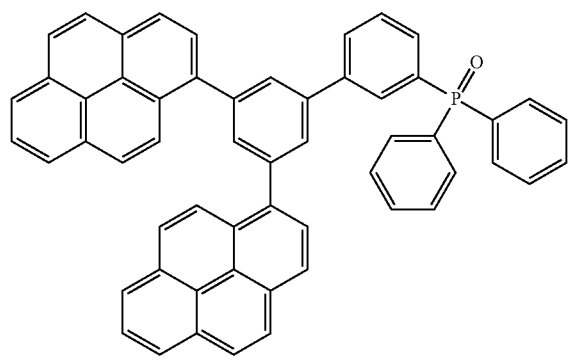
B12
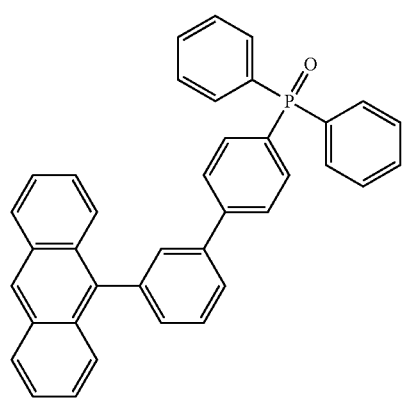
B16
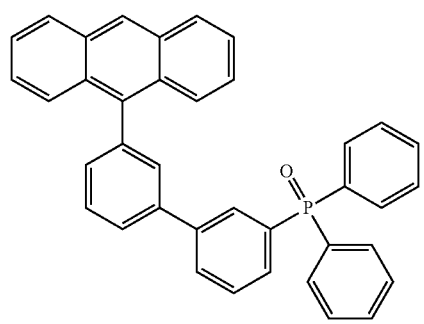
B17
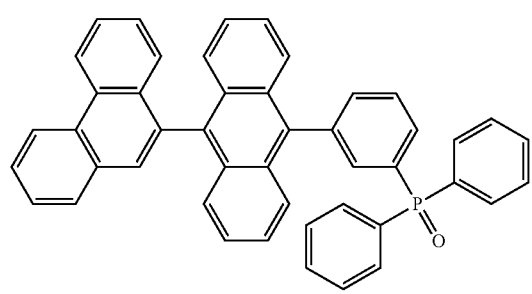
B19
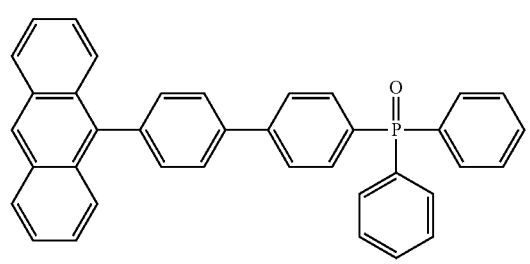

-continued
B20 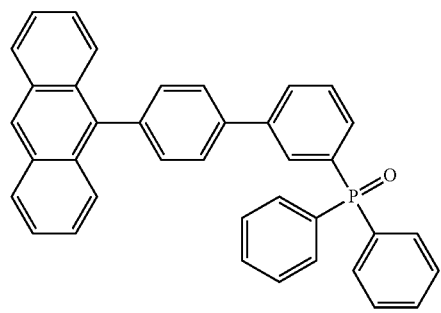
B21 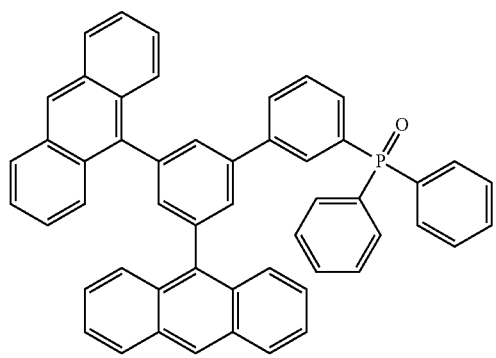
B22 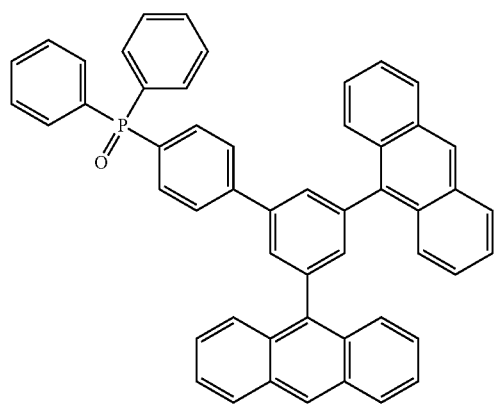
B23 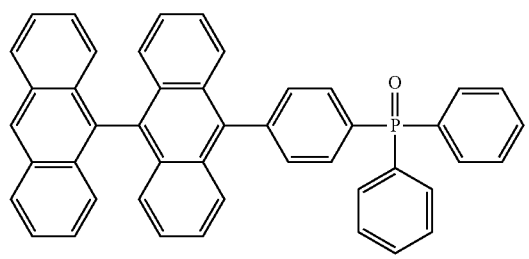
B24 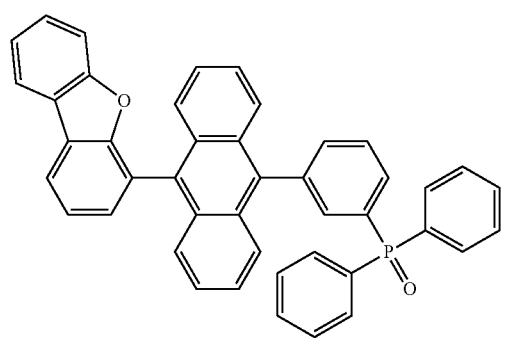
B25 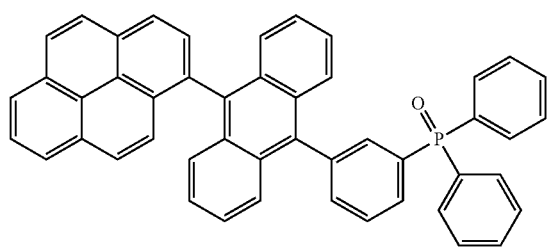
B26 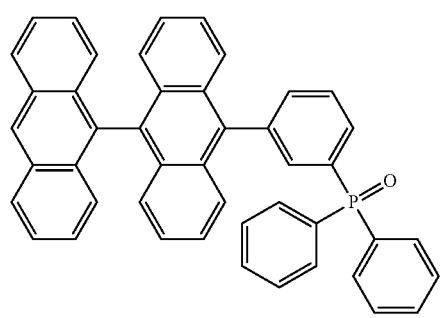
B27 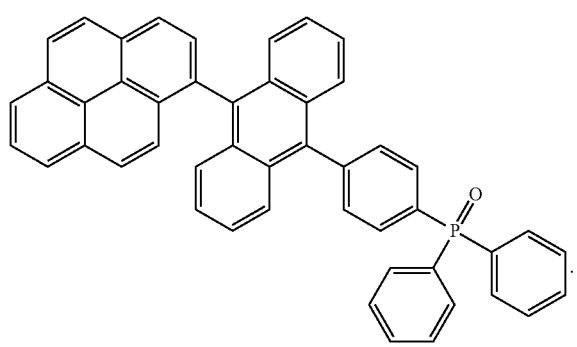

-continued
B28
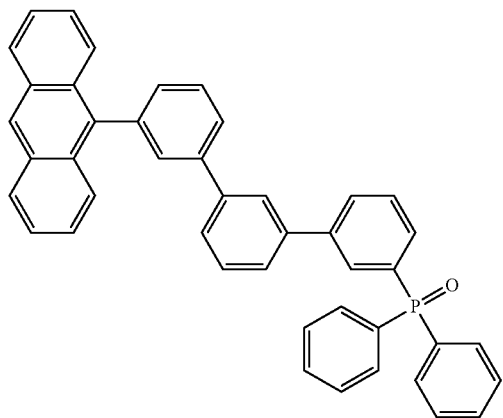
B29
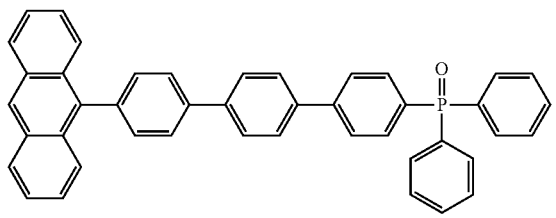
B30
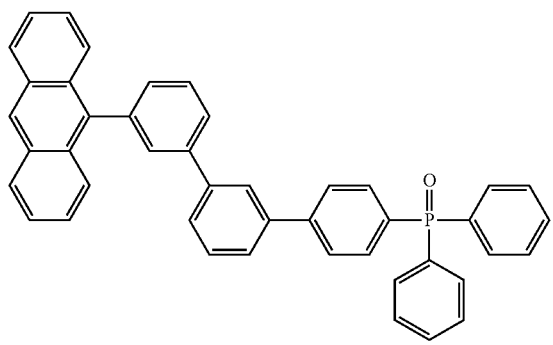
B31
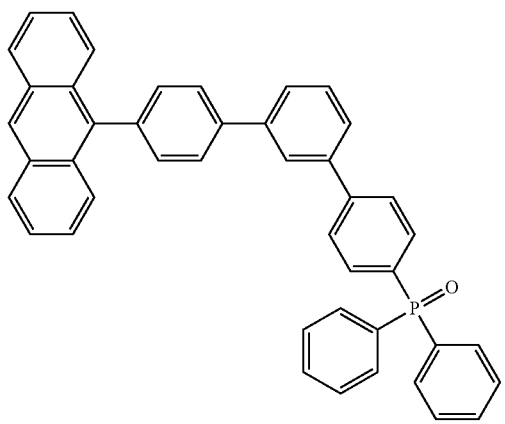
B32
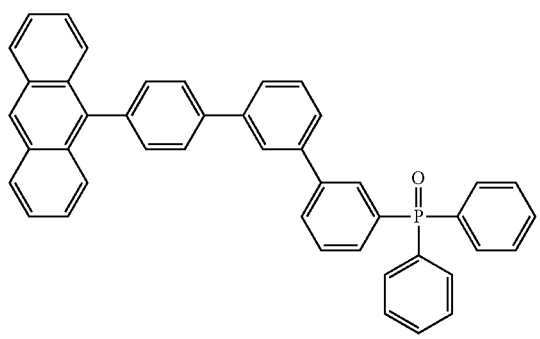
B33
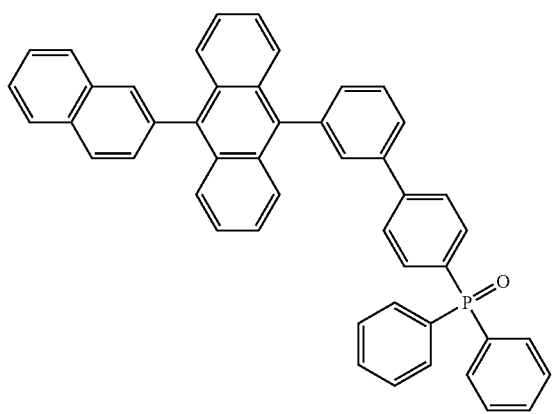
B34
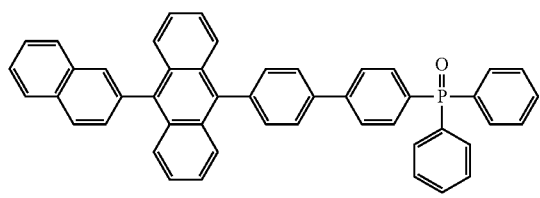
B35
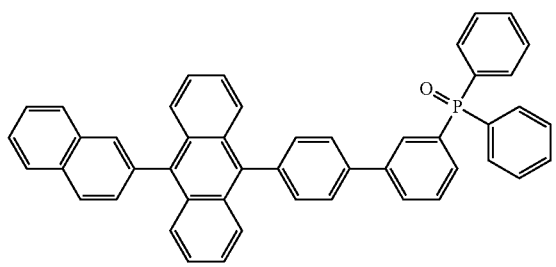

-continued

B36

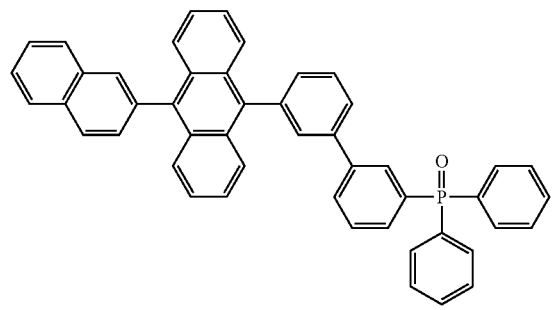

B37

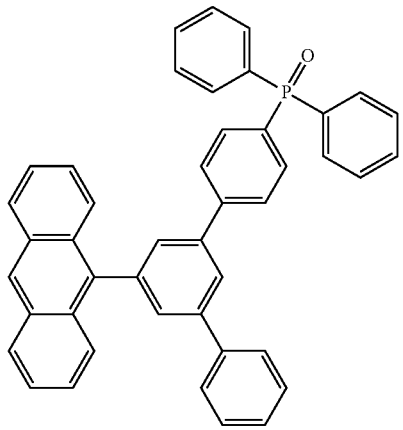

B38

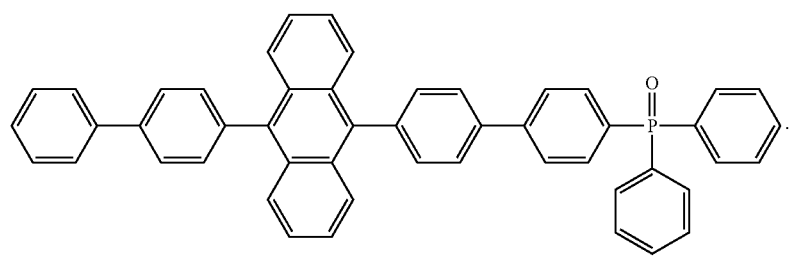

III. BRIEF DESCRIPTION OF THE DRAWINGS

IV. DETAILED DESCRIPTION OF THE INVENTION

Device Architecture

Figure 1:
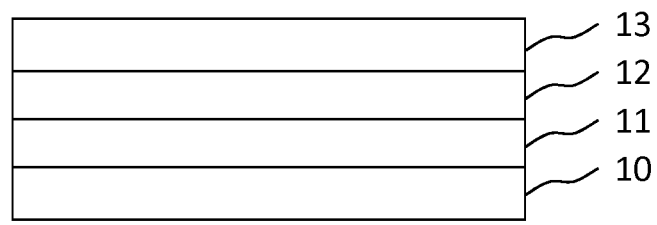
FIG. 1 shows a schematic illustration of a device in which the present invention can be incorporated.

FIG. 1 shows a stack of anode (10), organic semiconducting layer (11) comprising the light emitting layer (EML), electron transporting layer (ETL) (12), and cathode (13). Other layers can be inserted between those depicted, as explained herein.

Figure 2:
FIG. 2 shows a schematic illustration of a device in which the present invention can be incorporated.

FIG. 2 shows a stack of an anode (20), a hole injecting and transporting layer (21), a hole transporting layer (22) which can also aggregate the function of electron blocking, an EML (23), an ETL (24), and a cathode (25). Other layers can be inserted between those depicted, as explained herein.

The wording "device" comprises the organic light emitting diode.

Material Properties—Energy Levels

A method to determine the ionization potentials (IP) is the ultraviolet photoelectron spectroscopy (UPS). It is usual to measure the ionization potential for solid state materials; however, it is also possible to measure the IP in the gas phase. Both values are differentiated by their solid state effects, which are, for example the polarization energy of the holes that are created during the photo ionization process. A typical value for the polarization energy is approximately 1 eV, but larger discrepancies of the values can also occur. The IP is related to beginning of the photoemission spectra in the region of the large kinetic energy of the photoelectrons, i.e. the energy of the most weakly bounded electrons. A related method to UPS, the inverted photo electron spectroscopy (IPES) can be used to determine the electron affinity (EA). However, this method is less common. Electrochemical measurements in solution are an alternative to the determination of solid state oxidation ($E_{ox}$) and reduction ($E_{red}$) potential. An adequate method is for example the cyclovoltammetry. A simple rule is used very often for the conversion of red/ox potentials into electron affinities and ionization potential: IP=4.8 eV+e*$E_{ox}$ (vs. ferrocenium/ferrocene (Fc$^+$/Fc)) and EA=4.8 eV+e*$E_{red}$ (vs. Fc$^+$/Fc) respectively (see B. W. D'Andrade, Org. Electron. 6, 11-20 (2005)). Processes are known for the correction of the electrochemical potentials in the case other reference electrodes or other redox pairs are used (see A. J. Bard, L. R. Faulkner, "Electrochemical Methods: Fundamentals and Applications", Wiley, 2. Ausgabe 2000). The information about the influence of the solution used can be found in N. G. Connelly et al., Chem. Rev. 96, 877 (1996). It is usual, even if not exactly correct to use the terms "energy of the HOMO" $E_{(HOMO)}$ and "energy of the LUMO" $E_{(LUMO)}$ respectively as synonyms for the ionization energy and electron affinity (Koopmans theorem). It has to be taken in consideration, that the ionization potentials and the electron affinities are given in such a way that a larger value represents a stronger binding of a released or respectively of an absorbed electron. The energy scale of the frontier molecular orbitals (HOMO, LUMO) is opposed to this. Therefore, in a rough approximation, is valid: IP=−$E_{(HOMO)}$ and EA=$E_{(LUMO)}$. The given potentials correspond to the solid-state potentials.

Substrate

It can be flexible or rigid, transparent, opaque, reflective, or translucent. The substrate should be transparent or translucent if the light generated by the OLED is to be transmitted through the substrate (bottom emitting). The substrate may be opaque if the light generated by the OLED is to be emitted in the direction opposite of the substrate, the so called top-emitting type. The OLED can also be transparent. The substrate can be either arranged adjacent to the cathode or anode.

Electrodes

The electrodes are the anode and the cathode, they must provide a certain amount of conductivity, being preferentially metallic conductors. Preferentially the "first electrode" is the cathode. At least one of the electrodes must be semi-transparent or transparent to enable the light transmission to the outside of the device. Typical electrodes are layers or a stack of layer, comprising metal and/or transparent conductive oxide. Other possible electrodes are made of thin busbars (e.g. a thin metal grid) wherein the spaces between the busbars are filled (coated) with a transparent material with a certain conductivity, such as graphene, carbon nanotubes, doped organic semiconductors, etc.

In one mode, the anode is the electrode closest to the substrate, which is called non-inverted structure. In another mode, the cathode is the electrode closest to the substrate, which is called inverted structure.

Typical materials for the anode are ITO and Ag. Typical materials for the cathode are Mg:Ag (10 vol. % of Mg), Ag, ITO, Al. Mixtures and multilayer are also possible.

Preferably, the cathode comprises a metal selected from Ag, Al, Mg, Ba, Ca, Yb, In, Zn, Sn, Sm, Bi, Eu, Li, more preferably from Al, Mg, Ca, Ba and even more preferably selected from Al or Mg. Preferred is also a cathode comprising an alloy of Mg and Ag.

Hole-Transporting Layer (HTL)

Is a layer comprising a large gap semiconductor responsible to transport holes from the anode or holes from a CGL to the EML. The HTL is comprised between the anode and the EML or between the hole generating side of a CGL and the EML. The HTL can be mixed with another material, for example a p-dopant, in which case it is said the HTL is p-doped. The HTL can be comprised by several layers, which can have different compositions. P-doping the HTL lowers its resistivity and avoids the respective power loss due to the otherwise high resistivity of the undoped semiconductor. The doped HTL can also be used as optical spacer, because it can be made very thick, up to 1000 nm or more without significant increase in resistivity. Suitable hole transport materials (HTM) can be, for instance HTM from the diamine class, where a conjugated system is provided at least between the two diamine nitrogens. Examples are N4,N4'-di(naphthalen-1-yl)-N4,N4'-diphenyl-[1,1'-biphenyl]-4,4'-diamine (HTM1), N4,N4, N4'',N4''-tetra([1,1'-biphenyl]-4-yl)-[1,1':4',1''-terphenyl]-4,4''-diamine (HTM2) or N4,N4''-di(naphthalen-1-yl)-N4,N4''-diphenyl-[1,1':4',1''-terphenyl]-4,4''-diamine (HTM3). The synthesis of diamines is well described in literature; many diamine HTMs are readily commercially available.

Hole-Injecting Layer (HIL)

Is a layer which facilitates the injection of holes from the anode or from the hole generating side of a CGL into an adjacent HTL. Typically the HIL is a very thin layer (<10 nm). The hole injection layer can be a pure layer of p-dopant and can be about 1 nm thick. When the HTL is doped, an HIL may not be necessary, since the injection function is already provided by the HTL.

Light-Emitting Layer (EML)

The light emitting layer must comprise at least one emission material and can optionally comprise additional layers. If the EML comprises a mixture of two or more materials the charge carrier injection can occur in different materials for instance in a material which is not the emitter, or the charge carrier injection can also occur directly into the emitter. Many different energy transfer processes can occur inside the EML or adjacent EMLs leading to different types of emission. For instance excitons can be formed in a host material and then be transferred as singlet or triplet excitons to an emitter material which can be singlet or triplet emitter which then emits light. A mixture of different types of emitter can be provided for higher efficiency. Mixed light can be realized by using emission from an emitter host and an emitter dopant.

Blocking layers can be used to improve the confinement of charge carriers in the EML, these blocking layers are further explained in U.S. Pat. No. 7,074,500 B2.

Electron-Transporting Layer (ETL)

The electron-transporting layer is a layer comprising a large gap semiconductor responsible to transport electrons from the cathode or electrons from a CGL or EIL (see below) to the EML. The ETL is comprised between the cathode and the EML or between the electron generating side of a CGL and the EML. The ETL can be mixed with an electrical n-dopant, in which case it is said the ETL is n-doped. The ETL can be comprised by several layers, which can have different compositions. Electrical n-doping of the ETL lowers its resistivity and/or improves its ability to inject electrons into an adjacent layer and avoids the respective power loss due to the otherwise high resistivity (and/or bad injection ability) of the undoped semiconductor. The doped ETL can also be used as optical spacer, for tuning the optical properties of the whole device by an appropriate choice of the ETL thickness, because it can be made very thick, up to 1000 nm or more without significant increase in resistivity.

Besides doping with compound (II), the present invention may employ a compound according to formula (I) in the ETL also in neat form or in combination with other materials, in the whole layer or in a sub-layer of the ETL.

Hole blocking layers and electron blocking layers can be employed as usual.

Other layers with different functions can be included, and the device architecture can be adapted as known by the skilled in the art. For example, an Electron-Injecting Layer (EIL) can be used between the cathode and the ETL. Also the EIL can comprise the inventive matrix compounds of the present application.

Charge Generation Layer (CGL)

The OLED can comprise a CGL which can be used in conjunction with an electrode as inversion contact, or as connecting unit in stacked OLEDs. A CGL can have the most different configurations and names, examples are pn-junction, connecting unit, tunnel junction, etc. Best examples are pn junctions as disclosed in US 2009/0045728 A1, US 2010/0288362 A1. Metal layers and or insulating layers can also be used.

Stacked OLEDs

When the OLED comprises two or more EMLs separated by CGLs, the OLED is named a stacked OLED, otherwise it is named a single unit OLED. The group of layers between two closest CGLs or between one of the electrodes and the closest CGL is named a electroluminescent unit (ELU). Therefore a stacked OLED can be described as anode/$ELU_1$/$\{CGL_X/ELU_{1+X}\}_X$/cathode, wherein x is a positive integer and each $CGL_X$ or each $ELU_{1+X}$ can be equal or different. The CGL can also be formed by the adjacent layers of two ELUs as disclosed in US2009/0009072 A1. Further stacked OLEDs are explained e.g. in US 2009/0045728 A1, US 2010/0288362 A1, and references therein.

Deposition of Organic Layers

Any organic semiconducting layers of the inventive display can be deposited by known techniques, such as vacuum thermal evaporation (VTE), organic vapour phase deposition, laser induced thermal transfer, spin coating, blade coating, slot dye coating, inkjet printing, etc. A preferred method for preparing the OLED according to the invention is vacuum thermal evaporation.

Preferably, the ETL is formed by evaporation. When using an additional material in the ETL, it is preferred that the ETL is formed by co-evaporation of the electron transporting matrix (ETM) and the additional material. The additional material may be mixed homogeneously in the ETL. In one mode of the invention, the additional material has a concentration variation in the ETL, wherein the concentration changes in the direction of the thickness of the stack of layers. It is also foreseen that the ETL is structured in sub-layers, wherein some but not all of these sub-layers comprise the additional material.

Electrical Doping

The present invention can be used in addition or in combination with electrical doping of organic semiconducting layers.

The most reliable and at the same time efficient OLEDs are OLEDs comprising electrically doped layers. Generally, the electrical doping means improving of electrical properties, especially the conductivity and/or injection ability of a doped layer in comparison with neat charge-transporting matrix without a dopant. In the narrower sense, which is usually called redox doping or charge transfer doping, hole transport layers are doped with a suitable acceptor material (p-doping) or electron transport layers with a donor material (n-doping), respectively. Through redox doping, the density of charge carriers in organic solids (and therefore the conductivity) can be increased substantially. In other words, the redox doping increases the density of charge carriers of a semiconducting matrix in comparison with the charge carrier density of the undoped matrix. The use of doped charge-carrier transport layers (p-doping of the hole transport layer by admixture of acceptor-like molecules, n-doping of the electron transport layer by admixture of donor-like molecules) in organic light-emitting diodes is, e.g., described in US 2008/203406 and U.S. Pat. No. 5,093,698.

US2008227979 discloses in detail the charge-transfer doping of organic transport materials, with inorganic and with organic dopants. Basically, an effective electron transfer occurs from the dopant to the matrix increasing the Fermi level of the matrix. For an efficient transfer in a p-doping case, the LUMO energy level of the dopant is preferably more negative than the HOMO energy level of the matrix or at least slightly more positive, not more than 0.5 eV, to the HOMO energy level of the matrix. For the n-doping case, the HOMO energy level of the dopant is preferably more positive than the LUMO energy level of the matrix or at least slightly more negative, not lower than 0.5 eV, to the LUMO energy level of the matrix. It is further more desired that the energy level difference for energy transfer from dopant to matrix is smaller than +0.3 eV.

Typical examples of known redox doped hole transport materials are: copper phthalocyanine (CuPc), which HOMO level is approximately −5.2 eV, doped with tetrafluoro-tetracyanoquinonedimethane (F4TCNQ), which LUMO level is about −5.2 eV; zincphthalocyanine (ZnPc) (HOMO=−5.2 eV) doped with F4TCNQ; a-NPD (N,N'-Bis (naphthalen-1-yl)-N,N-bis(phenyl)-benzidine) doped with F4TCNQ. a-NPD doped with 2,2'-(perfluoronaphthalene-2, 6-diylidene) dimalononitrile (PD1). a-NPD doped with 2,2', 2"-(cyclopropane-1,2,3-triylidene)tris(2-(p-cyanotetrafluo-rophenyl)acetonitrile) (PD2). All p-doping in the device examples of the present application was done with 8 wt. % PD2.

Typical examples of known redox doped electron transport materials are: fullerene C60 doped with acridine orange base (AOB); perylene-3,4,9,10-tetracarboxylic-3,4,9,10-di-anhydride (PTCDA) doped with leuco crystal violet; 2,9-di (phenanthren-9-yl)-4,7-diphenyl-1,10-phenanthroline doped with tetrakis (1,3,4,6,7,8-hexahydro-2H-pyrimido[1, 2-a] pyrimidinato) ditungsten(II) ($W_2(hpp)_4$); naphthalene tetracarboxylic acid di-anhydride (NTCDA) doped with 3,6-bis-(dimethyl amino)-acridine; NTCDA doped with bis (ethylene-dithio) tetrathiafulvalene (BEDT-TTF).

In the present invention, classical redox dopants with high reduction strength, expressed as a highly negative redox potential measured by cyclic voltammetry (CV) in THF vs. Fc+/Fc standard, are successfully replaced with metal salts having no pronounced reductive properties. True mechanism how these compounds, sometimes called "electrically doping additives", contribute to the lowering of the voltage in electronic devices, is not yet known. Typical known representative of such metal salts is lithium 8-hydroxyquinolinolate (LiQ) represented by the formula D1

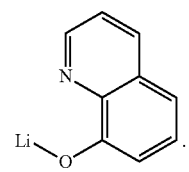

D1

Many other similar lithium complexes comprising five- or six-membered chelate ring wherein Li is coordinated to an oxygen and a nitrogen atom are known and have been used or proposed as electrical dopants for organic electron transporting semiconducting materials. The authors of the present application, surprisingly found that the semiconducting material according to present invention, comprising compounds (I) and (II) as defined above, provides in the same model devices on average significantly better performance than the state-of-the-art materials doped with D1.

Exemplary ETL matrix compounds as well as compounds of formula (I) of the present invention are:

A1 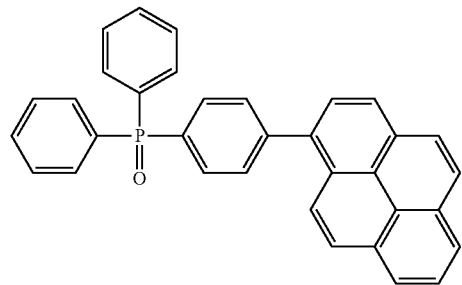
A2 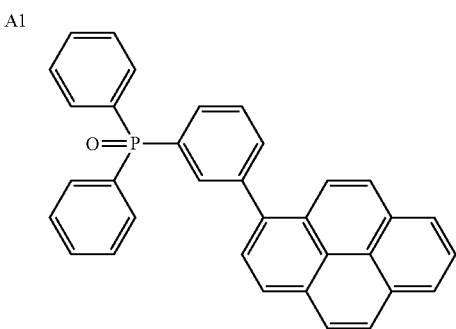
A3 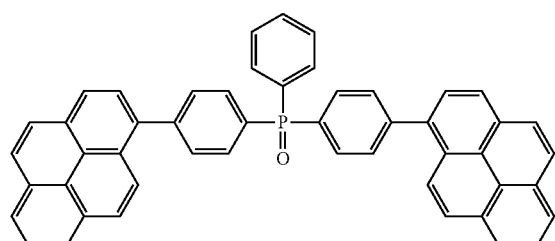
A4 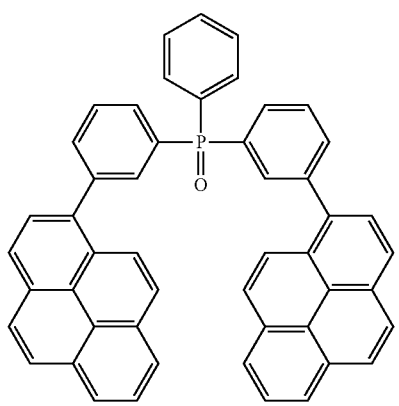
A5 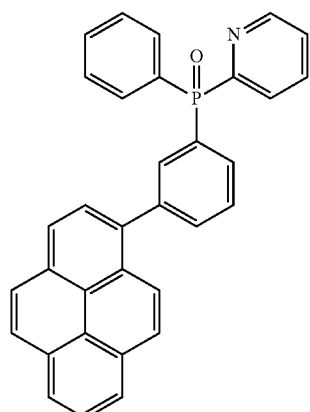
A6 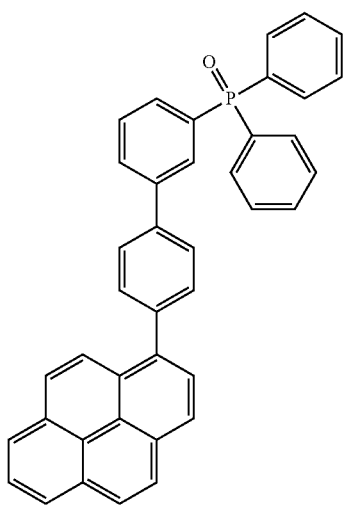
A7 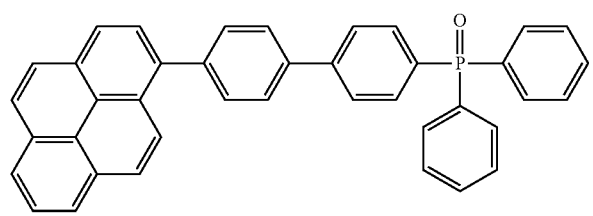
A8 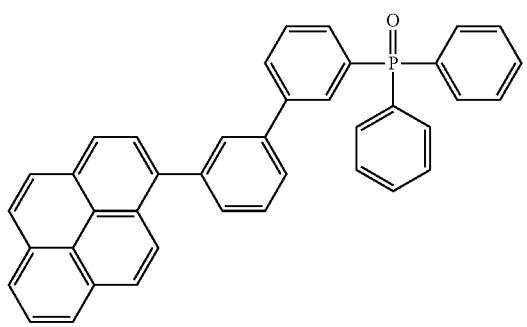

-continued
A9
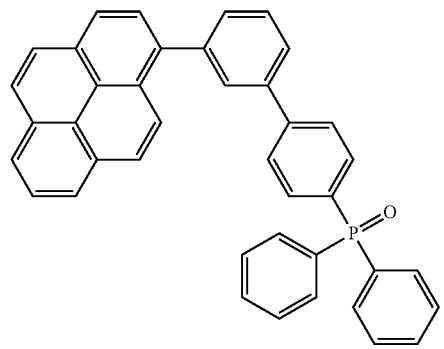
A10
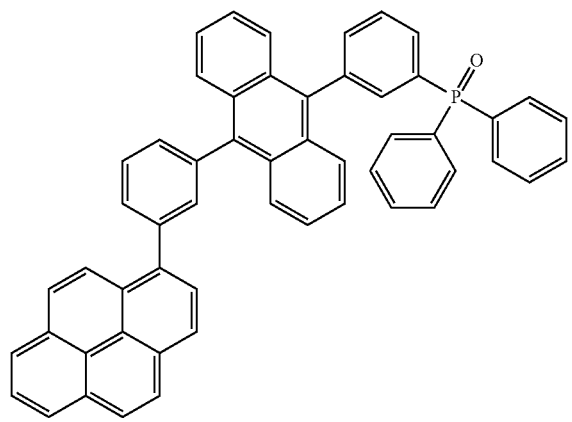
A11
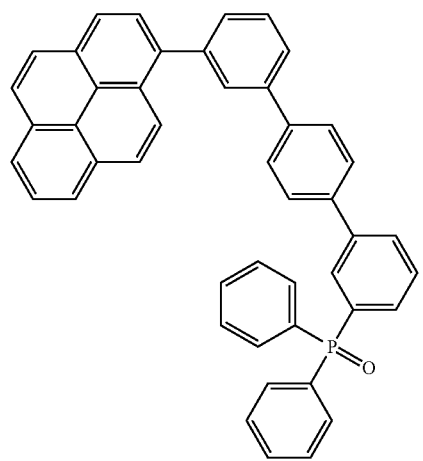
A12
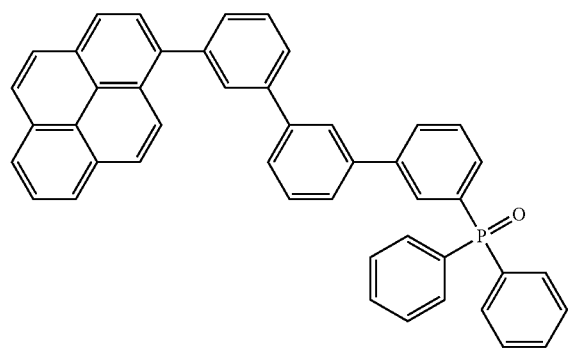
A13
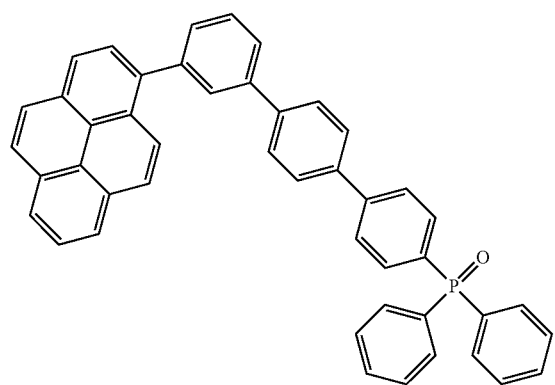
A14
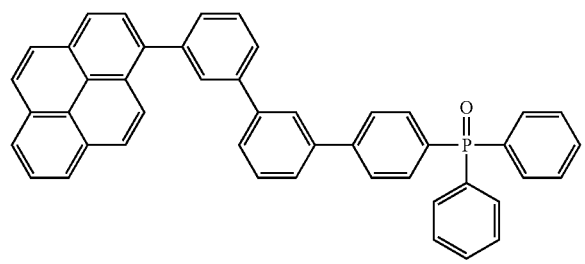

-continued
A15
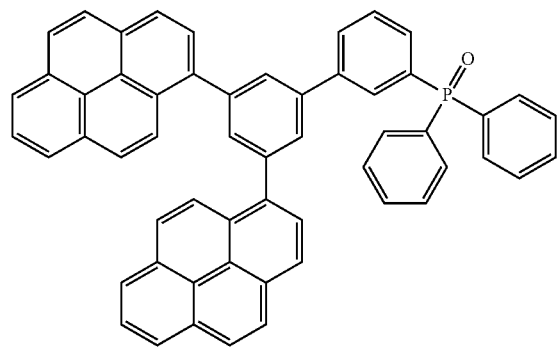
B2
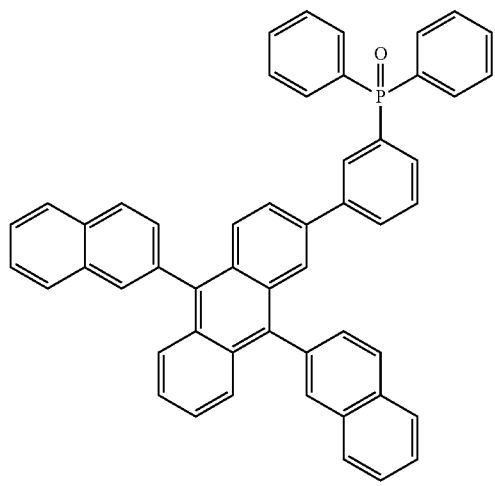
B3
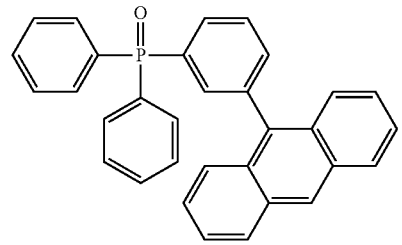
B4
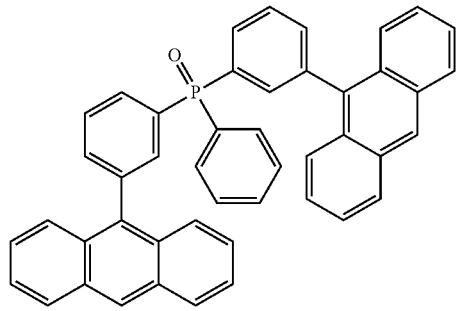
B5
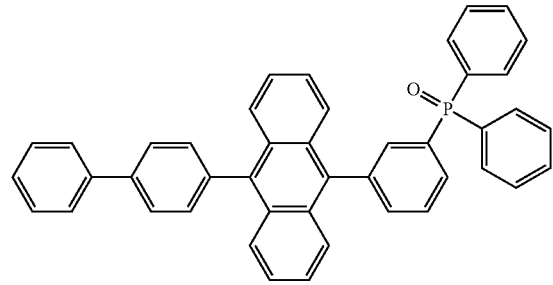
B6
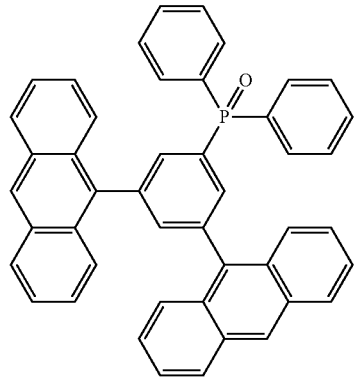
B5
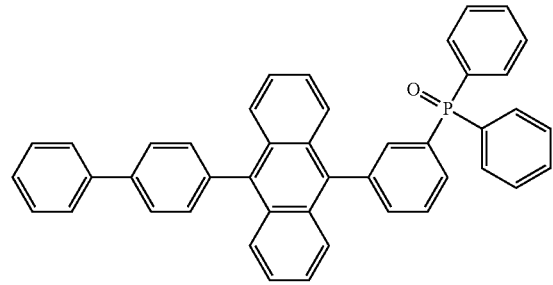
B6
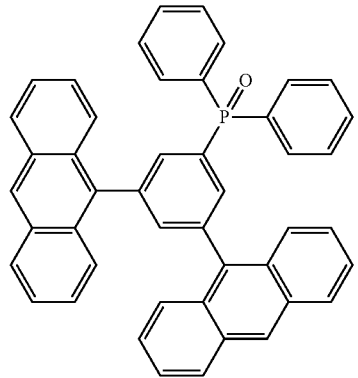

-continued
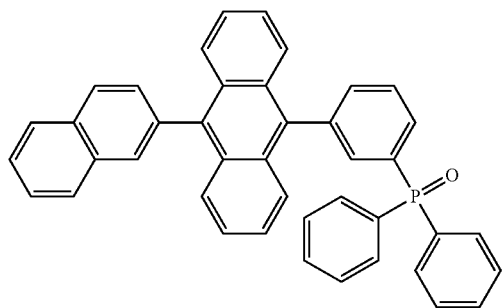
B7
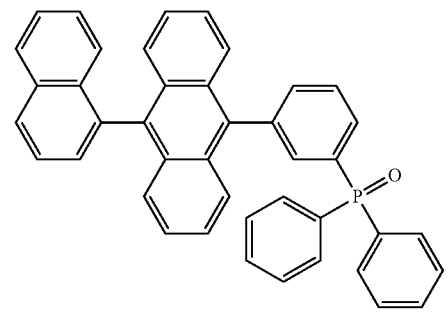
B8
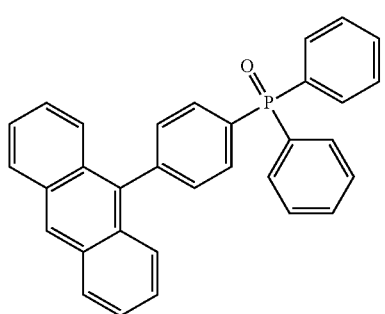
B9
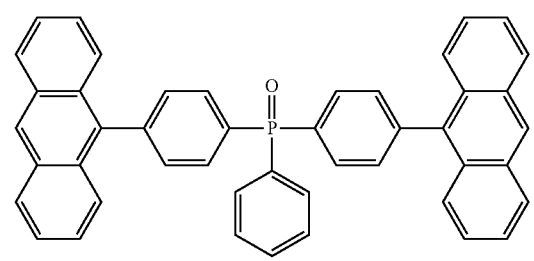
B10
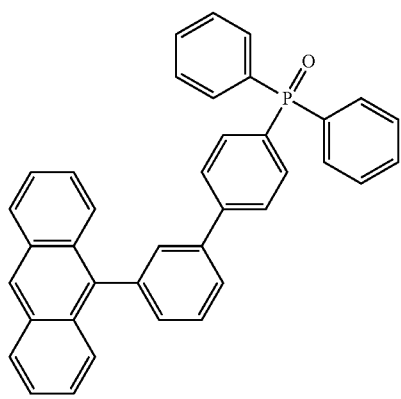
B12
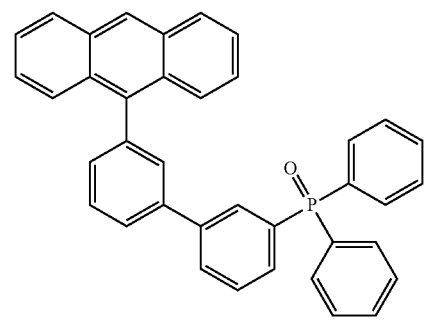
B16
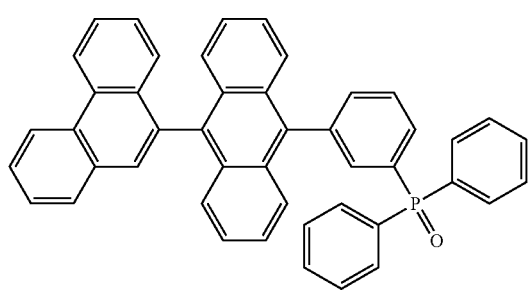
B17
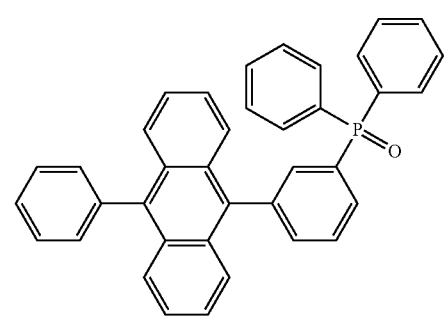
B18
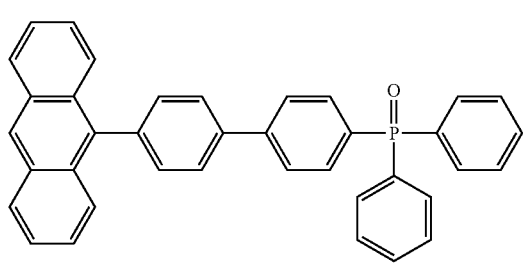
B19
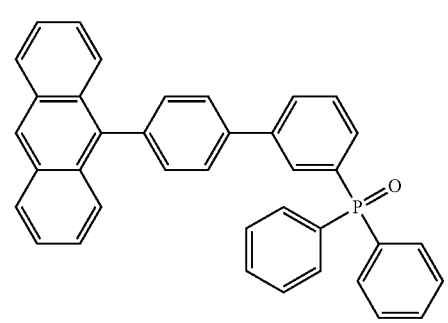
B20

-continued
B21
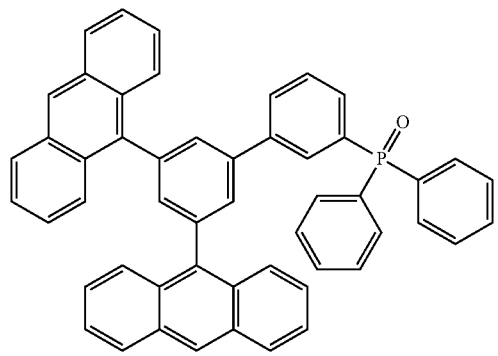
B22
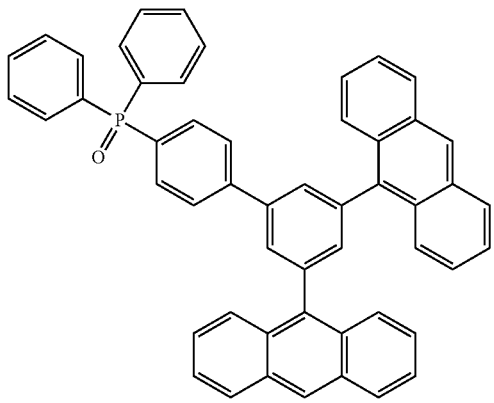
B23
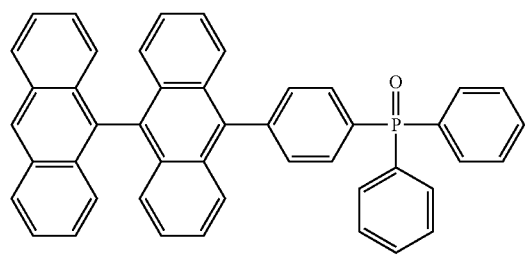
B24
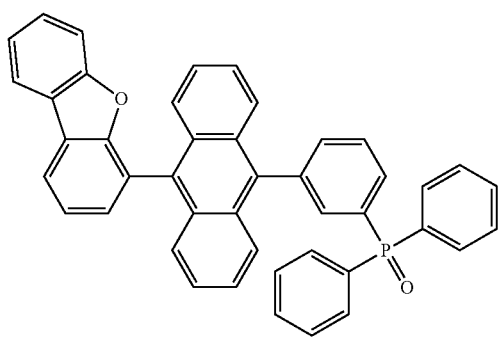
B25
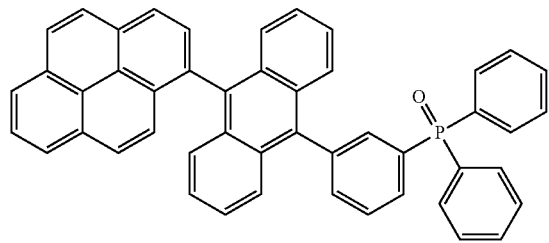
B26
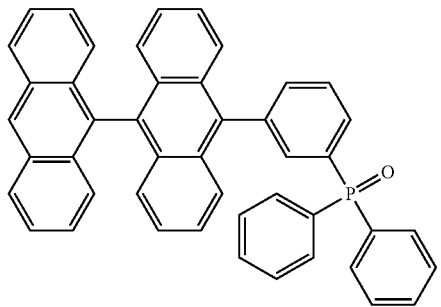
B27
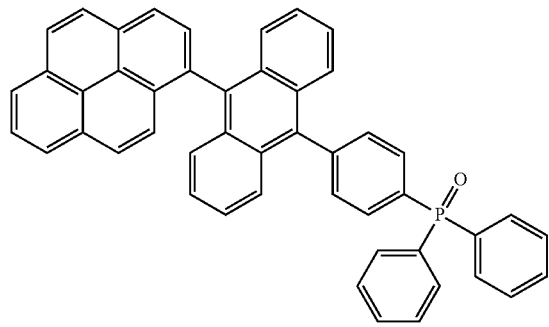
B28
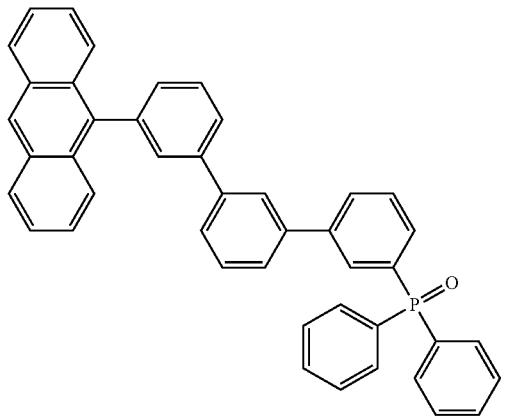

-continued
B29
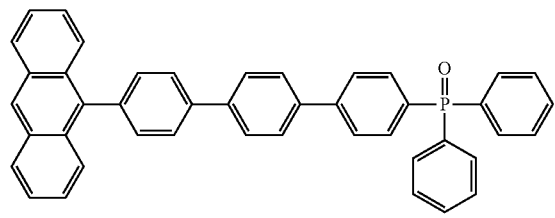
B30
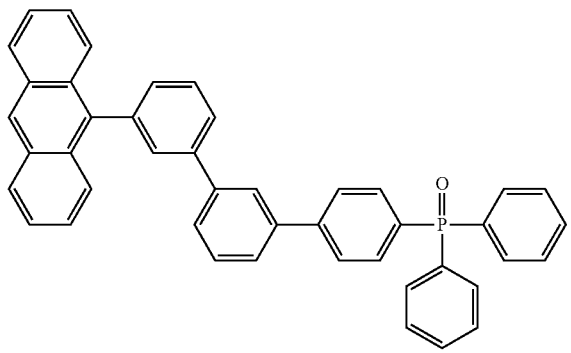
B31
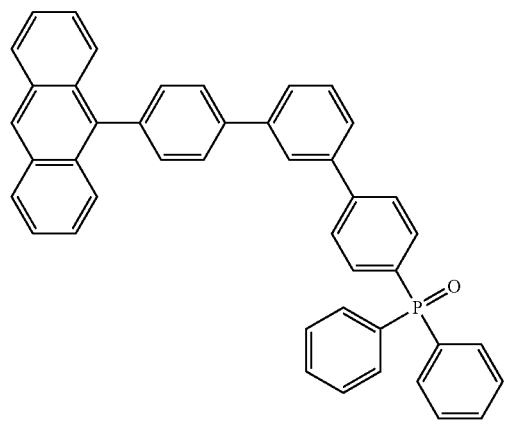
B32
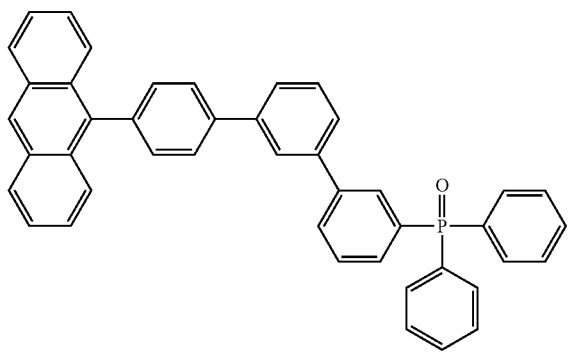
B33
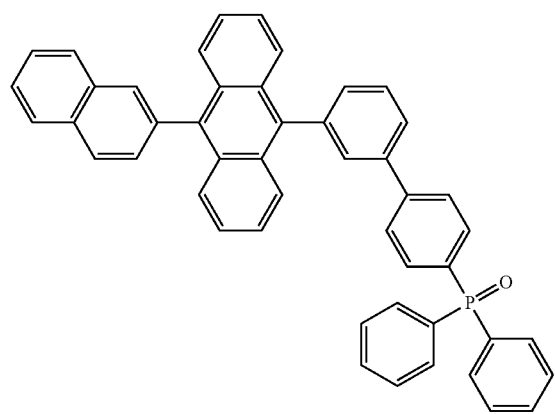
B34
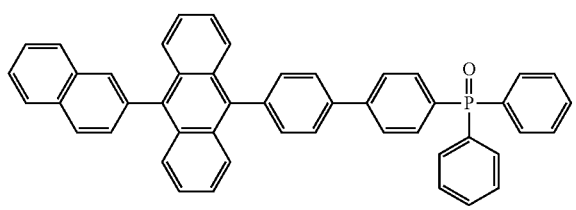
B35
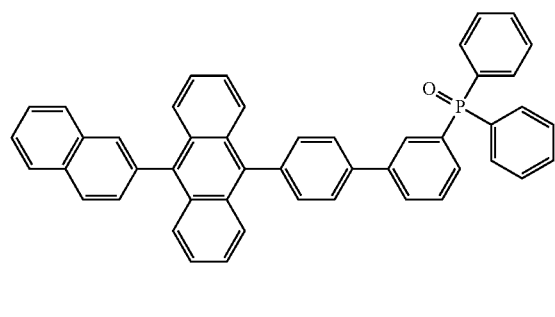
B36
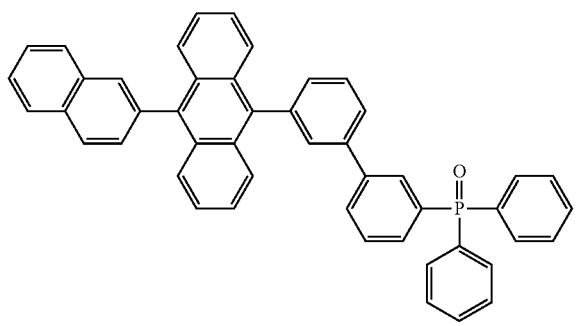

B37

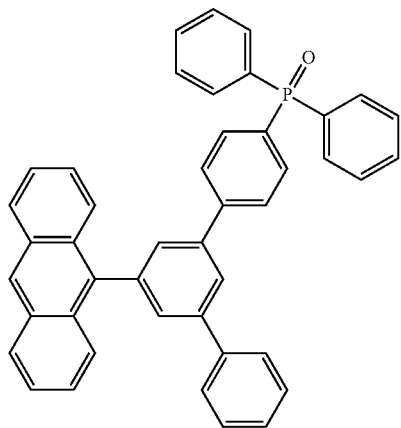

B38

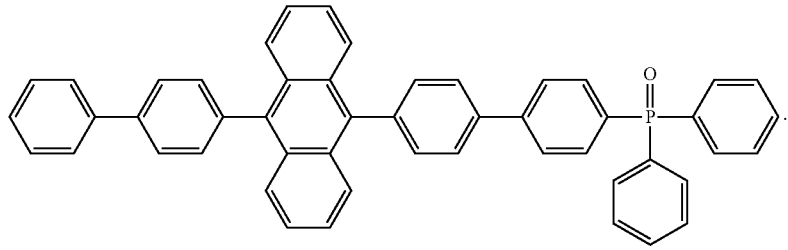

V. ADVANTAGEOUS EFFECT OF THE INVENTION

The favourable effects of the inventive electron-transporting materials are shown in devices comprising the same matrices doped with compound D2 as representative example of compounds of formula (II) instead of state-of-the-art lihium quinolate D1. Compound D2 is lithium tetrakis(pyrazolylborate) having the formula

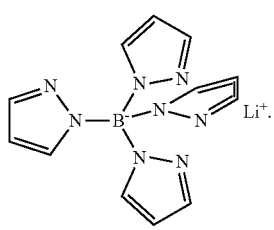 [SMILES: C1=C=NN([B-](n2cccn2)(n2cccn2)n2cccn2)C=1]

The devices comprising electron transporting matrices which lack phenylene spacer A between the phosphine oxide group and electron transport unit E allow another comparison. The following comparative compounds are referred to:

C1

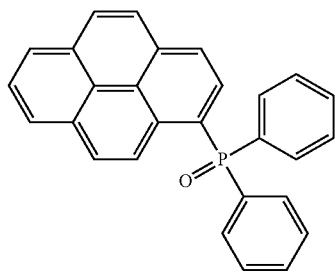

C2

-continued

C3

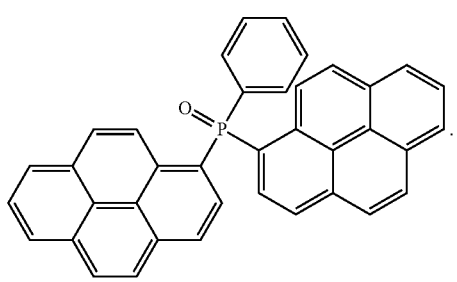

Table 1 shows the performance of inventive and comparative compounds in bottom emission structured OLEDs, described in detail in example 1, with respect to voltage (U) and quantum efficiency (Qeff). Additionally the quotient Qeff/U (power efficiency) is taken as basis for enabling proper comparison in order to consider tradeoff effects between both values. The LUMO energies are represented by reversible electrochemical redox potentials of the studied compounds, measured by CV in THF against $Fc^+/Fc$ reference redox system.

TABLE 1

| Code | LUMO (V) | D1 doped U (V) | Qeff (%) | Q/U | D2 doped U (V) | Qeff (%) | Q/U |
|---|---|---|---|---|---|---|---|
| A1  | −2.43 | 4.9 | 4.5 | 0.92 | 3.9 | 6.4 | 1.64 |
| A6  | −2.50 | 5.0 | 6.2 | 1.24 | 3.8 | 6.4 | 1.68 |
| A7  | −2.48 | 5.0 | 5.7 | 1.14 | 3.7 | 6.1 | 1.65 |
| A8  | −2.50 | 5.2 | 5.9 | 1.13 | 4.0 | 6.4 | 1.60 |
| A9  | −2.43 | 4.9 | 5.3 | 1.08 | 3.8 | 5.8 | 1.53 |
| A11 | −2.52 | 5.1 | 6.0 | 1.18 | 4.1 | 6.2 | 1.51 |
| A12 | −2.54 | 5.4 | 4.0 | 0.74 | 4.4 | 4.6 | 1.05 |
| A13 | −2.53 | 4.8 | 5.5 | 1.15 | 4.0 | 6.0 | 1.50 |
| A14 | −2.53 | 4.9 | 6.0 | 1.22 | 4.0 | 6.5 | 1.62 |
| B3  | −2.42 | 5.2 | 4.3 | 0.83 | 4.2 | 5.2 | 1.24 |
| B4  | −2.43 | 4.4 | 5.5 | 1.16 | 3.6 | 6.2 | 1.72 |
| B5  | −2.39 | 4.9 | 5.6 | 1.14 | 3.8 | 6.4 | 1.68 |
| B6  |       | 4.8 | 5.4 | 1.13 | 3.9 | 5.0 | 1.28 |
| B7  | −2.38 | 4.9 | 5.5 | 1.12 | 3.6 | 6.6 | 1.83 |
| B8  | −2.40 | 4.8 | 5.6 | 1.17 | 3.7 | 7.1 | 1.92 |
| B9  | −2.41 | 5.3 | 5.0 | 0.94 | 3.9 | 6.2 | 1.59 |
| B10 | −2.42 | 4.9 | 4.3 | 0.88 | 3.8 | 7.0 | 1.84 |
| B11 | −2.40 | 4.7 | 5.5 | 1.17 | 3.7 | 6.9 | 1.86 |
| B12 | −2.47 | 5.1 | 5.8 | 1.14 | 3.9 | 6.6 | 1.69 |
| B13 | −2.39 | 4.9 | 5.4 | 1.10 | 3.7 | 6.9 | 1.86 |
| B14 | −2.41 | 4.8 | 5.6 | 1.17 | 3.7 | 6.8 | 1.84 |
| B15 | −2.40 | 4.9 | 4.7 | 0.96 | 3.6 | 6.3 | 1.75 |
| B16 | −2.41 | 5.1 | 5.5 | 1.08 | 4.0 | 6.2 | 1.55 |
| B17 | −2.39 | 4.6 | 5.8 | 1.26 | 3.7 | 6.8 | 1.84 |
| B18 | −2.46 | 4.7 | 5.1 | 1.09 | 3.7 | 5.9 | 1.59 |
| B19 | −2.43 | 5.1 | 5.4 | 1.06 | 3.9 | 6.6 | 1.69 |
| B20 | −2.42 | 4.9 | 5.5 | 1.12 | 3.8 | 6.2 | 1.63 |
| B21 |       | 4.4 | 6.1 | 1.39 | 3.8 | 5.5 | 1.45 |
| B22 |       | 4.2 | 6.3 | 1.5  | 3.6 | 6.1 | 1.69 |
| B23 | −2.35 | 4.7 | 4.9 | 1.04 | 4.0 | 6.7 | 1.68 |
| B24 | −2.36 | 4.9 | 5.1 | 1.04 | 3.8 | 6.1 | 1.61 |
| B25 | −2.38 | 4.4 | 5.5 | 1.25 | 3.7 | 6.4 | 1.73 |
| C1  | −2.27 | 4.8 | 4.0 | 0.83 | 4.2* | 5.1* | 1.21* |
| C2  | −2.19 | 4.6 | 5.2 | 1.13 | 4.4 | 5.3 | 1.21 |
| C3  | −2.24 | 4.2 | 5.1 | 1.21 | 3.6 | 6.0 | 1.67 |

*with 20 wt. % D2

I. EXAMPLES

General Remarks for Synthesis:

All reactions were carried out under argon atmosphere using oven dried glassware. Starting materials were used as purchased without further purification. Materials, which were used to build OLEDs, were sublimed by gradient sublimation to achieve highest purity.

General Procedure A: Triphenylphosphinoxide Synthesis

The halogen compound was dissolved in THF. 2.5M n-BuLi solution in hexane was slowly dropped to this solution chilled to −80° C. (temperature measured directly in the solution). The stirring was continued for one hour. Diphenyl phosphine chloride or phenylphosphine dichloride, respectively, was added slowly at −80° C. The reaction mixture was allowed to warm to room temperature (RT) and stirred overnight. After methanol addition and reduction to dryness, the residue was dissolved in dichloromethane (DCM). The organic phase was washed with water, dried over $Na_2SO_4$ and reduced to dryness.

The residue was dissolved in DCM again and oxidized with 30 wt. % aqueous hydrogen peroxide solution. After stirring overnight, the organic solution was washed with water, dried over $Na_2SO_4$ and reduced to dryness. The crude product was purified by column chromatography.

General Procedure B: Suzuki Coupling

The halogen compound, the boronic acid, $Pd(P^tBu_3)_4$ and the solvent were mixed together. A degassed 2M aqueous $K_2CO_3$ solution was added. The mixture was stirred at 85° C. (oil bath temperature) for 18 h and cooled afterwards. In case that a solid precipitated, the solid was filtered off and purified by column chromatography directly. Otherwise, the organic phase was washed with water, dried over $Na_2SO_4$, reduced to dryness and purified by column chromatography afterwards.

Analytics:

Final materials were characterized by mass spectrometry (MS) and proton magnetic resonance ($^1$H-NMR). NMR samples were dissolved in $CD_2Cl_2$ unless otherwise stated. Melting points (mp) were determined by differential scanning calorimetry (DSC). Peak temperatures are reported. If gas chromatography-mass spectrometry (GC-MS) or high performance liquid chromatography (HPLC) with electrospray ionization mass spectroscopy (ESI-MS) were used for the product characterization, only the mass/charge (m/z) ratios for the molecular peak are reported. For brominated intermediates, the corresponding isotopic multiplet is reported.

(4-bromophenyl)diphenylphosphine oxide

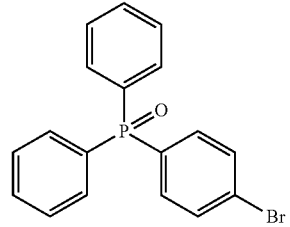 [SMILES: O=P(c1ccccc1)(c1ccccc1)c1ccc(Br)cc1]

According to general procedure A 1,4-dibromobenzene: 10.00 g (42.4 mmol, 1.0 eq)

n-butyllithium, 2.5M in hexane: 17 mL (42.4 mmol, 1.0 eq)

chlorodiphenylphosphine: 9.35 g (42.4 mmol, 1.0 eq)

THF: 50 mL

DCM: 50 mL $H_2O_2$, 30 wt. % in water: 10 mL

Column chromatography: $SiO_2$, ethyl acetate

Yield: 6.84 g white solid (45% theoretical)

mp: 166° C.

GC-MS: m/z=356, 358

71 bis(4-bromophenyl)(phenyl)phosphine oxide

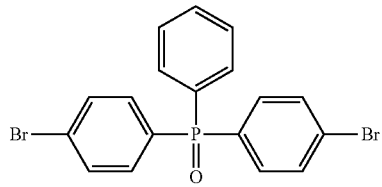 [SMILES: O=P(c1ccccc1)(c1ccc(Br)cc1)c1ccc(Br)cc1]

According to general procedure A 1,4-dibromobenzene: 10.00 g (42.4 mmol, 1.0 eq)
n-butyl lithium, 2.5M in hexane: 17 mL (42.4 mmol, 1.0 eq)
dichlorophenylphosphine: 3.79 g (21.2 mmol, 0.5 eq), dissolved in 50 mL THF
THF: 100 mL
DCM: 50 mL
$H_2O_2$, 30 wt. % in water: 10 mL
Column chromatography: $SiO_2$, ethyl acetate
Yield: 5.0 g viscous oil (54%)
mp: 125° C.
GC-MS: m/z=433, 435, 437

(3-bromophenyl)diphenylphosphine oxide

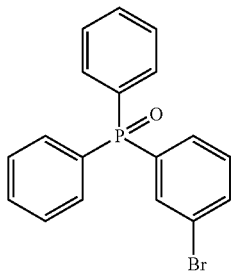 [SMILES: O=P(c1ccccc1)(c1ccccc1)c1cccc(Br)c1]

According to general procedure A 1,3-dibromobenzene: 10.00 g (42.4 mmol, 1.0 eq)
n-butyl lithium, 2.5M in hexane: 17 mL (42.4 mmol, 1.0 eq)
chlorodiphenylphosphine: 9.35 g (42.4 mmol, 1.0 eq)
THF: 50 mL
DCM: 50 mL
$H_2O_2$, 30 wt. % in water: 10 mL
Column chromatography: $SiO_2$, ethyl acetate, $R_f$=0.52
Yield: 9.6 g white solid (63%)
mp: 95° C.
GC-MS: m/z=356, 358

72 bis(3-bromophenyl)(phenyl)phosphine oxide

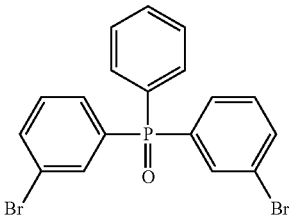 [SMILES: O=P(c1ccccc1)(c1cccc(Br)c1)c1cccc(Br)c1]

According to general procedure A 1,3-dibromobenzene: 10.00 g (42.4 mmol, 1.0 eq)
n-butyllithium, 2.5M in hexane: 17 mL (42.4 mmol, 1.0 eq)
dichlorophenylphosphine: 3.58 g (21.2 mmol, 0.5 eq), dissolved in 50 mL THF
THF: 100 mL
DCM: 50 mL
$H_2O_2$, 30 wt. % in water: 10 mL
Column chromatography: $SiO_2$, ethyl acetate
Yield: 6.86 g (74%) white solid
mp: 103° C.
GC-MS: m/z=434, 436, 438 diphenyl(4-(pyren-1-yl)phenyl)phosphine oxide (A1)

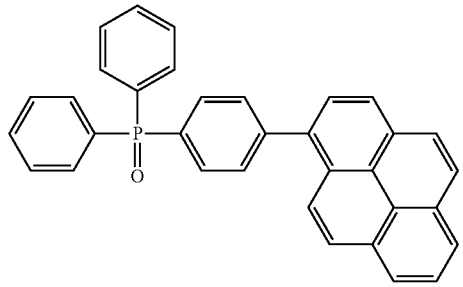

According to general procedure B (4-bromophenyl)diphenylphosphine oxide: 4.8 g (13.4 mmol, 1.0 eq)
1-pyreneboronic acid: 3.97 g (16.1 mmol, 1.2 eq)
$Pd(PPh_3)_4$: 466 mg (0.40 mmol, 3 mol. %)
$K_2CO_3$, 2M: 20 mL
1,2-dimethoxyethane (DME): 60 mL
Column chromatography: $SiO_2$, ethyl acetate
Yield: 4.45 g (69%) pale yellow solid
mp: 208° C.
EI-MS: m/z=478

73 diphenyl(3-(pyren-1-yl)phenyl)phosphine oxide (A2)

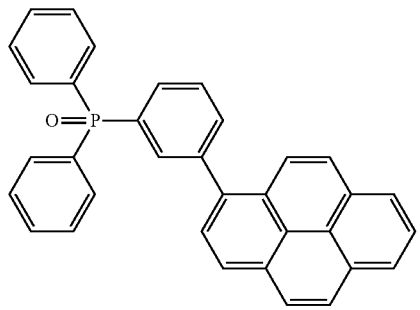 [SMILES: O=P(c1ccccc1)(c1ccccc1)c1cccc(-c2ccc3ccc4cccc5ccc2c3c45)c1]

According to general procedure B
(3-bromophenyl)diphenylphosphine oxide: 8.27 g (23.2 mmol, 1.0 eq)
1-pyreneboronic acid: 6.84 g (27.8 mmol, 1.2 eq)
Pd(PPh$_3$)$_4$: 803 mg (0.67 mmol, 3 mol. %)
K$_2$CO$_3$, 2M: 35 mL
DME: 100 mL
Column chromatography: SiO$_2$, ethyl acetate
Yield: 7.5 g yellow solid (68%)
mp: 198° C.
EI-MS: m/z=478 phenylbis(4-(pyren-1-yl)phenyl)phosphine oxide (A3)

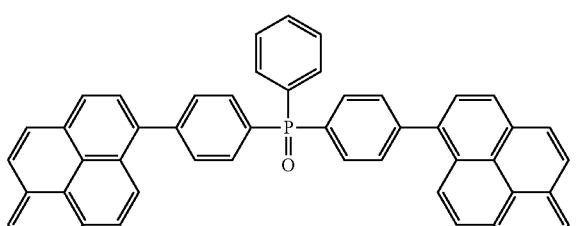

According to general procedure B
bis(4-bromophenyl)(phenyl)phosphine oxide: 2.5 g (5.7 mmol, 1.0 eq)
1-pyreneboronic acid: 3.1 g (12.6 mmol, 2.2 eq)
Pd(PPh$_3$)$_4$: 265 mg (0.23 mmol, 4 mol. %)
K$_2$CO$_3$, 2M: 12 mL
DME: 30 mL
Column chromatography: SiO$_2$, ethyl acetate
Yield: 3.2 g yellow solid (82%)
mp: n.a. (glassy)
EI-MS: m/z=678

74 phenylbis(3-(pyren-1-yl)phenyl)phosphine oxide (A4)

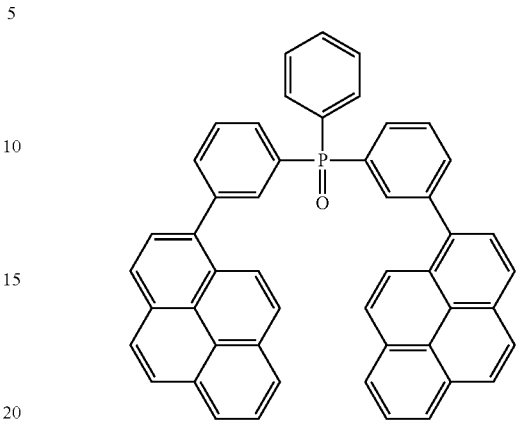

According to general procedure B
bis(3-bromophenyl)(phenyl)phosphine oxide: 3.0 g (6.9 mmol, 1.0 eq)
1-pyreneboronic acid: 3.7 g (15.1 mmol, 2.2 eq)
Pd(PPh$_3$)$_4$: 318 mg (0.28 mmol, 4 mol. %)
K$_2$CO$_3$, 2M: 14 mL
DME: 35 mL
Column chromatography: SiO$_2$, ethyl acetate
Yield: 4.2 g yellow solid (90%)
mp: n.a. (glassy)
EI-MS: m/z=678 diphenyl(4'-(pyren-1-yl)-[1,1'-biphenyl]-3-yl)phosphine oxide (A6)

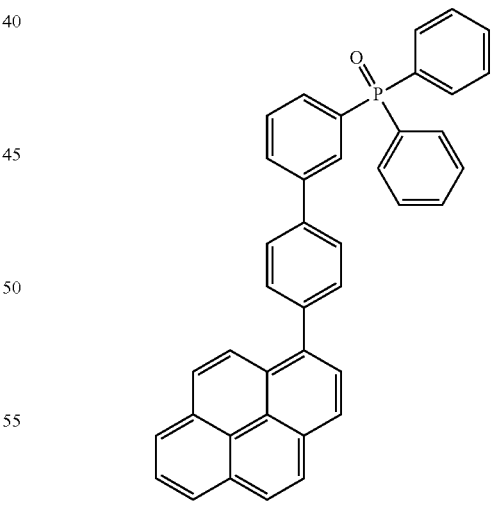

1$^{st}$ step: 1-(4-bromophenyl)pyrene 1-bromo-4-iodobenzene (21.9 g, 77.41 mmol, 1.0 eq), pyren-1-ylboronic acid (20.0 g, 81.3 mmol, 1.05 eq), tetrakis(triphenylphosphine)palladium(0) (1.79 g, 1.55 mmol, 2.0 mol. %) were dissolved in degassed DME (300 mL). A degassed solution of potassium carbonate (22.1 g, 232.2 mmol, 3.0 eq) in water (120 mL) was added, and the mixture was stirred at 95° C. for 17 h, after which the mixture was filtered hot. The mother liquors were left to recrystallize, and the solid was filtered off. It was then dissolved in chloroform and extracted with water. The organic layer was decanted, dried over magnesium sulfate, and evaporated to dryness.

HPLC purity: 97.75%

$2^{nd}$ step: Synthesis of (4-(pyren-1-yl)phenyl)boronic acid 1-(4-bromophenyl)pyrene (5.0 g, 14.0 mmol, 1.0 eq) was dissolved under argon atmosphere in dry THF (180 mL) and cooled to −80° C. n-Butyllithium (2.5 M in hexane, 7.1 mL, 18.2 mmol, 1.3 eq) was added dropwise and the mixture was stirred for 2 h at −80° C. Then trimethylborate (4.7 mL, 4.4 g, 42 mmol, 3.0 eq) was added drop wise, and the resulting mixture was allowed to warm to RT (without removing the cooling bath). Then it was quenched by addition of 20% hydrochloric acid (22 mL). After 30 min of stirring, the mixture was extracted with DCM and water. The organic layer was decanted, dried over magnesium sulfate, and evaporated to dryness.

HPLC purity: 96.54%

$3^{rd}$ step: diphenyl(4'-(pyren-1-yl)-[1,1'-biphenyl]-3-yl)phosphine oxide

Under argon atmosphere, (4-(pyren-1-yl)phenyl)boronic acid (4.0 g, 12.3 mmol, 1.1 eq), (3-bromophenyl)diphenylphosphine oxide (4.0 g, 11.2 mmol, 1.0 eq) and tetrakis(triphenylphosphine)palladium(0) (10 mg, 0.11 mmol, 1.0 mol. %) were dissolved in degassed DME (44 mL). A degassed solution of potassium carbonate (2.3 g, 16.8 mmol, 1.5 eq) in water (17 mL) was added, and the reaction stirred at 95° C. for 40 h. After cooling to RT, the reaction mixture was filtered over celite and evaporated to dryness. The crude product was dissolved in DCM and extracted with water, followed by brine. The organic layer was decanted, dried over magnesium sulfate, and evaporated to dryness. The residue was stirred in MTBE, filtered off, then stirred in MeOH, and again in MTBE. After drying in vacuum at 40° C., the product was sublimed under reduced pressure.

HPLC purity: 99.80%

$^1$H NMR (CDCl$_3$, 25° C.): δ=8.22 (m, 4H); 8.10 (m, 3H); 8.03 (m, 1H); 7.77 (m, 6H); 7.69 (m, 3H); 7.61 (m, 3H); 7.53 (m, 4H) ppm.

$^{13}$C NMR (CDCl$_3$, 25° C.): δ=141.68 (J=11.9 Hz); 141.31; 139.46; 137.61; 134.84; 134.02; 133.98; 133.16; 132.62; 132.54; 132.52; 132.06; 131.69; 131.53; 131.45; 131.28; 131.08; 131.05 (J=12.8 Hz); 129.65 (J=12.7 Hz); 129.15 (J=12.0 Hz); 129.00; 128.13; 127.99 (J=11.8 Hz); 127.72; 126.69; 125.77; 125.62; 125.48; 125.41 (J=12.4 Hz); 125.3 ppm $^{31}$P (CDCl$_3$, 25° C.): δ=27.45 ppm.

diphenyl(4'-(pyren-1-yl)-[1,1'-biphenyl]-4-yl)phosphine oxide (A7)

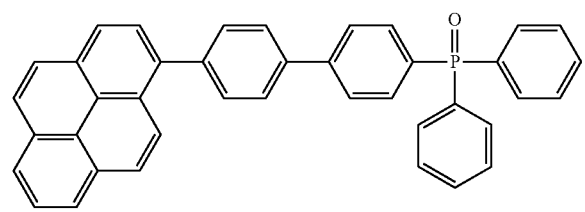 [SMILES: O=P(c1ccccc1)(c1ccccc1)c1ccc(-c2ccc(-c3ccc4ccc5cccc6ccc3c4c56)cc2)cc1]

$1^{st}$ and $2^{nd}$ Step: See A6

$3^{rd}$ step: diphenyl(4'-(pyren-1-yl)-[1,1'-biphenyl]-4-yl)phosphine oxide

Under argon atmosphere, (4-(pyren-1-yl)phenyl) boronic acid (3.5 g, 10.9 mmol, 1.0 eq), (4-bromophenyl)diphenyl phosphine oxide (4.26 g, 12.0 mmol, 1.1 eq) and tetrakis(triphenylphosphine) palladium(0) (25 mg, 0.022 mmol, 0.2 mol. %) were dissolved in a degassed mixture of toluene (12 mL) and ethanol (12 mL). A degassed solution of potassium carbonate (3.0 g, 21.7 mmol, 2.0 eq) in water (11 mL) was added and the reaction stirred at 95° C. for 18.5 h. The precipitate was filtered off hot and washed with a mixture of toluene/ethanol (1:1, 5 mL). The product was dried in vacuum at 40° C., and finally sublimed under reduced pressure.

HPLC purity: 100%

$^1$H NMR (CDCl$_3$, 25° C.): δ=8.27 (d, J=7.8 Hz, 1H); 8.24 (m, 2); 8.20 (d, J=7.2 Hz, 1H); 8.13 (s, 2H); 8.05 (m, 3H); 7.79 (m, 12H) 7.61 (ddd, J=1.4, 4.2, 5.1 Hz, 2H); 7.53 (m, 4H) ppm.

$^{13}$C NMR (CDCl$_3$, 25° C.): δ=144.81 (J=2.7 Hz); 141.7; 139.31; 137.6, 133.86; 133.18 (J=10.1 Hz); 133.03; 132.61; 132.56 (J=3.1 Hz); 132.53; 132.08; 131.78; 131.75; 131.55; 131.33; 129.16 (J=12.2 Hz); 129.03; 128.16; 128.09; 127.96; 127.82; 127.73 (J=12.5 Hz); 126.72; 125.81; 125.63; 125.49; 125.37; 125.31 ppm $^{31}$P (CDCl$_3$, 25° C.): δ=27.85 ppm.

diphenyl(3'-(pyren-1-yl)-[1,1'-biphenyl]-3-yl)phosphine oxide (A8)

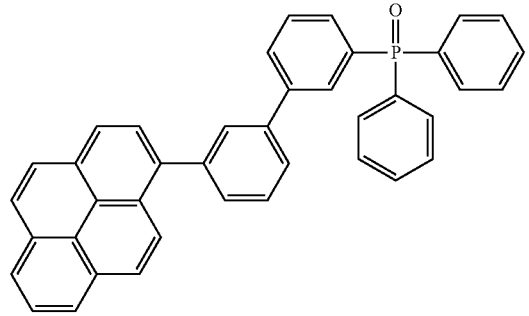 [SMILES: O=P(c1ccccc1)(c1ccccc1)c1cccc(-c2cccc(-c3ccc4ccc5cccc6ccc3c4c56)c2)c1]

$1^{st}$ and $2^{nd}$ Step: See A9

$3^{rd}$ step: diphenyl(3'-(pyren-1-yl)-[1,1'-biphenyl]-3-yl)phosphine oxide

Under argon atmosphere, 4,4,5,5-tetramethyl-2-(3-(pyren-1-yl)phenyl)-1,3,2-dioxaborolane (5.0 g, 12.4 mmol, 1.0 eq), (3-bromophenyl)diphenyl phosphine oxide (4.9 g, 13.6 mmol, 1.1 eq) and tetrakis(triphenylphosphine) palladium(0) (286 mg, 0.248 mmol, 2.0 mol. %) were dissolved in a degassed mixture of toluene (20 mL) and ethanol (20 mL). A degassed 2 M solution of potassium carbonate (2.25 g, 16.3 mmol, 2.0 eq) in water (12.4 mL) was then added, and the reaction stirred at 95° C. for 13 h. After cooling to RT, the mixture was diluted with toluene (25 mL) and filtrated over silica (1 cm). The filtrate was extracted with water (3×50 mL) and the organic layer was decanted, dried over magnesium sulfate, and evaporated to dryness. The crude product was purified by silica chromatography using DCM and MeOH (99:1 v/v) as solvent. The foamy product was triturated in hexane (60 mL) to induce precipitation. After filtration, it was dried in vacuum at 40° C., and finally sublimed under reduced pressure.

HPLC purity: 99.98%

$^1$H NMR (CDCl$_3$, 25° C.): δ=8.54 (s, 1H); 8.22 (m, 4H); 8.11 (m, 3H); 8.03 (m, 3H); 7.90 (ddd, J=1.3, 3.0, 7.7 Hz, 1H); 7.86 (m, 1H); 7.73 (m, 5H); 7.64 (m, 3H); 7.57 (m, 3H); 7.49 (m, 4H) ppm.

$^{13}$C NMR (CDCl$_3$, 25° C.): δ=142.40; 142.00; 141.90; 140.80; 137.87; 134.82; 134.01; 133.93; 133.11; 132.49; 132.47; 132.04; 131.28; 131.27; 131.24; 131.22; 131.14; 130.64; 129.93; 129.54; 129.16; 129.06; 128.19; 128.16; 128.04; 127.94; 126.68; 125.77; 125.59; 125.45; 125.34; 125.25 ppm $^{31}$P (CDCl$_3$, 25° C.): δ=27.40 ppm.

diphenyl(3'-(pyren-1-yl)-[1,1'-biphenyl]-4-yl)phosphine oxide (A9)

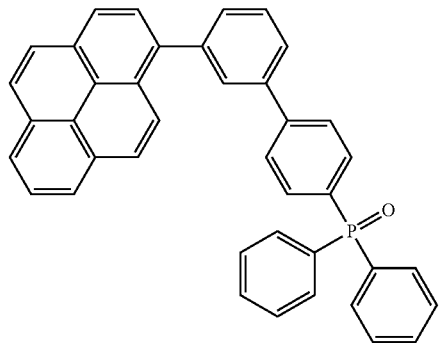 [SMILES: O=P(c1ccccc1)(c1ccccc1)c1ccc(-c2cccc(-c3ccc4ccc5cccc6ccc3c4c56)c2)cc1]

1$^{st}$ step: 1-(3-bromophenyl)pyrene 1-bromo-3-iodobenzene (126.3 g, 447 mmol, 1.1 eq), pyren-1-yl-boronic acid (100 g, 406 mmol, 1.0 eq), tetrakis (triphenylphosphine) palladium(0) (0.938 g, 0.81 mmol, 0.2 mol. %) were dissolved in a degassed mixture of toluene (300 mL) and ethanol (300 mL). A degassed solution of potassium carbonate (112.0 g, 810 mmol, 2.0 eq) in water (406 mL) was added, and the mixture stirred at 120° C. for 21 h. After cooling to RT, the mixture was diluted with toluene (1.1 L) and water (1.2 L). The organic layer was decanted, and extracted with water (5×300 mL) until the pH of the aqueous phase was neutral. The organic layer was then evaporated to dryness. The residue was dissolved in toluene (100 mL) and precipitated with ethanol (500 mL). After stirring 1 h at ca. 0° C. (ice bath), the solid was filtered and washed with ethanol (300 mL) and dried overnight in vacuum at 40° C. The crude product was then dissolved in hot cyclohexane (900 mL), refluxed for 1 h, and filtrated hot over a layer of Florisil. The filtrated was stirred for 1 h in an ice bath, and the crystallized product filtered off and washed with cyclohexane. After drying overnight in vacuum at 40° C., it was sublimed under reduced pressure.

HPLC purity: 97.83%

2$^{nd}$ step: 4,4,5,5-tetramethyl-2-(3-(pyren-1-yl)phenyl)-1,3,2-dioxaborolane 1-(3-bromophenyl)pyrene (40.0 g, 112 mmol, 1.0 eq. was dissolved under argon atmosphere in THF (400 mL) and cooled to −80° C. n-butyl lithium (2.5 M in hexane, 58.2 mL, 145 mmol, 1.3 eq) was added dropwise and the mixture was stirred for 30 min at −80° C. Then, 2-isopropoxy-4,4,5,5-tetramethyl-1,3,2-dioxaborolane (34.3 mL, 31.26 g, 168 mmol, 1.5 eq) was added drop wise, and the mixture was allowed to warm to RT overnight (without removing the cooling bath). The reaction was quenched by addition of methanol (5 mL) and water (5 mL). After stirring for 10 min, the solvents were removed under reduced pressure. The crude product was dissolved in DCM (200 mL) and extracted with water (2×100 mL). The precipitate formed was filtered off and discarded. The aqueous layer was extracted again with DCM (100 mL), and the combined organic layers were dried over magnesium sulphate, filtered and evaporated to near dryness. The residue was treated with hexane (150 mL) to induce precipitation. The solid was filtered off, while a second crop of material was isolated from the reduced mother liquor (⅔ of the initial volume) by precipitating from toluene (15 mL) and hexane (50 mL). The mother liquors were evaporated to dryness, and a third fraction was obtained by precipitating from chloroform (10 mL) and hexane (80 mL). All fractions were combined, triturated in hexane, and filtered off. Then following solubilisation in refluxing isopropanol (750 mL), the volume was reduced by half, the solid was filtered off and directly recrystallized in hexane (300 mL). The product was filtered off, washed with hexane and dried in vacuum at 40° C.

HPLC purity: 99.54%

3$^{rd}$ step: diphenyl(3'-(pyren-1-yl)-[1,1'-biphenyl]-4-yl)phosphine oxide

Under argon atmosphere, 4,4,5,5-tetramethyl-2-(3-(pyren-1-yl)phenyl)-1,3,2-dioxaborolane (5.0 g, 12.4 mmol, 1.0 eq), (4-bromophenyl)diphenyl phosphine oxide (4.87 g, 13.6 mmol, 1.1 eq) and tetrakis(triphenylphosphine) palladium(0) (286 mg, 0.25 mmol, 2.0 mol. %) were dissolved in a degassed mixture of toluene (20 mL) and ethanol (20 mL). A degassed 2M solution of potassium carbonate (3.42 g, 24.8 mmol, 2.0 eq) in water (12.4 mL) was added, and the reaction stirred at 95° C. for 22 h. After cooling to RT, the precipitate was filtrated off and discarded. The filtrate was partitioned between toluene and water; the organic layer was decanted, dried over magnesium sulfate, and evaporated to dryness. The crude product was purified by column chromatography using DCM/methanol (99:1 v/v) as eluent. The product was then triturated in hexane (60 mL), filtered off, dried in vacuum at 40° C., and finally sublimed under reduced pressure.

HPLC purity: 99.68%

$^1$H NMR (CDCl$_3$, 25° C.): δ=8.22 (m, 3H); 8.17 (d, J=7.1 Hz, 1H); 8.11 (s, 2H); 8.03 (m, 3H); 7.91 (dd, J=1.1, 2.1 Hz, 1H); 7.77 (m, 9H); 7.67 (m, 2H); 7.58 (m, 2H); 7.50 (m, 4H) ppm.

$^{13}$C NMR (CDCl$_3$, 25° C.): δ=144.95; 144.92; 142.46; 140.62; 137.84; 134.03; 133.17; 133.08; 132.87; 132.56; 132.48; 132.46; 132.44; 132.04; 131.50; 131.31; 130.95; 130.00;

129.63; 129.15; 129.05; 128.18; 128.06; 127.93; 127.89; 127.79; 126.72; 126.70; 125.79; 125.57; 125.48; 125.46; 125.33; 125.28 ppm $^{31}$P (CDCl$_3$, 25° C.): δ=27.28 ppm.

diphenyl(3-(10-(3-(pyren-1-yl)phenyl)anthracen-9-yl)phenyl)phosphine oxide (A10)

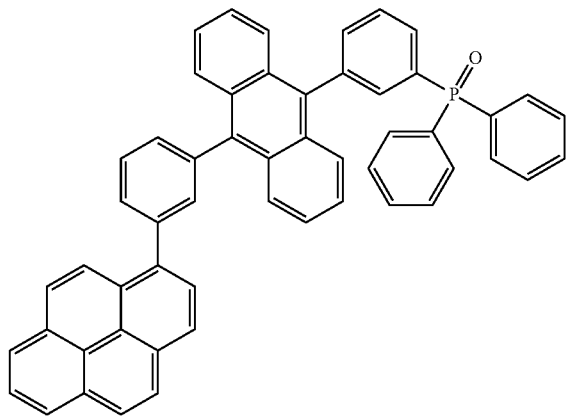 [SMILES: O=P(c1ccccc1)(c1ccccc1)c1cccc(-c2c3ccccc3c(-c3cccc(-c4ccc5ccc6cccc7ccc4c5c67)c3)c3ccccc23)c1]

1st and 2nd Step: See B17

3rd step: 1-(3-bromophenyl)pyrene 1-bromo-3-iodobenzene (126.3 g, 447 mmol, 1.1 eq), pyren-1-ylboronic acid (100 g, 406 mmol, 1.0 eq), tetrakis (triphenylphosphine) palladium(0) (0.938 g, 0.81 mmol, 0.2 mol. %) were dissolved in a degassed mixture of toluene (300 mL) and ethanol (300 mL). A degassed solution of potassium carbonate (112.0 g, 810 mmol, 2.0 eq) in water (406 mL) was added, and the mixture stirred at 120° C. for 21 h. After cooling to RT, the mixture was diluted with toluene (1.1 L) and water (1.2 L). The organic layer was decanted, extracted with water (5×300 mL) until the aqueous phase was neutral, and evaporated to dryness. The residue was then dissolved in toluene (100 mL) and precipitated by addition of ethanol (500 mL). After stiffing 1 h at ca. 0° C. (ice bath), the solid was filtered off, washed with ethanol (300 mL) and dried in vacuum at 40° C. Thereafter, it was dissolved in hot cyclohexane (900 mL), refluxed for 1 h, and filtered hot over a layer of Florisil. Upon stirring of the filtrate in an ice bath, the product crystallized out. It was filtered off, washed with cyclohexane and dried overnight in vacuum at 40° C.

HPLC purity: 97.83%

4th step: 4,4,5,5-tetramethyl-2-(3-(pyren-1-yl)phenyl)-1,3,2-dioxaborolane 1-(3-bromophenyl)pyrene (40.0 g, 112 mmol, 1.0 eq) was dissolved under argon atmosphere in THF (400 mL) and cooled to –80° C. n-butyl lithium (2.5 M in hexane, 58.2 mL, 145 mmol, 1.3 eq) was added drop wise and the mixture was stirred for 30 min at –80° C. Then, 2-isopropoxy-4,4,5,5-tetramethyl-1,3,2-dioxaborolane (34.3 mL, 31.26 g, 168 mmol, 1.5 eq) was added drop wise, and the mixture was allowed to warm to RT overnight (without removing the cooling bath). The reaction was quenched by addition methanol (5 mL) and water (5 mL); after 10 min of stiffing, the solvent was removed under reduced pressure. The crude product was dissolved in DCM (200 mL) and extracted with water (2×100 mL). The precipitate formed was filtered off and discarded. The organic layer was decanted, while the aqueous was further extracted with DCM (100 mL). After decantation, the organic layers were combined, dried over magnesium sulfate, and evaporated nearly to dryness. The residue was treated with hexane (150 mL) to induce precipitation. The solid was filtered off, and a crop of material was isolated by first reducing the mother liquor to ⅔, followed by addition of toluene (15 mL) and hexane (50 mL). Both fractions were combined, triturated in hexane, and filtered. Then it was re-dissolved in refluxing isopropanol (750 mL); the volume was reduced by half, and hexane (300 mL) was added. Upon stirring, the product crystallizes; it was filtered off, washed with hexane, and dried in vacuum at 40° C.

HPLC purity: 99.54%

5th step: diphenyl(3-(10-(3-(pyren-1-yl)phenyl)anthracen-9-yl)phenyl)phosphine oxide (3-(10-bromoanthracen-9-yl)phenyl)diphenylphosphine oxide (5.3 g, 10 mmol, 1.0 eq), 4,4,5,5-tetramethyl-2-(3-(pyren-1-yl)phenyl)-1,3,2-dioxaborolane (4.02 g, 10 mmol, 1.0 eq), and the tetrakis(triphenylphosphine) palladium(0) (230 mg, 0.2 mmol, 2.0 mol. %) were dissolved in degassed DME (40 mL), and a degassed solution of potassium phosphate (2.76 g, 20 mmol, 2.0 eq.) in water (10 mL) was added. The mixture was heated for 28 h at 95° C. The precipitate was filtered hot, washed with hot glyme (2×10 mL) and dried in vacuum at 40° C.

HPLC: 98.40%

$^1$H NMR (CDCl$_3$, 25° C.): δ=8.42 (dd, J=5.6, 9.2 Hz, 1H); 8.24 (dd, J=1.8, 7.9 Hz, 1H); 8.16 (m, 3H); 8.10 (s, 2H); 8.07 (dd, J=4.0, 9.3 Hz, 1H); 8.01 (t, J=7.8 Hz, 1H); 7.95 (m, 3H); 7.77 (m, 12H); 7.59 (m, 2H); 7.51 (m, 3H); 7.46 (m, 4H); 7.40 (m, 2H) ppm.

$^{13}$C NMR (CDCl$_3$, 25° C.): δ=141.95; 141.92; 140.00; 139.98; 139.90; 139.88; 139.56; 138.05; 137.92; 137.89; 136.37; 135.53; 135.52; 135.19; 134.67; 134.65; 133.96; 133.93; 133.86; 133.84; 133.15; 133.10; 132.55; 132.44; 131.86; 131.52; 131.27; 130.81; 130.54; 130.49; 130.45; 129.45; 129.35; 129.14; 129.05; 128.38; 128.15; 128.01; 127.94; 127.64; 127.07; 126.65; 126.02; 125.87; 125.75; 125.69; 125.68; 125.52; 125.44; 125.37; 125.30 ppm $^{31}$P (CDCl$_3$, 25° C.): δ=27.17 (d, 7.9 Hz) ppm.

(4-(9,10-di(naphthalen-2-yl)anthracen-2-yl)phenyl)diphenylphosphine oxide (B1)

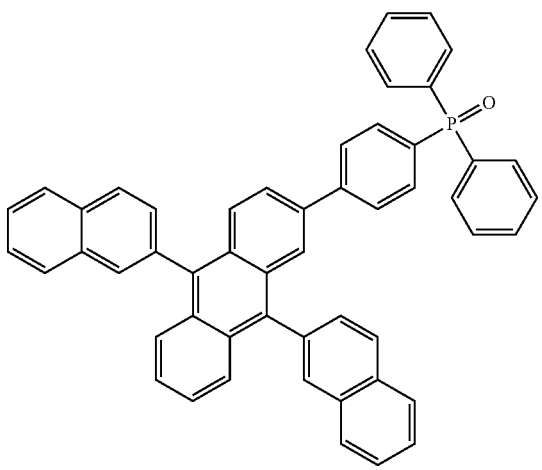 [SMILES: O=P(c1ccccc1)(c1ccccc1)c1ccc(-c2ccc3c(-c4ccc5ccccc5c4)c4ccccc4c(-c4ccc5ccccc5c4)c3c2)cc1]

According to general procedure B Known from WO2012/173370 (LG, paragraph 131) (4-bromophenyl)diphenylphosphine oxide: 1.88 g (5.3 mmol, 1.0 eq) (9,10-di(naphthalen-2-yl)anthracen-2-yl)boronic acid: 3.0 g (6.3 mmol, 1.2 eq)

Pd(PPh$_3$)$_4$: 183 mg (0.16 mmol, 3 mol. %)
K$_2$CO$_3$, 2M: 8 mL
DME: 20 mL
Column chromatography: SiO$_2$, ethyl acetate
Yield: 3.0 g (81%) yellow solid
mp: n.a. (glassy)
EI-MS: m/z=706
$^1$H NMR (CD$_2$Cl$_2$, 25° C.): δ=7.32 (m, 2H); 7.44 (m, 4H); 7.53 (m, 2H); 7.63 (m, 15H); 7.75 (m, 2H); 7.85 (d, J=1.8 Hz, 1H); 7.94 (m, 2H); 8.04 (m, 5H); 8.11 (d, J=1.8 Hz, 2H) ppm.
$^{13}$C NMR (CDCl$_3$, 25° C.): δ=144.83; 144.80; 138.33; 137.70; 136.86; 136.80; 136.77; 134.05; 134.04; 133.89; 133.47; 133.44; 133.06; 133.02; 132.94; 132.60; 132.48; 132.40;
132.37; 131.77; 131.21; 131.04; 130.79; 130.62; 130.03; 130.01; 129.98; 129.08; 128.98; 128.66; 128.60; 128.44; 128.42; 127.82; 127.73; 127.62; 127.60; 127.11; 127.08; 126.91; 126.04; 125.84; 125.19 ppm.

(3-(9,10-di(naphthalen-2-yl)anthracen-2-yl)phenyl)diphenylphosphine oxide (B2)

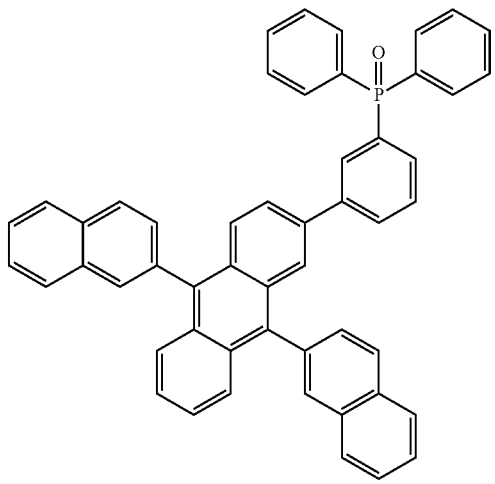 [SMILES: O=P(c1ccccc1)(c1ccccc1)c1cccc(-c2ccc3c(-c4ccc5ccccc5c4)c4ccccc4c(-c4ccc5ccccc5c4)c3c2)c1]

According to general procedure B
(3-bromophenyl)diphenylphosphine oxide: 1.9 g (5.3 mmol, 1.0 eq)
(9,10-di(naphthalen-2-yl)anthracen-2-yl)boronic acid: 3.0 g (6.3 mmol, 1.2 eq)
Pd(PPh$_3$)$_4$: 183 mg (0.16 mmol, 3 mol. %)
K$_2$CO$_3$, 2M: 8 mL
DME: 20 mL
Column chromatography: SiO$_2$, ethyl acetate
Yield: 3.1 g (83%) yellow solid
mp: n.a. (glassy)
EI-MS: m/z=706
$^1$H NMR (CD$_2$Cl$_2$, 25° C.): δ=7.33 (m, 6H); 7.47 (m, 3H); 7.66 (m, 16H); 7.82 (d, 1H, J=9.2 Hz); 7.91 (d, 1H, J=1.6 Hz); 7.95 (d, J=7.0 Hz, 2H); 8.02 (s, 2H); 8.09 (m, 4H) ppm.
$^{13}$C NMR (CDCl$_3$, 25° C.): δ=141.80 (J=12.0 Hz); 137.94 (J=58.7 Hz); 137.06; 136.91; 136.81; 134.70; 134.08 (J=2.7 Hz); 133.89; 133.73 (J=4.5 Hz); 133.48 (J=2.9 Hz); 132.91 (J=4.5 Hz); 132.41; 132.33; 131.46; 131.38; 131.30; 131.28; 131.24; 131.12; 131.03; 130.97; 130.88; 130.80; 130.29; 130.04 (J=8.6 Hz); 129.88; 129.63 (J=12.4 Hz); 128.99 (J=12.0 Hz); 128.73; 128.59; 128.48 (J=10.1 Hz); 127.61 (J=7.1 Hz); 127.12; 126.94 (J=5.0 Hz); 125.99 (J=6.3 Hz); 125.47 (J=16.7 Hz) ppm
$^{31}$P (CD$_2$Cl$_2$, 25° C.): δ=27.15 ppm.

(9,10-di(naphthalen-2-yl)anthracen-2-yl)boronic acid

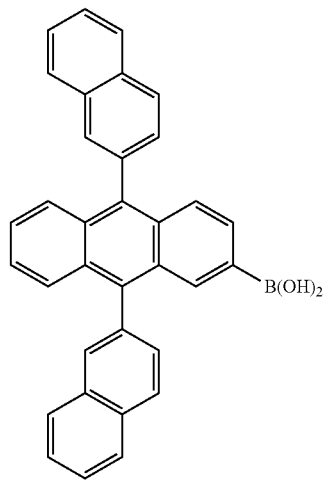 [SMILES: OB(O)c1ccc2c(-c3ccc4ccccc4c3)c3ccccc3c(-c3ccc4ccccc4c3)c2c1]

Prepared according to procedure described in EP13170862:
2-bromo-9,10-di(naphthalen-2-yl)anthracene (10.00 g, 1.0 eq, 19.63 mmol) was dissolved in THF (140 mL) and cooled to −78° C. At this temperature n-BuLi (2.5M in hexane, 10.2 mL, 1.3 eq, 25.52 mmol) was added dropwise and the mixture was stirred for 2 hours. Afterwards, B(OMe)$_3$ (6.12 g, 3.0 eq, 58.89 mmol) was added at −78° C. and the reaction mixture was allowed to warm up to room temperature. After stiffing for 17 hours the mixture was quenched with HCl, the yellow precipitate was filtered off and washed with water (2×30 mL). The residue was dried in vacuo and used without further purification.
Yield: 9.8 g (100%)

phenylbis(3-(anthracenyl-9-yl)phenyl)phosphine oxide (B4)

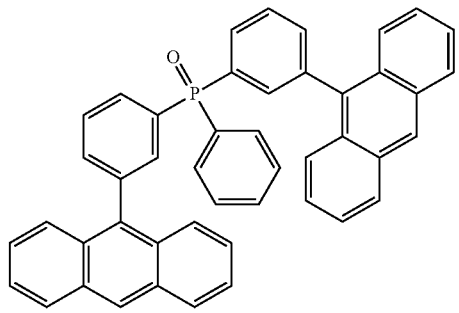 [SMILES: O=P(c1ccccc1)(c1cccc(-c2c3ccccc3cc3ccccc23)c1)c1cccc(-c2c3ccccc3cc3ccccc23)c1]

1st step: bis(3-bromophenyl)(phenyl)phosphine oxide—see above

2nd step: anthracene-9-ylboronic acid 9-bromoanthracene (20.0 g, 77.80 mmol, 1.0 eq) was dissolved in THF (400 mL), and the solution was cooled to −80° C. 40 mL n-butyl lithium solution (2.5M in hexane, 101.14 mmol, 1.3 eq) were added dropwise, and the mixture was stirred for 2 h at this temperature. Trimethylborate (31.5 mL, 233.40 mmol, 3.0 eq) was added and the reaction mixture was stirred overnight, while the temperature was allowed to slowly rise to RT. The reaction was quenched by addition of aqueous HCl (12.0 mL, 20 wt. %). After 30 min of stirring, the mixture was extracted with dichloromethane and water. The combined organic phases were dried over magnesium sulfate, filtered and the solvent was removed under reduced pressure. The residue was then triturated in MeOH for 1 h, filtered and rinsed with MeOH. After drying overnight in vacuum at 40° C., 13.76 g (80%) yield of the purified intermediate was obtained. HPLC purity: 98.95%

3rd step: phenylbis(3-(anthracenyl-9-yl)phenyl)phosphine oxide

Bis(3-bromophenyl)(phenyl)phosphine oxide (7.0 g, 16.05 mmol, 1.0 eq), anthracene-9-ylboronic acid (11.40 g, 51.35 mmol, 3.2 eq) and tetrakis-(triphenylphosphine)palladium(0) (0.925 g, 0.802 mmol, 5 mol. %) were dissolved in degassed 1,2-dimethoxyethane (85 mL). Then a degassed solution of potassium carbonate (8.87 g, 64.2 mmol, 4.0 eq) in water (32 mL) was added. The reaction solution was heated to 95° C. and stirred overnight. After cooling to RT, the precipitate was filtered off and washed with glyme. The crude material was purified by flash column using ethyl acetate/hexane 1:1. The product was then triturated in methanol, and the resulting off-white solid was dried in vacuum at 40° C. and further purified by sublimation.

HPLC purity: 99.70%

$^1$H NMR (CD$_2$Cl$_2$, 25° C.): δ=7.09 (ddd, J=1.16, 6.50, 8.79 Hz, 2H); 7.22 (ddd, J=1.19, 6.52, 8.80 Hz, 2H); 7.43 (m, 4H); 7.52 (m, 7H); 7.62 (m, 2H); 7.75 (td, J=7.29, 7.61, 7.64 Hz, 2H); 7.80 (dt, J=1.33; 1.33, 12.03 Hz, 2H); 7.88 (m, 2H); 8.06 (m, 6H); 8.52 (s, 2H) ppm.

$^{13}$C NMR (CDCl$_3$, 25° C.): δ=139.69 (J=12.2 Hz); 135.97; 135.47 (J=2.8 Hz); 135.06 (J=10.3 Hz); 134.43; 133.85; 133.61; 133.03; 132.56 (J=9.8 Hz); 131.84 (J=4.6 Hz); 130.60; 129.40 (J=12.3 Hz); 129.15 (J=12.1 Hz); 128.87 (J=4.2 Hz); 127.56; 126.64 (J=4.4 Hz); 126.25; 125.74 ppm $^{31}$P (CD$_2$Cl$_2$, 25° C.): δ=27.07 ppm.

(3-(10-([1,1'-biphenyl]-2-yl)anthracen-9-yl)phenyl) diphenylphosphine oxide (B5)

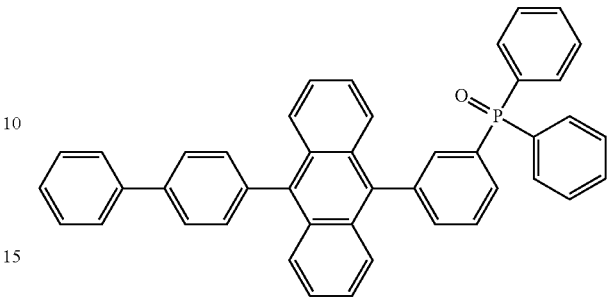

(3-bromophenyl)diphenylphosphine oxide (5.0 g, 14.0 mmol, 1.2 eq), 2-(10-([1,1'-biphenyl]-4-yl)anthracen-9-yl)-4,4,5,5-tetramethyl-1,3,2-dioxaborolane (5.32 g, 12 mmol, 1.0 eq) and tetrakis(triphenylphosphine)palladium(0) (0.54 g, 0.47 mmol, 4.0 mol. %) were dissolved in 1,2-dimethoxyethane (DME) and degassed with argon. A solution of potassium carbonate (3.22 g, 24.0 mmol, 2.0 eq) in water (35 mL) was degassed with argon and added; the mixture was then refluxed for 17 h at 95° C. After cooling to RT, the precipitated solid was filtrated off and washed with hexane (25 mL). The solid was then purified by precipitation from hexane/DCM (1:2 v/v).

The filtered product was then sublimed under reduced pressure.

HPLC: 100%

$^1$H NMR (CDCl$_3$, 25° C.): δ=7.94 (m; 1H); 7.87 (m; 2H); 7.75 (m, 11H); 7.63 (M, 2H); 7.53 (m, 10H); 7.43 (t, J=7.4 Hz, 1H), 7.36 (m, 4H) ppm.

$^{13}$C NMR (CDCl$_3$, 25° C.): δ=141.36; 140.96; 139.96 (J=12.1 Hz); 138.43; 137.94; 136.27; 135.53 (J=2.7 Hz); 135.22 (J=10.3 Hz); 134.63; 133.94; 133.81; 133.12; 132.57 (J=9.8 Hz); 132.50 (J=2.7 Hz); 132.30 (J=5.3 Hz); 131.88 (J=9.3 Hz); 130.43 (J=7.4 Hz); 129.52; 129.41 (J=12.2 Hz); 129.13 (J=12.0 Hz); 128.09; 127.68; 127.63 (J=7.9 Hz); 127.02; 125.99; 125.73 ppm $^{31}$P (CDCl$_3$, 25° C.): δ=27.21 ppm.

(3,5-di(anthracen-9-yl)phenyl)diphenylphosphine oxide (B6)

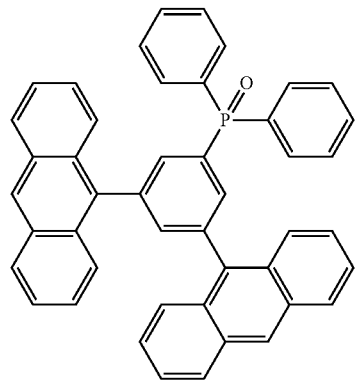 [SMILES: O=P(c1ccccc1)(c1ccccc1)c1cc(-c2c3ccccc3cc3ccccc23)cc(-c2c3ccccc3cc3ccccc23)c1]

1st step: 9,9'-(5-fluoro-1,3-phenylene)dianthracene 1,3-dibromo-5-fluorobenzene (5.0 g, 2.46 mL, 19.7 mmol, 1.0 eq), 9-anthracene boronic acid (9.61 g, 43.3 mmol, 2.2 eq) and tetrakis(triphenylphosphine)palladium(0) (0.495 g, 0.39 mmol, 2.0 mol. %) were dissolved in degassed DME (75 mL). Then, a degassed 2M solution of potassium carbonate (8.14 g, 59.1 mmol, 3.0 eq) in water (30 mL) was added, and the reaction mixture was heated to 95° C. for 19 h. Then, the precipitate was filtered hot and washed with DME (5 mL). The crude product was dissolved in DCM and extracted with water (3×100 mL). The organic layer was decanted, dried over MgSO₄, and evaporated to dryness.
HPLC purity: 99.51%

2nd step: (3,5-di(anthracen-9-yl)phenyl)diphenylphosphine oxide 9,9'-(5-fluoro-1,3-phenylene)dianthracene (5.0 g, 11.1 mmol, 1.0 eq) was suspended in THF (100 mL) under argon atmosphere. At 0° C., a solution of potassium diphenylphosphanide (0.5 M in THF, 26.7 mL, 13.4 mmol, 1.2 eq) was added drop wise, and the resulting mixture was stirred overnight at RT. Then it was quenched by addition of MeOH (10 mL), and evaporated to dryness. The residue was dissolved in chloroform (150 mL) and hydrogen peroxide was added cautiously. The resulting mixture was stirred overnight at RT, extracted with brine (2×100 mL) and water (2×100 mL), decanted, dried over MgSO₄, and evaporated to dryness. The crude product was triturated in MeOH (100 mL), filtered off, and then purified by column chromatography using hexane/ethyl acetate (1:1 v/v) as eluent. Finally, the product was sublimed under reduced pressure.
HPLC purity: 99.86%
¹H NMR (CDCl₃, 25° C.): δ=8.52 (s, 1H); 8.06 (dd, J=1.1, 8.4 Hz, 4H); 7.97 (dd, J=1.6, 11.9 Hz, 2H); 7.88 (m, 8H); 7.77 (d, J=1.5 Hz, 1H); 7.52 (dd, J=1.6, 7.3 Hz, 2H); 7.52 (dd, J=1.53, 7.49 Hz, 12H) ppm.
¹³C NMR (CDCl₃, 25° C.): δ=139.46 (J=12.8 Hz); 138.78 (J=3.1 Hz); 135.68; 135.11; 134.58 (J=9.9 Hz); 134.31; 133.87; 133.05; 131.93; 130.70; 129.12 (J=12.04 Hz); 129.07; 127.80; 126.73; 126.51; 125.8 ppm
³¹P (CDCl₃, 25° C.): δ=26.93 ppm.

(3-(10-(naphthalen-2-yl)anthracen-9-yl)phenyl)diphenylphosphine oxide (B7)

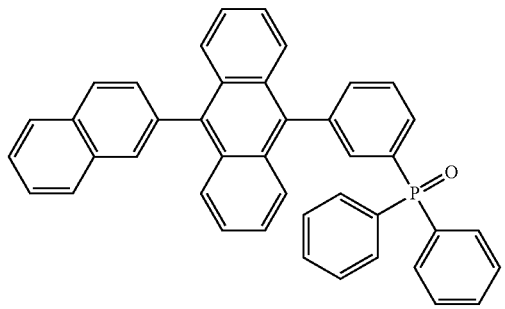 [SMILES: O=P(c1ccccc1)(c1ccccc1)c1cccc(-c2c3ccccc3c(-c3ccc4ccccc4c3)c3ccccc23)c1]

1st step: 9-(naphthalen-2-yl)anthracene 2-bromonaphthalene (50.0 g, 0.241 mol, 1.0 eq), 9-anthraceneboronic acid (53.6 g, 0.241 mol, 1.0 eq), the tetrakis(triphenylphosphine)palladium(0) (5.58 g, 4.82 mmol, 2.0 mol. %), and potassium carbonate (91.0 g, 0.723 mol, 3.0 eq), were placed in a flask and degassed with argon. DME (750 mL) and water (300 mL) were added; the mixture was further degassed with argon, and then refluxed over weekend (ca. 67 h) at 95° C. Upon reaction, greyish crystals are formed. After cooling to RT, these were filtered off and rinsed with DME (50 mL). The resulting solid was re-dissolved in CHCl₃ and filtered hot over a pad of sand and Florisil, with hot CHCl₃ as eluent. This single fraction was evaporated to dryness and dried under vacuum.

The white solid was triturated in DCM (200 mL) and filtered off yielding the title compound.
GC-MS purity: 99.88%
HPLC purity: 99.90%

2nd step: 9-bromo-10-(naphthalen-2-yl)anthracene 9-(naphthalen-2-yl)anthracene (44.0 g, 0.145 mol, 1.0 eq) and NBS (25.7 g, 0.145 mol, 1.0 eq) were placed in a flask, and dissolved in CHCl₃ (600 mL). The resulting solution was refluxed for 2 h, and then cooled down to RT. The organic phase was extracted with water, decanted, dried over MgSO₄, and evaporated to dryness, yielding the title compound.
GC-MS purity: 94.40%
HPLC purity: 99.50%

3rd step: 4,4,5,5-tetramethyl-2-(10-(naphthalen-2-yl)anthracen-9-yl)-1,3,2-dioxaborolane A flask was charged with 9-bromo-10-(naphthalen-2-yl)anthracene (55.0 g, 0.143 mol, 1.0 eq) and degassed with argon. The material was dissolved in anhydrous THF (300 mL) and cooled down to −78° C. n-butyl lithium (1.6M, 179 mL, 0.286 mmol, 2.0 eq) was added drop wise, and the resulting solution was stirred for 1 h at the cryogenic temperature. During this period, a color change from yellow to dark brown took place. The reaction was quenched by dropwise addition of the 2-isopropoxy-4,4,5,5-tetramethyl-1,3,2-dioxaborolane (79.9 g, 0.429 mmol, 3.0 eq), which induced another color change (from dark brown to almost black). After allowing the solution to warm to RT overnight, the resulting orange solution was extracted with DCM and water. The organic phase was decanted, washed with water, dried over MgSO₄, and evaporated to dryness. The crude product was dissolved in DCM and filtered over silica. Elution with hexane/toluene (3:1 v/v) (ca. 6.0 L) removed nonpolar impurities. The pad was then washed with DCM (ca. 6.0 L—single fraction), which after evaporation yielded the desired compound.
GC-MS: 100%
HPLC: 99.81%

4th step: (3-(10-(naphthalen-2-yl)anthracen-9-yl)phenyl)diphenylphosphine oxide 4,4,5,5-tetramethyl-2-(10-(naphthalen-2-yl)anthracen-9-yl)-1,3,2-dioxaborolane (53.90 g, 125.3 mmol, 1.0 eq), (3-bromophenyl)diphenylphosphine oxide (47.6 g, 133.3 mmol, 1.05 eq), the tetrakis(triphenylphosphine) palladium (0) (2.9 g, 2.5 mmol, 2.0 mol. %), and potassium carbonate (51.8 g, 375.9 mmol, 3.0 eq), were placed in a flask and dissolved in a mixture of DME and water (2.5:1 v/v, 690 mL). The resulting solution was degassed with argon and refluxed for 18 h at 100° C. Upon cooling to RT, the desired compound precipitates. Addition of DCM (500 mL) and water (100 mL) gave a solution. The organic layer was separated and extracted with water (200 mL), dried over MgSO$_4$, filtered over celite and reduced under vacuum. It was then filtered over a pad of silica (ca. 3 L); elution with hexane/DCM 1 (1:1 v/v, 6 L) allowed the removal of apolar impurities. The pad was then washed with DCM (3 L) and finally DCM/MeOH (95:5 v/v). The solution was reduced in vacuum to 200 mL, and hexane (400 mL) was added to induce precipitation. After 30 minutes stiffing at RT, the product was filtered off and washed with hexane. It was then dissolved in hot DCM (200 mL), cooled down to room temperature and precipitated by addition of hexane (500 mL), filtered off, and dried under vacuum. Finally, the product was sublimed under reduced pressure.

HPLC purity: 100%

$^1$H NMR (CDCl$_3$, 25° C.): δ=8.05 (dd, J=4.1, 8.4 Hz, 1H); 8.02-7.99 (bm, 2H); 7.94 (bd, 1H); 7.91-7.86 (m, 1H); 7.82-7.73 (m, 6H); 7.71 (bm, 3H); 7.63 (bd, J=8.4 Hz, 1H); 7.61-7.50 (m, 5H) 7.49-7.43 (m, 4H); 7.34 (dd, J=1.3, 8.8 Hz, 1H); 7.33 (dd, J=1.5, 1.5, 8.6 Hz, 1H); 7.29 (dd, J=1.4, 8.6 Hz, 1H); 7.28 (dd, J=1.3, 8.8 Hz, 1H) ppm.

$^{13}$C NMR (CDCl$_3$, 25° C.): δ=139.36 (J=12.4 Hz); 137.49; 136.28 (J=2.9 Hz); 135.56; 135.03 (J=1.3 Hz); 134.75 (J=10.4 and 1.3 Hz); 133.59; 133.33; 132.85; 132.77; 132.73; 132.12; 132.04; 132.02; 131.96 (J=2.7 Hz); 131.44 (J=9.3 Hz); 130.13 (J=6.0 Hz); 129.94; 129.73; 129.35 (J=4.0 Hz); 128.78 (J=12.4 Hz); 128.53 (J=12.2 Hz); 127.88 (J=21.7 and 2.8 Hz); 127.96 (J=2.1 Hz); 127.11; 126.43; 126.42; 126.24; 125.37; 125.13 ppm.

$^{31}$P (CDCl$_3$, 25° C.): δ=28.73 ppm.

(3-(10-(naphthalen-1-yl)anthracen-9-yl)phenyl)diphenylphosphine oxide (B8)

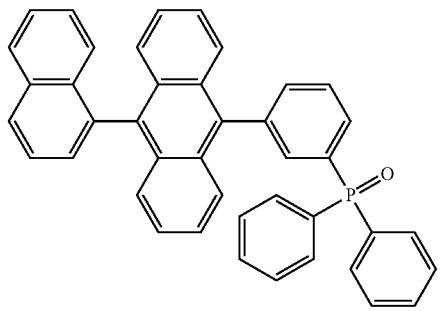 [SMILES: O=P(c1ccccc1)(c1ccccc1)c1cccc(-c2c3ccccc3c(-c3cccc4ccccc34)c3ccccc23)c1]

1$^{st}$, 2$^{th}$ and 3$^{rd}$ step: see B14

4$^{th}$ step: (3-(10-(naphthalen-1-yl)anthracen-9-yl) phenyl)diphenylphosphine oxide 4,4,5,5-tetramethyl-2-(10-(naphthalen-1-yl)anthracen-9-yl)-1,3,2-dioxaborolane (8.50 g, 19.8 mmol, 1.0 eq), (3-bromophenyl)diphenyl phosphine oxide (7.05 g, 19.8 mmol, 1.0 eq), tetrakis(triphenylphosphine) palladium(0) (456 mg, 3.95×10$^{-4}$ mol, 2.0 mol. %), and potassium carbonate (8.19 g, 59.2 mmol, 3.0 eq), were placed in a flask and dissolved in a mixture of DME and water (2.5:1 v/v, 105 mL). The resulting solution was degassed with argon and refluxed for 16 h at 95° C. Following cooling to RT, the mixture was extracted with DCM (400 mL) and water (2×100 mL); the organic phase was decanted, dried over MgSO$_4$, and evaporated to dryness. The solid obtained was dissolved in hexane/DCM (2:1 v/v, 600 mL), and filtered over silica (ca. 100 g). Elution with hexane/DCM (2:1 v/v) allowed the removal of nonpolar impurities. The pad was then washed with 1.8 L CHCl$_3$, the filtrate was reduced to a small few mL volume, and hexane was added to induce precipitation. After filtration and washing with hexane, the title compound was isolated as a yellowish powder. The product was sublimed under reduced pressure.

HPLC purity: 99.96%

$^1$H NMR (CDCl$_3$, 25° C.): δ=8.11 (bd, J=8.3 Hz, 1H); 8.05 (bd, J=8.2 Hz, 2H); 7.96-7.92 (m, 2H); 7.89-7.84 (m, 4H); 7.75-7.69 (m, 4H); 7.66-7.62 (m, 3H); 7.60-7.56 (m, 5H); 7.50 (ddd, J=8.1, 6.7, and 1.2 Hz, 1H); 7.44 (bd, J=8.8 Hz, 2H); 7.36 (dd, J=1.2, 8.8 Hz, 1H); 7.34 (dd, J=1.3, 8.8 Hz, 1H); 7.23 (m, 3H); 7.12 (bd, J=8.5 Hz, 1H) ppm.

$^{13}$C NMR (CDCl$_3$, 25° C.): δ=134.61 (J=2.8 Hz); 137.06; 136.67 (J=0.6 Hz); 134.38; 134.09; 134.04; 133.41; 133.21; 132.76; 132.70; 132.62; 132.58; 132.55 (J=2.7 Hz); 132.18 (J=12.2 and 2.6 Hz); 131.15; 130.25; 129.74; 129.20 (J=12.1 Hz); 128.82 (J=15.7 Hz); 127.55; 127.20; 126.86; 126.71 (J=25.6 Hz); 126.21; 126.02; 125.87 ppm.

$^{31}$P (CDCl$_3$, 25° C.): δ=27.43 ppm.

phenylbis(4-(anthracenyl-9-yl)phenyl)phosphine oxide (B10)

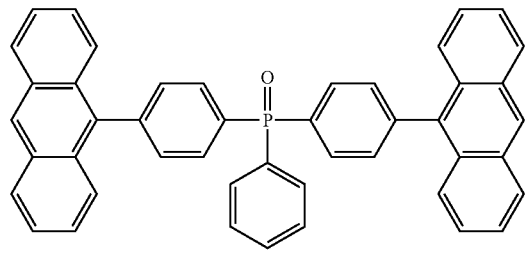 [SMILES: O=P(c1ccccc1)(c1ccc(-c2c3ccccc3cc3ccccc23)cc1)c1ccc(-c2c3ccccc3cc3ccccc23)cc1]

1$^{st}$ step: bis(4-bromophenyl)(phenyl)phosphine oxide (see above in general procedures)

2$^{nd}$ step: see 2$^{nd}$ step B4

3$^{rd}$ step: phenylbis(4-(anthracenyl-9-yl)phenyl)phosphine oxide

Bis(4-bromophenyl)(phenyl)phosphine oxide (5.0 g, 11.46 mmol, 1.0 eq), anthracene-9-ylboronic acid (9.33 g, 41.44 mmol, 3.66 eq) and tetrakis-(triphenylphosphine)palladium(0) (0.529 g, 0.46 mmol, 4.0 mol. %) were dissolved in degassed 1,2-dimethoxyethane (60 mL) and a degassed solution of potassium carbonate (6.33 g, 45.8 mmol, 4.0 eq) in water (23 mL) was added. The reaction solution was heated to 95° C. and stirred overnight. After cooling to RT, the precipitate was filtered off and washed with glyme. The crude material was purified by flash column using ethyl acetate/hexane 1:1, followed by ethyl acetate. The dried product was then washed two times with methyl-tert-butylether; the resulting grey solid was recovered and dried in vacuum at 40° C. The product was further purified by sublimation.

HPLC purity: 99.70%

$^1$H NMR (CD2Cl2, 25° C.): δ=7.40 (m, 4H); 7.49 (m, 4H); 7.67 (m, 4H); 8.02 (m, 4H); 8.56 (s, 2H) ppm.

$^{13}$C NMR (CDCl$_3$, 25° C.): δ=125.84; 126.34; 126.91; 127.69; 128.99; 129.27; 129.36; 130.52; 131.93; 132.19 (J=9.0 Hz); 132.49; 132.66 (J=1.8 Hz); 132.78 (J=7.2 Hz); 133.22; 133.32; 134.04; 136.17; 143.47 ppm
$^{31}$P (CD$_2$Cl$_2$, 25° C.): δ=27.56 ppm.

(4-(10-([1,1'-biphenyl]-2-yl)anthracen-9-yl)phenyl) diphenylphosphine oxide (B11)

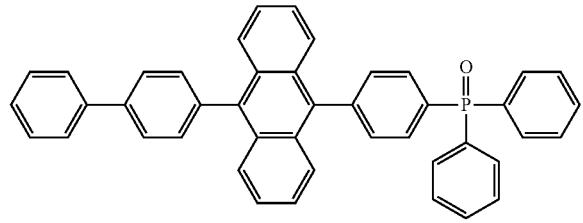 [SMILES: O=P(c1ccccc1)(c1ccccc1)c1ccc(-c2c3ccccc3c(-c3ccc(-c4ccccc4)cc3)c3ccccc23)cc1]

4-bromophenyl)diphenylphosphine oxide (5.0 g, 14 mmol, 1.2 eq), 2-(10-([1,1'-biphenyl]-4-yl)anthracen-9-yl)-4,4,5,5-tetramethyl-1,3,2-dioxaborolane (5.32 g, 12 mmol, 1.0 eq) and tetrakis(triphenylphosphine)palladium(0) (0.54 g, 0.47 mmol, 4.0 mol. %) were dissolved in with argon degassed DME. A solution of potassium carbonate (3.22 g, 23 mmol, 2.0 eq) in water (35 mL) was degassed with argon and added; the mixture was then refluxed for 17 h at 95° C. After cooling to RT, the precipitated solid was filtrated and washed with DME (25 mL). The solid was then dissolved in DCM (100 mL) and extracted with water (2×50 mL), dried over MgSO$_4$ and the organic layer reduced to ca. 60 mL. The product was precipitated by addition of hexane (50 mL). A second fraction was obtained by concentrating the mother liquor to ca. 35 mL. The merged fractions were sublimed under reduced pressure.

HPLC purity: 99.97%
$^1$H NMR (CDCl$_3$, 25° C.): δ=7.92 (dd; J=8.0, 11.5 Hz, 2H); 7.83 (m, 9H); 7.60 (m, 12H); 7.43 (t, J=7.3 Hz, 4H); 7.37 (d, J=9.5 Hz, 4H) ppm.
$^{13}$C NMR (CDCl$_3$, 25° C.): δ=143.66 (J=2.7 Hz); 141.35; 140.96; 138.43; 137.97; 136.34; 134.04; 133.36; 133.21; 132.72 (J=9.9 Hz); 132.66 (J=10.0 Hz); 132.56 (J=2.6 Hz); 132.31; 132.15 (J=12.4 Hz); 130.46; 130.23; 129.52; 129.21 (J=12.0 Hz); 128.09; 127.68; 127.59; 127.11; 125.78; 126.00 ppm
$^{31}$P (CDCl$_3$, 25° C.): δ=27.45 ppm.

(3'-(anthracen-9-yl)-[1,1'-biphenyl]-4-yl)diphenylphosphine oxide (B12)

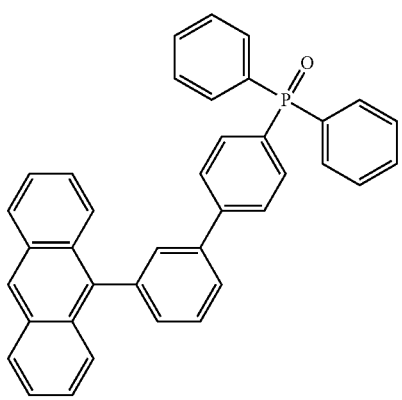 [SMILES: O=P(c1ccccc1)(c1ccccc1)c1ccc(-c2cccc(-c3c4ccccc4cc4ccccc34)c2)cc1]

1$^{st}$ step: 9-(3-bromophenyl)anthracene 1-bromo-3-iodobenzene (10.0 g, 35.4 mmol, 1.1 eq), 9-anthraceneboronic acid (7.13 g, 32.1 mmol, 1.0 eq), tetrakis(triphenylphosphine)palladium(0) (0.74 g, 0.64 mmol, 2.0 mol. %) were dissolved in degassed DME (100 mL). A degassed solution of potassium carbonate (8.87 g, 64.2 mmol, 2.0 eq) in water (30 mL) was added and the mixture stirred at 105° C. for 17 h. After cooling to RT, the solvent was removed under reduced pressure, the residue dissolved in DCM (100 mL) and extracted with water (2×50 mL). The organic layer was decanted, dried over magnesium sulfate, and the solvent removed under reduced pressure. The crude product was precipitated using DCM (10 mL) and hexane (60 mL). The resulting solid was then filtered over silica using DCM as an eluent.

HPLC purity: 99.27%

2$^{nd}$ step: 2-(3-(anthracen-9-yl)phenyl)-4,4,5,5-tetramethyl-1,3,2-dioxaborolane 9-(3-bromophenyl)anthracene (5.0 g, 15 mmol, 1.0 eq) was dissolved under argon atmosphere in THF (65 mL) and cooled to −80° C. n-butyllithium (1.6 M in hexane, 12 mL, 30 mmol, 2.0 eq) was added drop wise and the mixture was stirred for 30 min at −80° C. Then 2-isopropoxy-4,4,5,5-tetramethyl-1,3,2-dioxaborolane (9.2 mL, 8.37 g, 45 mmol, 3.0 eq) was added drop wise, and the mixture was allowed to warm to RT (without removing the cooling bath). The reaction was quenched by adding MeOH (1.0 mL), and after 10 min of stirring, the solvent was removed under reduced pressure. The crude product was dissolved in DCM (80 mL) and extracted with water (2×50 mL). The organic layer was decanted, dried over magnesium sulfate, filtrated and evaporated to dryness. Hexane (45 mL) was added, and the mixture was sonicated for 15 min. The resulting precipitate was filtered off, dissolved in DCM (120 mL) and filtrated over a 1-cm thick layer of silica gel. The mother liquor was evaporated to dryness to obtain the reddish product.

HPLC purity: 99.64%

3$^{rd}$ step: (3'-(anthracen-9-yl)-[1,1'-biphenyl]-4-yl) diphenylphosphine oxide Under argon atmosphere, 2-(3-(anthracen-9-yl)phenyl)-4,4,5,5-tetramethyl-1,3,2-dioxaborolane (3.1 g, 8.2 mmol, 1.0 eq), (4-bromophenyl)diphenylphosphine oxide (3.49 g, 9.8 mmol, 1.2 eq) and tetrakis(triphenylphosphine)palladium(0) (94 mg, 0.08 mmol, 1.0 mol. %) were dissolved in degassed DME (40 mL). A degassed 2M solution of potassium carbonate (2.25 g, 16.3 mmol, 2.0 eq) in water (8.2 mL) was then added and the reaction stirred at 95° C. for 17 h. After cooling to RT, the solution was evaporated to dryness. The residue was dissolved in DCM (50 mL) and extracted with water (2×50 mL). The organic layer was decanted, dried over magnesium sulphate, filtrated and evaporated to dryness. The oily residue was treated with a mixture of hexane/DCM (10:1 v/v) (40 mL) in an ultrasound bath to induce precipitation. The solid was filtered and dried under vacuum at 40° C., and further purified by sublimation under reduced pressure.

HPLC purity: 99.56%
$^1$H NMR (CDCl$_3$, 25° C.): δ=8.54 (s, 1H); 8.08 (d, J=8.5 Hz, 2H); 7.83 (m, 1H); 7.79 (m, 2H), 7.70 (m, 10H); 7.56 (m; 2H); 7.48 (m, 7H), 7.37 (ddd, J=1.1, 6.5, 8.7 Hz, 2H) ppm.

$^{13}$C NMR (CDCl$_3$, 25° C.): δ=144.82 (J=2.7 Hz); 140.60; 140.10; 137.08; 134.00; 133.17; 133.11 (J=10.1 Hz); 132.51 (J=10.1 Hz); 132.44; 131.99; 131.70; 130.77; 130.63; 129.68; 129.09 (J=12.0 Hz); 128.92; 127.79 (J=12.6 Hz); 127.30; 127.17; 126.94; 126.11; 125.77 ppm $^{31}$P (CDCl$_3$, 25° C.): δ=27.25 ppm.

(4-(10-(naphthalen-2-yl)anthracen-9-yl)phenyl)diphenylphosphine oxide (B13)

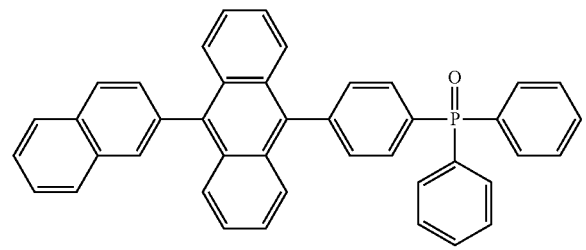 [SMILES: O=P(c1ccccc1)(c1ccccc1)c1ccc(-c2c3ccccc3c(-c3ccc4ccccc4c3)c3ccccc23)cc1]

1$^{st}$, 2$^{nd}$ and 3$^{rd}$ step: see B7

4$^{th}$ step: (4-(10-(naphthalen-2-yl)anthracen-9-yl)phenyl)diphenylphosphine oxide 4,4,5,5-tetramethyl-2-(10-(naphthalen-2-yl)anthracen-9-yl)-1,3,2-dioxaborolane (3.0 g, 6.9 mmol, 1.0 eq), (4-bromophenyl)diphenylphosphine oxide (2.5 g, 6.9 mmol, 1.0 eq), tetrakis(triphenylphosphine)palladium(0) (159 mg, 0.14 mmol, 2.0 mol. %), and potassium carbonate (2.86 g, 20.7 mmol, 3.0 eq) were placed in a flask and dissolved in a mixture of DME and water (2:1 v/v, 42 mL). The resulting solution was degassed with argon and refluxed for 18 h at 100° C. Upon cooling to RT, the desired compound precipitated. The crude product was filtered off and washed with small amounts of DME/water (2.5:1 v/v). The solid was dissolved in CHCl$_3$, extracted with water, dried over MgSO$_4$, and evaporated to dryness. The product was then purified by column chromatography over silica, elution with CHCl$_3$/MeOH (99:1 v/v), and finally sublimed under reduced pressure.

HPLC purity: 99.69%

$^1$H NMR (CDCl$_3$, 25° C.): δ=8.06 (d, J=8.4 Hz, 1H); 8.01 (dd, J=2.2, 9.1 Hz, 1H); 7.95 (bs, 1H); 7.92-7.88 (m, 3H); 7.86-7.82 (m, 4H); 7.71 (bd, J=8.4 Hz, 2H); 7.64 (bs, 1H); 7.59-7.53 (m, 12H); 7.36 (dd, J=8.7 and 1.3 Hz, 1H); 7.34 (dd, J=1.4, 8.7 Hz, 1H); 7.30 (dd, J=1.4, 8.7 Hz, 1H); 7.28 (dd, J=1.3, 8.8 Hz, 1H) ppm.

$^{13}$C NMR (CDCl$_3$, 25° C.): δ=143.32 (J=2.8 Hz); 137.60; 136.34; 135.85; 133.39; 132.83 (J=6.3 Hz); 132.32; 132.28; 132.20; 132.11 (J=2.7 Hz); 132.02; 131.75 (J=12.3 Hz); 131.50; 130.19; 130.00; 129.60; 129.41; 128.67 (J=12.2 Hz); 128.06 (J=8.3 Hz); 127.91; 127.18; 126.52; 126.49; 126.29; 125.45; 125.22 ppm.

$^{31}$P (CDCl$_3$, 25° C.): δ=29.24 ppm.

(4-(10-(naphthalen-1-yl)anthracen-9-yl)phenyl)diphenylphosphine oxide (B14)

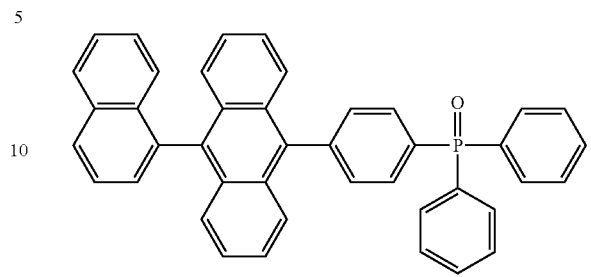

1$^{st}$ step: 9-(naphthalen-1-yl)anthracene 1-bromonaphthalene (46.6 g, 0.225 mol, 1.0 eq), 9-anthracene boronic acid (50.0 g, 0.225 mol, 1.0 eq), tetrakis(triphenylphosphine) palladium(0) (5.2 g, 4.50 mmol, 2.0 mol. %), and potassium carbonate (93.4 g, 0.675 mol, 3.0 eq), were placed in a flask and degassed with argon. DME (860 mL) and water (340 mL) were added; the mixture was further degassed with argon, and then refluxed overnight (ca. 18 h) at 95° C. After cooling to RT, the organic phase was decanted and reduced to ca. 100 mL. CHCl$_3$ (500 mL) was added, and the resulting solution was extracted with water, dried over MgSO$_4$, and reduced to ca. 50 mL. Upon cooling, the product precipitates; it was filtered off and rinsed with DME (2×25 mL). The resulting solid was re-dissolved in CHCl$_3$ (500 mL) and filtered over a pad of silica (175 g), with CHCl$_3$ as eluent (ca. 800 mL). This single fraction was reduced to ca. 100 mL; the solid that forms upon cooling was filtered off, rinsed with a mixture of hexane/CHCl$_3$ (2:1 v/v, 2×30 mL), and then hexane (3×20 mL), yielding the title compound as a yellowish solid.

HPLC purity: 99.80%

2$^{nd}$ step: 9-bromo-10-(naphthalen-1-yl)anthracene 9-bromo-10-(naphthalen-1-yl)anthracene (34.3 g, 112.7 mmol, 1.0 eq) and 1-bromopyrrolidine-2,5-dione (20.1 g, 112.7 mmol, 1.0 eq) were placed in a flask, and dissolved in CHCl$_3$ (600 mL). The resulting solution was refluxed for 4.5 h, and then cooled down to RT. The organic phase was extracted with water (150+200 mL), decanted, dried over MgSO$_4$, and evaporated to dryness, yielding the title compound as a yellow solid.

HPLC purity: 99.90%

3$^{rd}$ step: 4,4,5,5-tetramethyl-2-(10-(naphthalen-1-yl)anthracen-9-yl)-1,3,2-dioxaborolane A flask was charged with 9-bromo-10-(naphthalen-1-yl)anthracene (42.8 g, 111.7 mmol, 1.0 eq), and degassed with argon. The material was dissolved in anhydrous THF (250 mL) and cooled down to −78° C. n-butyl lithium (1.6 M in hexane, 139.5 mL, 223.4 mmol, 2.0 eq) was added drop wise, and the resulting solution was stirred for 1 h at cryogenic temperature. During this period, a color change from yellow to dark red took place. The reaction was quenched by dropwise addition of 2-isopropoxy-4,4,5,5-tetramethyl-1,3,2-dioxaborolane (68.4 mL, 335.2 mmol, 3.0 eq), stirred 1 h at −60° C. and then the dark green solution was allowed to warm to RT overnight, which induces the formation of a precipitate. Water (200 mL) was added and the THF was evaporated in vacuum. DCM (200 mL) was added to the aqueous phase. The insoluble solid was filtered off and the organic layer was extracted with water, decanted, dried over MgSO$_4$, and evaporated to dryness. The crude product was purified by filtration over silica (dissolved in DCM, elution of side products with toluene/hexane (1:3 v/v, 8 L), then elution of the product with DCM (ca. 5 L)).

GC-MS purity: 96.89%
HPLC purity: 97.79%

4$^{th}$ step: (4-(10-(naphthalen-1-yl)anthracen-9-yl) phenyl)diphenylphosphine oxide 4,4,5,5-tetramethyl-2-(10-(naphthalen-1-yl)anthracen-9-yl)-1,3,2-dioxaborolane (5.0 g, 11.6 mmol, 1.0 eq), (4-bromophenyl)diphenyl phosphine oxide (4.15 g, 11.6 mmol, 1.0 eq), tetrakis(triphenylphosphine) palladium(0) (268 mg, 0.23 mmol, 2 mol. %), and potassium carbonate (4.82 g, 34.8 mmol, 3.0 eq), were placed in a flask and dissolved in a mixture of DME and water (2.5:1 v/v, 62 mL). The resulting solution was degassed with argon and refluxed for 18 h at 95° C. Following cooling to RT, the mixture was extracted with DCM (200 mL) and water (2×100 mL); the organic phase was decanted, filtrated over a pad of silica and precipitated by addition of hexane (300 mL). The solid obtained was re-dissolved in hexane/DCM (2:1) and filtered over silica. Elution with hexane/DCM (2:1 v/v) allowed the removal of non-polar impurities. The pad was then washed with CHCl$_3$ (single fraction): this fraction was reduced to a few mL, and hexane (100 mL) was added to induce precipitation. After filtration and washing with hexane, the title compound was isolated. Finally, the product was sublimed under reduced pressure.

HPLC purity: 100%
$^1$H NMR (CDCl$_3$, 25° C.): δ=8.06 (bd, J=8.3 Hz, 1H); 8.00 (bd, J=8.2 Hz, 2H); 7.97-7.90 (m, 2H); 7.90-7.84 (m, 4H); 7.70-7.65 (m, 4H); 7.65-7.58 (m, 3H); 7.58-7.52 (m, 5H); 7.49-7.42 (m, 3H); 7.47 (ddd, J=8.0 and 1.2 Hz, 1H); 7.45 (bd, J=8.8 Hz, 2H); 7.34 (dd, J=1.2, 8.8 Hz, 1H); 7.31 (dd, J=1.2, 8.8 Hz, 1H); 7.23-7.17 (m, 3H); 7.15 (bd, J=8.4 Hz, 1H) ppm.
$^{13}$C NMR (CDCl$_3$, 25° C.): δ=134.22 (J=2.9 Hz); 136.47; 135.80; 135.68; 133.64; 133.46; 132.89; 132.41; 132.14; 132.06; 132.04 (J=2.8 Hz); 131.62 (J=12.2 Hz); 130.52; 129.56; 129.10; 128.62 (J=12.2 Hz); 128.18 (J=6.5 Hz); 127.14; 126.48 (2s); 126.26; 125.99; 125.52; 125.44; 125.24 ppm.
$^{31}$P (CDCl$_3$, 25° C.): δ=29.26 ppm.

diphenyl(4-(10-phenylanthracen-9-yl)phenyl)phosphine oxide (B15)

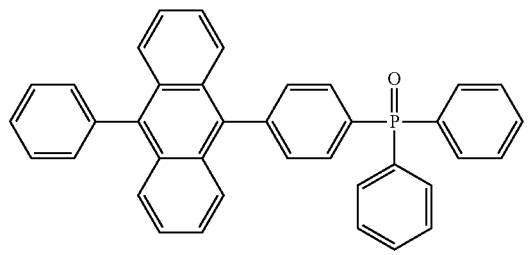 [SMILES: O=P(c1ccccc1)(c1ccccc1)c1ccc(-c2c3ccccc3c(-c3ccccc3)c3ccccc23)cc1]

1$^{st}$ step: 9-phenylanthracene

Bromobenzene (10.0 g, 6.71 mL, 63.7 mmol, 1.1 eq), 9-anthracene boronic acid (12.88 g, 58 mmol, 1.0 eq), tetrakis(triphenylphosphine) palladium(0) (1.34 g, 1.16 mmol, 2.0 mol. %) were dissolved in degassed DME (120 mL). A degassed solution of potassium carbonate (16.0 g, 116.0 mmol, 2.0 eq) in water (60 mL) was added and the mixture stirred at 105° C. for 17 h. After cooling to RT, the precipitate was filtered off, washed with hexane (20 mL) and MTBE (30 mL) and dried overnight in vacuum at 40° C. The crude product was recrystallized form ethanol.

HPLC purity: 99.96%

2$^{nd}$ step: 9-bromo-10-phenylanthracene 9-phenylanthracene (3.0 g, 11.8 mmol, 1.0 eq) was dissolved in chloroform (50 mL) and acetic acid (26 mL). The mixture was cooled to ca. 0° C. and bromine (0.64 mL, 1.98 g, 12.4 mmol, 1.05 eq) was added drop wise. After stirring for 2 h at RT, the solvent was removed under reduced pressure. The residue was dissolved in chloroform (75 mL) and extracted with 1 M aqueous sodium hydroxide (20 mL), followed by water (2×30 mL). The organic layer was decanted, dried over magnesium sulfate, filtrated and evaporated to dryness. The crude product was recrystallized from ethanol (60 mL).

HPLC: 97.30%

3$^{rd}$ step: 4,4,5,5-tetramethyl-2-(10-phenylanthracen-9-yl)-1,3,2-dioxaborolane 9-bromo-10-phenylanthracene (2.3 g, 6.9 mmol, 1.0 eq) was dissolved under argon atmosphere in THF and cooled to −80° C. n-butyl lithium (1.6 M in THF, 5.5 mL, 13.8 mmol, 2.0 eq) was added dropwise and the mixture was stirred for 30 min at −80° C. Then 2-isopropoxy-4,4,5,5-tetramethyl-1,3,2-dioxaborolane (4.22 mL, 3.86 g, 20.7 mmol, 3.0 eq) was added dropwise, and the mixture was allowed to warm to room temperature (without removing the cooling bath). The reaction was quenched by adding MeOH (1 mL), and after 10 min of stiffing, the solvent was removed under reduced pressure. The crude product was dissolved in chloroform (120 mL) and extracted with water (3×30 mL). The organic layer was decanted, dried over magnesium sulfate, and evaporated to dryness. 20 mL hexane were added to the residue, and the mixture was treated in an ultrasound bath for about 15 min. Finally, the precipitate was filtered off.

GC-MS purity: 97.65%

4$^{th}$ step: diphenyl(4-(10-phenylanthracen-9-yl)phenyl)phosphine oxide

Under argon atmosphere, 4,4,5,5-tetramethyl-2-(10-phenylanthracen-9-yl)-1,3,2-dioxaborolane (7.5 g, 19.7 mmol, 1.0 eq), (4-bromophenyl)diphenylphosphine oxide (8.45 g, 23.7 mmol, 1.2 eq) and tetrakis(triphenylphosphine)palladium(0) (456 mg, 0.39 mmol, 2.0 mol. %) were dissolved in degassed DME (160 mL). A degassed 2 M solution of potassium carbonate (5.45 g, 39.4 mmol, 2.0 eq) in water (20 mL) was added and the reaction stirred at 95° C. for 14 h. After cooling to room temperature the precipitate was filtered off. The crude product was dissolved in chloroform (200 mL) and extracted with water (2×40 mL). The organic layer was dried over magnesium sulfate, filtered and the solvent was removed under reduced pressure. Finally, the product was sublimed under reduced pressure.

HPLC: 100%

$^1$H NMR (CDCl$_3$, 25° C.): δ=7.93 (m, 2H); 7.87 (m, 4H); 7.71 (m, 2H); 7.67 (dd, J=2.2, 7.4 Hz, 2H); 7.61 (m, 11H); 7.46 (m, 2H); 7.35 (m, 4H) ppm.

$^{13}$C NMR (CDCl$_3$, 25° C.): δ=143.64 (J=2.7 Hz), 139.39; 138.32; 136.21; 134.05; 133.29 (J=16.7 Hz); 132.69 (J=9.8 Hz); 132.64 (J=9.3 Hz); 132.53 (J=2.8 Hz); 132.13 (J=12.1 Hz); 131.76; 130.39; 130.16; 129.19 (J=12.0 Hz); 129.02; 128.16; 127.55; 127.02; 125.95; 125.69 ppm $^{31}$P (CDCl$_3$, 25° C.): δ=27.39 ppm.

(3'-(anthracen-9-yl)-[1,1'-biphenyl]-3-yl)diphenylphosphine oxide (B16)

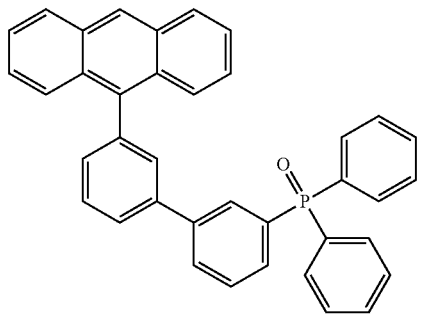 [SMILES: O=P(c1ccccc1)(c1ccccc1)c1cccc(-c2cccc(-c3c4ccccc4cc4ccccc34)c2)c1]

1$^{st}$ step: 9-(3-bromophenyl)anthracene 1-bromo-3-iodobenzene (38.2 g, 135.1 mmol, 1.0 eq), 9-anthracene boronic acid (30.0 g, 135.1 mmol, 1.0 eq), tetrakis(triphenylphosphine)palladium(0) (3.12 g, 2.7 mmol, 2.0 mol. %) were dissolved in degassed DME (500 mL). A degassed solution of potassium carbonate (56.0 g, 405.3 mmol, 3.0 eq) in water (200 mL) was added, and the mixture stirred at 95° C. for 18 h. After cooling to RT, the organic layer was extracted with water (175 mL), and filtrated over silica using DCM as solvent. After removal of the solvent, the residue was triturated in refluxing hexane (200 mL), filtrated, washed with hexane and dried in vacuum. A second fraction was isolated from the aqueous phase by extraction with DCM, followed by precipitation with hexane. Both fractions were combined, purified by column chromatography using hexane/DCM (20:1 v/v) as eluent.

HPLC purity: 99.74%

2$^{nd}$ step: 2-(3-(anthracen-9-yl)phenyl)-4,4,5,5-tetramethyl-1,3,2-dioxaborolane 9-(3-bromophenyl)anthracene (21.0 g, 63 mmol, 1.0 e.) was dissolved under argon atmosphere in THF (65 mL) and cooled to −80° C. n-butyl lithium (2.5 M in hexane, 32.8 mL, 82.9 mmol, 1.3 eq) was added dropwise and the mixture was stirred for 30 min at −80° C. Then 2-isopropoxy-4,4,5,5-tetramethyl-1,3,2-dioxaborolane (19.3 mL, 17.6 g, 94.5 mmol, 1.5 eq) was added drop wise, and the mixture was allowed to warm to RT (without removing the cooling bath). The reaction was then quenched by addition of water (100 mL). After 10 min of stirring, the organic layer was extracted with water, decanted, dried over magnesium sulfate, and evaporated to dryness. The crude product was dissolved in hot toluene (50 mL) and precipitated overnight with hexane (250 ml). A second fraction was isolated from the mother liquor by precipitation from hot toluene (10 mL) and hexane (150 mL). Both fractions were mixed and filtered over silica using chloroform as eluent.

HPLC purity: 98.54%

3$^{rd}$ step: (3'-(anthracen-9-yl)-[1,1'-biphenyl]-3-yl)diphenylphosphine oxide Under argon atmosphere, 2-(3-(anthracen-9-yl)phenyl)-4,4,5,5-tetramethyl-1,3,2-dioxaborolane (5.0 g, 13.2 mmol, 1.0 eq), (3-bromophenyl)diphenyl phosphine oxide (5.16 g, 14.5 mmol, 1.1 eq) and tetrakis(triphenylphosphine) palladium(0) (304 mg, 0.26 mmol, 2.0 mol. %) were dissolved in a degassed mixture of toluene (20 mL) and ethanol (20 mL). Then, a degassed 2 M solution of potassium carbonate (3.63 g, 26.3 mmol, 2.0 eq) in water (13.5 mL) was added, and the reaction was stirred at 95° C. for 8.5 h. After cooling to RT, the precipitate was filtered off and washed with a mixture of toluene and ethanol (30 mL, 1:1). The solid residue was then dissolved in DCM (50 mL), filtrated over celite, the pad being washed with DCM (20 mL). This organic phase was extracted with water (50 mL), dried over magnesium sulfate, and evaporated to dryness. The foamy residue was triturated in methanol to induce precipitation. After filtration, the solid was dried under vacuum at 40° C., and finally sublimed under reduced pressure.

HPLC purity: 99.75%

$^1$H NMR (CDCl$_3$, 25° C.): δ=8.54 (s, 1H); 8.09 (m, 3H); 7.87 (ddd, J=1.3, 2.9, 7.6 Hz, 1H); 7.78 (ddd, J=1.3, 1.8, 7.9 Hz, 1H); 7.70 (m, 8H); 7.57 (m, 4H); 7.47 (m, 7H); 7.37 (ddd, J=1.2, 6.5, 8.8 Hz, 2H); ppm.

$^{13}$C NMR (CDCl$_3$, 25° C.): δ=141.86 (J=11.9 Hz); 140.76; 140.04; 137.10; 134.78; 133.96; 13391; 132.51 (J=12.4 Hz); 132.48; 131.97; 131.46 (J=210.1 Hz); 131.35; 131.18 (J=6.7 Hz); 131.13 (J=13.4 Hz); 130.75; 130.54; 129.54 (J=13.8 Hz); 129.10 (J=12.0 Hz); 128.89; 127.22 (J=8.5 Hz); 126.88; 126.09; 125.73 ppm $^{31}$P (CDCl$_3$, 25° C.): δ=27.41 ppm.

(3-(10-(phenanthren-9-yl)anthracen-9-yl)phenyl)diphenylphosphine oxide (B17)

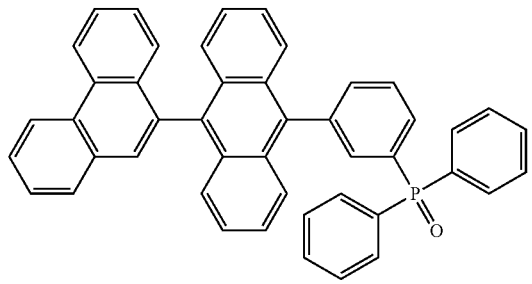 [SMILES: O=P(c1ccccc1)(c1ccccc1)c1cccc(-c2c3ccccc3c(-c3cc4ccccc4c4ccccc34)c3ccccc23)c1]

1$^{st}$ step: (3-(anthracen-9-yl)phenyl)diphenylphosphine oxide (3-bromophenyl)diphenyl phosphine oxide (30 g, 84 mmol, 1.0 eq), 9-anthracene boronic acid (18.65 g, 84 mmol, 1.0 eq), tetrakis(triphenylphosphine) palladium(0) (1.94 g, 1.68 mmol, 2.0 mol. %), and potassium carbonate (34.8 g, 252 mmol, 3.0 eq), were placed in a flask and degassed with argon. DME (330 mL) and water (130 mL) were added; the mixture was further degassed with argon, and then refluxed 18 h at 95° C. After cooling to RT, DCM and water were added; the organic layer was decanted, dried with MgSO₄, and evaporated to dryness. Finally, the product was recrystallized in toluene.

HPLC purity: 99.68%

2^nd step: (3-(10-bromoanthracen-9-yl)phenyl)diphenylphosphine oxide (3-(anthracen-9-yl)phenyl)diphenylphosphine oxide (28.2 g, 62 mmol, 1.0 eq) and 1-bromopyrrolidine-2,5-dione (11.04 g, 62 mmol, 1.0 eq) were placed in a flask, and dissolved in CHCl₃ (250 mL). The resulting solution was stirred at RT for 6 h. Then, the organic layer was extracted with water (2×100 mL), decanted, dried over MgSO₄, and evaporated to dryness.

HPLC purity 99.85%

3^rd step: (3-(10-(phenanthren-9-yl)anthracen-9-yl)phenyl)diphenylphosphine oxide (3-(10-bromoanthracen-9-yl)phenyl)diphenyl phosphine oxide (5 g, 9.4 mmol, 1.0 eq), phenanthren-9-yl boronic acid (3.12 g, 14.1 mmol, 1.5 eq), tetrakis(triphenylphosphine) palladium(0) (216 mg, 0.19 mmol, 2.0 mol. %), and potassium carbonate (3.89 g, 28.1 mmol, 3.0 eq), were placed in a flask and dissolved in a mixture of DME and water (2:1, 70 mL). The resulting solution was degassed with argon and refluxed for 16 h at 95° C. After cooling to RT, DCM (50 mL) and water (30 mL) were added. The organic layer was decanted, washed with water (30 mL), dried over MgSO₄, and evaporated to dryness. The crude product was dissolved in DCM and filtered over a pad of silica. The pad was then washed with DCM (400 mL) and DCM/MeOH (1:1 v/v). The product fraction was evaporated to dryness, and after re-dissolution in ethyl acetate (50 mL), precipitated by addition of hexane (100 mL). The solid was filtered off, triturated in refluxing ethyl acetate, and then recrystallized with toluene (with addition of small aliquots of hexane to improve precipitation). Thereafter, the product was dissolved in DCM (30 mL), and precipitated again by addition of hexane (100 mL). Finally, the product was sublimed under reduced pressure.

HPLC purity: 99.96%

¹H NMR (CDCl₃, 25° C.): δ=8.90 (m, 2H); 8.01-7.96 (m, 1H); 7.94 (m, 1H); 7.88 (m, 1H); 7.85-7.74 (m, 8H); 7.73-7.63 (m, 4H); 7.60-7.55 (m, 4H); 7.55-7.49 (m, 4H); 7.35 (m, J=1.1, 2.3, 4.7 Hz, 2H); 7.30 (m, J=1.3, 8.8 Hz, 1H); 7.24-7.12 (m, 3H) ppm.

¹³C NMR (CDCl₃, 25° C.): δ=139.93 (J=12.2 and 1.9 Hz); 136.74 (J=0.6 Hz); 136.00; 135.66 (J=4.2 Hz); 135.56; 135.31 (J=3.1 Hz); 135.23 (J=10.2 Hz); 134.68; 133.98 (J=3.4 Hz); 133.87; 133.19; 133.16 (J=3.5 Hz); 132.58 (J=9.8 Hz); 132.50 (2C); 132.31; 131.93 (J=9.4 Hz); 131.21; 131.13 (J=3.0 Hz); 130.97 (J=2.4 Hz); 130.55 (J=9.3 Hz); 130.50; 129.42 (J=12.3 and 2.3 Hz); 129.32 (J=2.5 Hz); 129.15 (J=12.0 and 2.7 Hz); 127.79 (J=3.8 Hz); 127.64 (J=0.9 Hz); 127.60; 127.43 (J=3.6 Hz); 127.36; 127.17; 125.99 (J=18.6 Hz); 123.54 (J=5.4 Hz); 123.28 (J=2.2 Hz) ppm.

³¹P (CDCl₃, 25° C.): δ=27.14 ppm.

diphenyl(3-(10-phenylanthracen-9-yl)phenyl)phosphine oxide (B18)

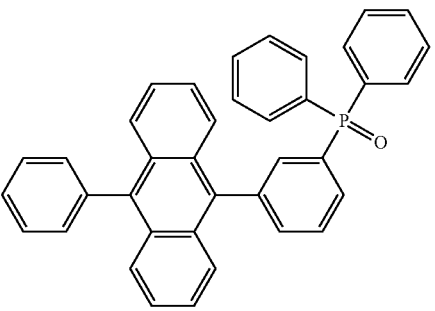 [SMILES: O=P(c1ccccc1)(c1ccccc1)c1cccc(-c2c3ccccc3c(-c3ccccc3)c3ccccc23)c1]

1^st, 2^nd and 3^rd step: see B15

4^th step: diphenyl(3-(10-phenylanthracen-9-yl)phenyl)phosphine oxide

Under argon atmosphere, 4,4,5,5-tetramethyl-2-(10-phenylanthracen-9-yl)-1,3,2-dioxaborolane (10.4 g, 26.3 mmol, 1.0 eq), (3-bromophenyl)diphenyl phosphine oxide (11.3 g, 31.6 mmol, 1.2 eq) and tetrakis(triphenylphosphine) palladium(0) (608 mg, 0.53 mmol, 2.0 mol. %) were dissolved in degassed DME (220 mL). A degassed 2 M solution of potassium carbonate (7.26 g, 52.6 mmol, 2.0 eq) in water (26 mL) was added and the reaction stirred at 95° C. for 17 h. After cooling to RT, the solvent was removed under reduce pressure. The residue was dissolved in DCM (120 mL) and extracted with water (2×50 mL). The organic layer was decanted, dried over magnesium sulphate, filtered over a layer (1 cm) of silica gel and evaporated to dryness. The oily residue was stirred with hexane (60 mL) overnight to induce precipitation. The solid was filtered off and then sublimed under reduced pressure.

HPLC purity: 99.72%

¹H NMR (CDCl₃, 25° C.): δ=7.95 (m, 1H); 7.73 (m, 9H); 7.62 (m, 4H); 7.56 (m, 3H), 7.47 (m, 6H), 7.35 (m, 4H) ppm.

¹³C NMR (CDCl₃, 25° C.): δ=139.96 (J=12.6 Hz); 139.40; 138.30; 136.17; 135.51 (J=2.7 Hz); 135.21 (J=10.28 Hz); 134.64; 133.90 (J=16.7 Hz); 133.14; 132.56 (J=9.6 Hz); 132.48 (J=2.7); 131.86 (J=9.3 Hz); 131.77 (J=5.2 Hz); 130.38 (J=5.7 Hz); 129.39 (J=12.5 Hz); 129.12 (J=12.2 Hz); 129.02 (J=2.6 Hz); 128.16; 127.58; 126.96; 125.94; 125.65 ppm.

³¹P (CDCl₃, 25° C.): δ=27.15 ppm.

(4'-(anthracen-9-yl)-[1,1'-biphenyl]-4-yl)diphenylphosphine oxide (B19)

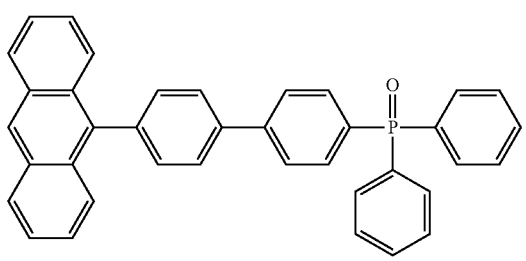 [SMILES: O=P(c1ccccc1)(c1ccccc1)c1ccc(-c2ccc(-c3c4ccccc4cc4ccccc34)cc2)cc1]

1st step: 9-(4-bromophenyl)anthracene 1-bromo-4-iodobenzene (20.0 g, 70.7 mmol, 1.1 eq), 9-anthraceneboronic acid (14.26 g, 64.2 mmol, 1.0 eq), tetrakis(triphenylphosphine) palladium(0) (0.74 g, 0.64 mmol, 1.0 mol. %) were dissolved in degassed DME (200 mL). A degassed solution of potassium carbonate (17.74 g, 128.6 mmol, 2.0 eq) in water (80 mL) was added, and the mixture was stirred at 105° C. for 17 h. After cooling to RT the precipitate was filtered off and dried under vacuum.

GC-MS purity: 96.62%

2nd step: 2-(4-(anthracen-9-yl)phenyl)-4,4,5,5-tetramethyl-1,3,2-dioxaborolane 9-(4-bromophenyl)anthracene (10.0 g, 30 mmol, 1.0 eq) was dissolved under argon atmosphere in THF (200 mL) and cooled to −80° C. n-butyl lithium (14.4 mL, 36 mmol, 1.3 eq.) was added drop wise and the mixture was stirred for 30 min at −80° C. After drop wise addition of 4,4,5,5-tetramethyl-2-(10-phenylanthracen-9-yl)-1,3,2-dioxaborolane (9.2 mL, 8.37 g, 45 mmol, 1.5 eq), the mixture was allowed to warm to RT overnight (without removing the cooling bath). The reaction was quenched by adding methanol (6 mL), and left to stir for 15 min. After removal of the solvent, the crude product was dissolved in chloroform (150 mL) and extracted with water (3×30 mL). The organic layer was decanted, dried over magnesium sulfate, and evaporated to dryness. The residue was then stirred for 1 h in a mixture of hexane (40 mL) and DCM (4 mL), filtered and dried in vacuum at 40° C.

HPLC purity: 93.81%

3rd step: (4'-(anthracen-9-yl)-[1,1'-biphenyl]-4-yl)diphenylphosphine oxide

Under argon atmosphere, 2-(4-(anthracen-9-yl)phenyl)-4,4,5,5-tetramethyl-1,3,2-dioxaborolane (4.6 g, 12.1 mmol, 1.0 eq), (4-bromophenyl)diphenyl phosphine oxide (5.18 g, 14.5 mmol, 1.2 eq) and tetrakis(triphenylphosphine) palladium(0) (280 mg, 0.24 mmol, 2.0 mol. %) were dissolved in degassed DME (80 mL). A degassed 2 M solution of potassium carbonate (3.34 g, 16.3 mmol, 2.0 eq) in water (12 mL) was added, and the reaction stirred at 95° C. for 17 h. After cooling to RT, the solution was evaporated to dryness. The crude product was dissolved in chloroform (70 mL) and extracted with water (2×30 mL). The organic layer was decanted, dried over magnesium sulfate, and filtered over silica (1 cm). After removal of the solvent, the resulting oil was stirred in a mixture of hexane (50 mL) and DCM (3 mL) overnight. The precipitate was filtered off and dried in vacuum at 40° C., before being sublimed under reduced pressure.

HPLC purity: 99.25%

¹H NMR (CDCl₃, 25° C.): δ=8.54 (s, 1H); 8.08 (d, J=8.5 Hz. 2H), 7.79 (m, 12H); 7.61 (m, 2H); 7.53 (m, 6H); 7.48 (m; 2H), 7.38 (ddd, J=1.1, 6.5 and 8.6 Hz, 2H) ppm.

¹³C NMR (CDCl₃, 25° C.): δ=144.83 (J=2.8 Hz); 129.60; 139, 34; 136.91; 134.09; 133.27; 133.20 (J=10.1 Hz); 132.85; 132.57 (J=9.5 Hz); 132.50; 131.99; 130.74; 129.14 (J=12.1 Hz); 128.93; 127.82; 127.74 (J=12.1 Hz); 127.29; 127.16; 126.08; 125.77 ppm ³¹P (CDCl₃, 25° C.): δ=27.24 ppm.

(4'-(anthracen-9-yl)-[1,1'-biphenyl]-3-yl)diphenylphosphine oxide (B20)

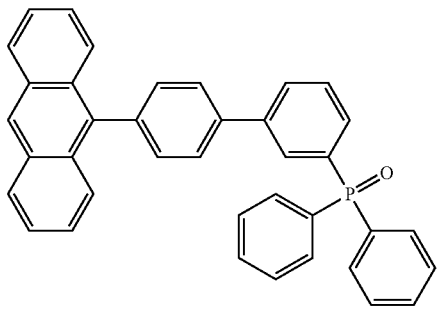 [SMILES: O=P(c1ccccc1)(c1ccccc1)c1cccc(-c2ccc(-c3c4ccccc4cc4ccccc34)cc2)c1]

1st and 2nd step: see B19

3rd step: (4'-(anthracen-9-yl)-[1,1'-biphenyl]-3-yl)diphenylphosphine oxide

Under argon atmosphere, 2-(4-(anthracen-9-yl)phenyl)-4,4,5,5-tetramethyl-1,3,2-dioxaborolane (7.1 g, 18.7 mmol, 1.0 eq), (3-bromophenyl)diphenylphosphine (8.0 g, 22.4 mmol, 1.2 eq) and tetrakis(triphenylphosphine) palladium (0) (432 mg, 0.37 mmol, 2.0 mol. %) were dissolved in degassed DME (80 mL). A degassed solution of potassium carbonate (5.16 g, 37.4 mmol, 2.0 eq) in water (19 mL) was added and the reaction stirred at 95° C. for 17 h. After cooling to RT, the precipitate was filtered off, and washed with water (60 mL). Following drying in vacuum at 40° C., the product was sublimed under reduced pressure.

HPLC purity: 99.93%

¹H NMR (CDCl₃, 25° C.): δ=8.53 (s, 1H); 8.09 (m, 3H); 7.97 (dd, J=1.6, 7.4 Hz, 1H); 7.79 (m, 2H); 7.75 (m, 4H); 7.70 (dd, J=0.8, 8.8 Hz, 2H); 7.62 (m, 4H); 7.51 (m, 8H); 7.37 (ddd, J=1.2, 6.5, 8.7 Hz, 2H) ppm.

¹³C NMR (CDCl₃, 25° C.): δ=141.83 (J=12.0 Hz); 139.77; 138.97; 136.95; 134.85; 134.03; 133.99; 133.17; 132.59 (J=10.1 Hz); 132.47 (J=13.7 Hz); 131.98; 131.51 (J=10.0 Hz); 131.15 (J=3.2 Hz); 131.05; 130.74; 129.67 (J=12.7 Hz); 129.17 (J=12.1 Hz); 127.75; 127.20 (J=7.8 Hz); 126.05; 125.75 ppm ³¹P (CDCl₃, 25° C.): δ=27.44 ppm.

(3',5'-di(anthracen-9-yl)-[1,1'-biphenyl]-3-yl)diphenylphosphine oxide (B21)

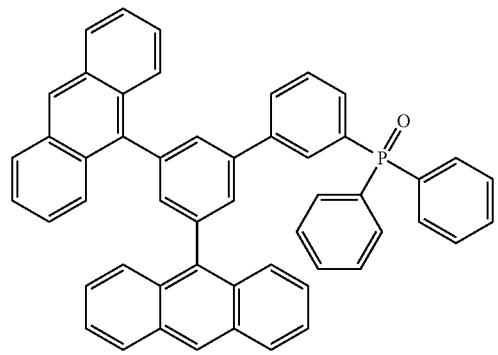 [SMILES: O=P(c1ccccc1)(c1ccccc1)c1cccc(-c2cc(-c3c4ccccc4cc4ccccc34)cc(-c3c4ccccc4cc4ccccc34)c2)c1]

1st step: 9,9'-(5-bromo-1,3-phenylene)dianthracene 1,3,5-tribromobenzene (20.0 g, 63.5 mmol, 1.0 eq), 9-anthracene boronic acid (29.6 g, 133.4 mmol, 2.1 eq) and tetrakis(triphenylphosphine) palladium(0) (1.48 g, 1.28 mmol, 2.0 mol. %) were added to degassed DME (244 mL) under argon atmosphere. A degassed solution of potassium carbonate (26.4 g, 190.6 mmol, 3.0 eq) in water (96 mL) was added, and the reaction mixture was heated to 95° C. for 17 h. The resulting precipitate was filtrated hot, washed with DME, DCM and water, and finally dried in vacuum at 40° C.

HPLC purity: 97.96%

2nd step: 2-(3,5-di(anthracen-9-yl)phenyl)-4,4,5,5-tetramethyl-1,3,2-dioxaborolane 9,9'-(5-bromo-1,3-phenylene)dianthracene (10.0 g, 19.6 mmol, 1.0 eq), bis(pinacolato)diboron (5.5 g, 21.6 mmol, 1.1 eq), and potassium acetate (5.8 g, 58.9 mmol, 3.0 eq) were suspended in anhydrous DMSO (130 mL) under argon atmosphere. [1,1'-bis(diphenylphosphino)ferrocene]-dichloropalladium(II) (0.43 g, 0.59 mmol, 3.0 mol. %) was added, and the mixture was stirred at 100° C. for 17 h. After cooling to RT, the solvent was removed under reduced pressure. The residue was dissolved in DCM, filtrated over celite, and the filtrate was extracted with water until the aqueous phase was neutral. Then the organic layer was decanted, dried over magnesium sulfate, and evaporated to dryness. The crude product was dissolved in DCM, and precipitated by addition of hexane. The solid was filtered off, washed with hexane, and dried in vacuum at 40° C.

HPLC purity: 96.79%

3rd step: (3',5'-di(anthracen-9-yl)-[1,1'-biphenyl]-3-yl)diphenylphosphine oxide 2-(3,5-di(anthracen-9-yl)phenyl)-4,4,5,5-tetramethyl-1,3,2-dioxaborolane (3.21 g, 5.76 mmol, 1.0 eq), (3-bromophenyl)diphenylphosphine oxide (2.3 g, 6.34 mmol, 1.1 eq), and potassium carbonate (1.19 g, 8.64 mmol, 1.5 eq) were suspended in a mixture of toluene (30 mL), ethanol (5.3 mL) and water (8.7 mL). Following degasing with argon, tetrakis(triphenylphosphine) palladium(0) (130 mg, 0.12 mmol, 2.0 mol. %) was added, and the solution was stirred at 100° C. for 17 h. After cooling to RT, the mixture was filtered over a layer of Florisil; the mother liquor was extracted with DCM and water until the aqueous phase was neutral. The decanted organic layer was dried over magnesium sulfate, and evaporated to dryness. The crude product was purified by column chromatography using hexane/ethyl acetate (1:1 v/v) as eluent. Finally, the product was sublimed under reduced pressure.

HPLC purity: 99.76%

$^1$H NMR (CDCl$_3$, 25° C.): δ=8.49 (s, 2H); 8.25 (d, J=12.5 Hz, 1H); 8.04 (m, 4H); 7.97 (m, 4H); 7.93 (m, 1H); 7.88 (d, J=1.5 Hz, 2H); 7.68 (m, 4H), 7.58 (t, J=1.4 Hz, 1H); 7.46 (m, 16H) ppm.

$^{13}$C NMR (CDCl$_3$, 25° C.): δ=141.00 (J=11.8 Hz); 140.17; 139.67; 135.99; 133.82; 133.75; 133.00; 132.78; 132.00 (J=10.0 Hz); 131.90 (J=2.5 Hz); 131.29; 131.02 (J=10.3 Hz); 130.77; 130.75 (J=12.7 Hz); 130.16; 129.11; 128.85 (J=12.7 Hz); 128.44 (J=11.8 Hz); 126.87; 126.52; 125.66; 125.06 ppm $^{31}$P (CDCl$_3$, 25° C.): δ=29.13 ppm.

(3',5'-di(anthracen-9-yl)-[1,1'-biphenyl]-4-yl)diphenylphosphine oxide (B22)

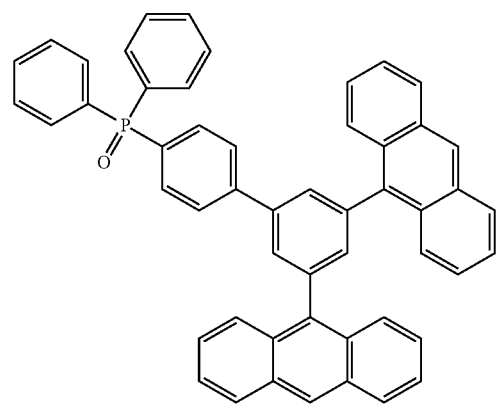 [SMILES: O=P(c1ccccc1)(c1ccccc1)c1ccc(-c2cc(-c3c4ccccc4cc4ccccc34)cc(-c3c4ccccc4cc4ccccc34)c2)cc1]

1st and 2nd step: see B21

3rd step: (3',5'-di(anthracen-9-yl)-[1,1'-biphenyl]-4-yl)diphenylphosphine oxide 2-(3,5-di(anthracen-9-yl)phenyl)-4,4,5,5-tetramethyl-1,3,2-dioxaborolane (3.21 g, 5.76 mmol, 1.0 eq), (4-bromophenyl)diphenyl phosphine oxide (2.3 g, 6.34 mmol, 1.1 eq) and potassium carbonate (1.19 g, 8.64 mmol, 1.5 eq) were suspended in a mixture of toluene (30 mL), ethanol (5.3 mL), and water (8.7 mL). Following degassing with argon, tetrakis(triphenylphosphine) palladium(0) (130 mg, 0.12 mmol, 2.0 mol. %) was added, and the solution was stirred at 100° C. for 17 h. After cooling to RT, the mixture was filtrated over a layer of Florisil; the filtrate was extracted with DCM and water until the aqueous phase was neutral. The decanted organic layer was dried over magnesium sulfate, and evaporated to dryness. The crude product was purified by gel filtration using hexane/ethyl acetate (1:1 v/v) as eluent. The product was then triturated in hexane to induce precipitation. After filtration, the product was dried in vacuum at 40° C., and finally sublimed under reduced pressure.

HPLC purity: 99.78%

$^1$H NMR (CDCl$_3$, 25° C.): δ=8.50 (s, 2H); 8.05 (d, J=7.5 Hz, 4H); 7.91 (d, J=1.5 Hz, 2H); 7.85 (dd, J=2.4, 8.4 Hz, 2H); 7.74 (dd, J=8.4, 11.6 Hz, 2H); 7.67 (m, 4H); 7.59 (t, J=1.4 Hz, 1H); 7.52 (td, J=1.3, 7.4 Hz, 2H); 7.45 (m, 12H) ppm.

$^{13}$C NMR (CDCl$_3$, 25° C.): δ=143.88 (J=2.08 Hz); 139.99; 139.80; 136.01; 134.18; 132.84; 132.75 (J=10. Hz); 132.08 (J=10.0 Hz); 131.98 (J=2.7 Hz); 131.38; 130.22; 129.23; 128.57; 128.51; 128.47; 127.31 (J=12.6 Hz); 126.99; 126.53; 125.75; 125.16 ppm $^{31}$P (CDCl$_3$, 25° C.): δ=29.22 ppm.

(4-[9,9'-bianthracen-10-yl]phenyl)diphenylphosphine oxide (B23)

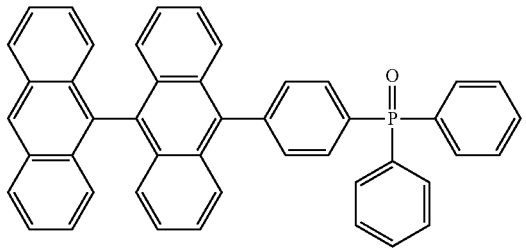 [SMILES: O=P(c1ccccc1)(c1ccccc1)c1ccc(-c2c3ccccc3c(-c3c4ccccc4cc4ccccc34)c3ccccc23)cc1]

1st step: (4-(anthracen-9-yl)phenyl)diphenylphosphine oxide (4-bromophenyl)diphenylphosphine oxide (22.7 g, 63.5 mmol, 1.0 eq), 9-anthracene boronic acid (15.5 g, 69.9 mmol, 1.1 eq), tetrakis(triphenylphosphine) palladium(0) (1.46 g, 1.27 mmol, 2.0 mol. %) were dissolved in degassed DME (245 mL). A degassed solution of potassium carbonate (26.3 g, 190.5 mmol, 3.0 eq) in water (97 mL) was added, and the mixture was stirred 19 h at 95° C. After cooling to RT, the precipitate was filtered off and washed with DME (2×100 mL). The crude product was then dissolved in THF, and filtered over a layer of silica. The filtrate was evaporated to dryness, and the resulting solid dried in vacuum at 40° C.

HPLC purity: 99.77%

2nd step: (4-(10-bromoanthracen-9-yl)phenyl)diphenylphosphine oxide (4-(anthracen-9-yl)phenyl)diphenyl phosphine oxide (12.6 g, 27.7 mmol, 1.0 eq) and 1-bromopyrrolidine-2,5-dione (4.93 g, 27.7 mmol, 1.0 eq) were placed in a flask, and dissolved in $CHCl_3$ (170 mL). The resulting solution was stirred for 6 h at room temperature. The organic phase was extracted with water (3×100 mL), decanted, dried over $Na_2SO_4$, and evaporated to dryness.

HPLC purity: 99.30%

3rd step: (4-[9,9'-bianthracen-10-yl]phenyl)diphenylphosphine oxide (4-(10-bromoanthracen-9-yl)phenyl)diphenyl phosphine oxide (5.0 g, 9.4 mmol, 1.0 eq), 9-anthracene boronic acid (3.12 g, 14.1 mmol, 1.5 eq), tris(dibenzylideneaceton)dipalladium(0) (172 mg, 0.19 mmol, 4.0 mol. %), dicyclohexyl (2',6'-dimethoxy-[1,1'-biphenyl]-2-yl)phosphine (308 mg, 0.75 mmol, 8.0 mol. %) and potassium phosphate (5.97 g, 28.1 mmol, 3.0 eq), were placed in a flask and suspended in toluene (20 mL). The resulting mixture was heated at 120° C. for 48 h. After cooling to RT, DCM and water were added; the organic phase was decanted and extracted with water until the aqueous was neutral. The aqueous layers were also extracted with ethyl acetate (2×200 mL) and decanted. The combined organic layers were extracted with an aqueous sodium diethylcarbamodithioate solution, decanted, dried over $MgSO_4$, and evaporated to dryness. The crude product was then re-crystallized from 1,4-dioxane, and finally sublimed under reduced pressure.

HPLC purity: 99.18%

$^1$H NMR ($CDCl_3$, 25° C.): δ=8.75 (s, 1H); 8.20 (d, J=8.6 Hz, 2H); 7.97 (dd, J=8.0, 11.7 Hz, 2H); 7.87 (m, 4H); 7.77 (m, 4H); 7.65 (m, 2H); 7.59 (m, 4H); 7.48 (m, 2H); 7.35 (m, 2H); 7.16 (m, 8H) ppm.

$^{13}$C NMR ($CDCl_3$, 25° C.): δ=143.62; 143.60; 137.12; 134.33; 134.05; 133.49; 133.22; 132.67; 132.56; 132.21; 131.77; 130.43; 129.27; 129.17; 127.98; 127.46; 127.41; 127.13; 126.51; 126.20; 126.14; 125.97 ppm $^{31}$P ($CDCl_3$, 25° C.): δ=27.44 ppm.

(3-(10-(dibenzo[b,d]furan-4-yl)anthracen-9-yl)phenyl)diphenylphosphine oxide (B24)

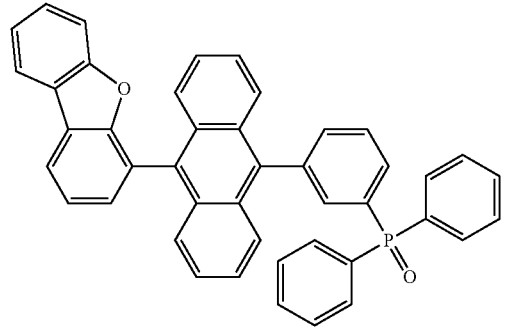 [SMILES: O=P(c1ccccc1)(c1ccccc1)c1cccc(-c2c3ccccc3c(-c3cccc4c3oc3ccccc34)c3ccccc23)c1]

1st and 2nd step: see B17

3rd step: (3-(10-(dibenzo[b,d]furan-4-yl)anthracen-9-yl)phenyl)diphenylphosphine oxide (3-(10-bromoanthracen-9-yl)phenyl)diphenylphosphine oxide (5.0 g, 9.4 mmol, 1.0 eq), dibenzo[b,d]furan-4-boronic acid (2.98 g, 14.1 mmol, 1.5 eq), tetrakis(triphenylphosphine) palladium(0) (216 mg, 0.19 mmol, 2.0 mol. %), and potassium carbonate (3.89 g, 28.1 mmol, 3.0 eq) were placed in a flask and dissolved in a mixture of DME and water (2.5:1 v/v, 70 mL). The resulting solution was degassed with argon and refluxed for 16 h at 95° C. After cooling to RT, DCM (50 mL) and water (30 mL) were added; the organic layer was decanted, and further extracted with water (30 mL). After decantation, it was dried over $MgSO_4$ and evaporated to dryness. The crude product was dissolved in ethyl acetate (50 mL) and precipitated by addition of hexane (100 mL). The solid was collected by filtration, and then recrystallized with toluene (with aliquots of hexane to help precipitation). The solid was then dissolved in DCM (50 mL) and filtered over a pad of silica using DCM/methanol (9:1 v/v) as eluent. Following evaporation, the product was dried under vacuum at 40° C., and finally sublimed under reduced pressure.

HPLC purity: 99.95%

$^1$H NMR ($CDCl_3$, 25° C.): δ=8.22 (dd, J=0.12, 7.7 Hz, 1H); 8.12 (m, 1H); 8.06-7.93 (m, 1H); 7.99-7.93 (m, 1H); 7.82-7.72 (m, 7H); 7.69 (m, 2H); 7.65-7.61 (m, 3H); 7.58-7.54 (m, 3H); 7.53-7.47 (m, 4H); 7.42-7.29 (m, 7H) ppm.

$^{13}$C NMR ($CDCl_3$, 25° C.): δ=156.85; 155.59; 139.84 (J=12.3 Hz); 139.72 (J=14.5 Hz); 137.14; 135.51 (J=2.8, 9.6 Hz); 135.20 (J=3.6, 10.4 Hz); 134.72 (J=12.5 Hz); 133.95 (J=2.0 Hz); 133.85; 133.13 (J=2.2 Hz); 132.60 (J=1.2 Hz); 132.53; 132.30 (J=1.3 Hz); 139.98 (J=5.5, 9.2 Hz); 130.95; 130.89; 130.72; 130.48 (J=1.8 Hz); 129.45 (J=3.6, 12.3 Hz); 129.15 (J=3.0, 12.0 Hz); 127.97; 127.23; 127.19; 126.13

(J=1.3 Hz); 125.20 (J=1.9 Hz); 124.84 (J=4.2 Hz); 123.72 (J=3.1 Hz); 123.52 (J=2.0 Hz); 123.27 (J=0.4 Hz); 121.41 (J=3.8 Hz); 121.16; 123.32 (J=0.4 Hz) ppm.

$^{31}$P (CDCl$_3$, 25° C.): δ=23.72 ppm.

Other compounds were synthesized similarly, and showed following thermal properties:

A15 T$_g$ 143° C., B26 mp 343° C., B27 T$_g$ 167° C., mp 371° C.

diphenyl(pyren-1-yl)phosphine oxide (C1)

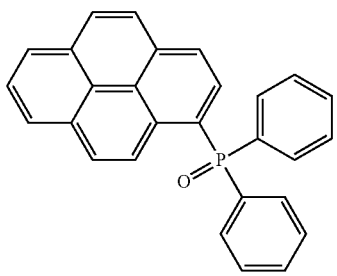 [SMILES: O=P(c1ccccc1)(c1ccccc1)c1ccc2ccc3cccc4ccc1c2c34]

Known (CAS 110988-94-8) for long, e.g. from JP 4 876 333 B2, commercially available.

(9,10-di(naphthalen-2-yl)anthracen-2-yl)diphenylphosphine oxide (C2)

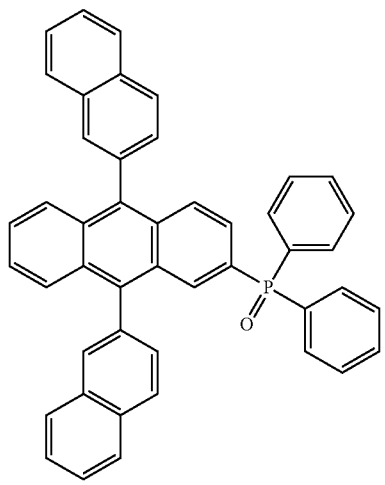 [SMILES: O=P(c1ccccc1)(c1ccccc1)c1ccc2c(-c3ccc4ccccc4c3)c3ccccc3c(-c3ccc4ccccc4c3)c2c1]

Synthesis according to general procedure A)
2-bromo-9,10-di(naphth-2-yl)-anthracene: 5.00 g (1.0 eq, 9.81 mmol)
n-butyl lithium, 2.5M in hexane: 4.7 mL (1.2 eq, 11.77 mmol)
THF: 50 mL
chlorodiphenylphosphine: 2.1 mL (1.2 eq, 11.77 mmol)
DCM: 60 mL
H$_2$O$_2$, 30 wt. % in water: 15 mL
column chromatography (SiO$_2$, hexane:EE 1:1)
Yield: 3.20 g (52%)
Melting point: none (glassy compound)
ESI-MS: m/z=631 (M+H$^+$)

phenyldi(pyren-1-yl)phosphine oxide (C3)

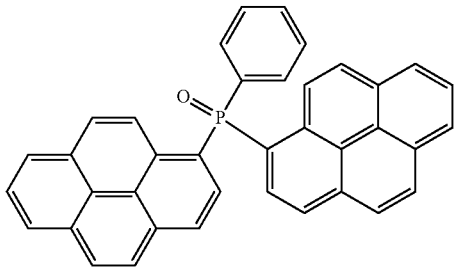 [SMILES: O=P(c1ccccc1)(c1ccc2ccc3cccc4ccc1c2c34)c1ccc2ccc3cccc4ccc1c2c34]

CAS721969-93-3. Commercially available, e.g. from Luminescence Technology Corp (TW).

Dopants:

lithium quinolin-8-olate (D1)

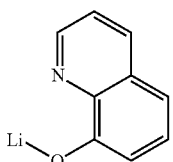

Commercially available lithium tetra(1H-pyrazol-1-yl)borate (D2)

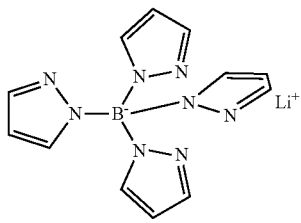 [SMILES: c1cnn([B-](n2cccn2)(n2cccn2)n2cccn2)c1 ; [Li+]]

Synthesis according to patent application WO2013/079676.

DEVICE EXAMPLES

All data shown here are typical examples. The data in Table 1 are medians over typically 16 identical diodes, which are described in the following examples.

Example 1

Bottom emission blue emitting OLED was made by depositing a 10 nm layer of N4,N4"-di(naphthalen-1-yl)-N4,N4"-diphenyl-[1,1':4',1"-terphenyl]-4,4"-diamine (HTM3) doped with 2,2',2"-(cyclopropane-1,2,3-triylidene)tris(2-(p-cyanotetrafluorophenyl)acetonitrile) (PD2, matrix to dopant weight ratio 92:8) onto a 90 nm thick ITO-glass substrate, followed by an 120 nm undoped layer of HTM3. Subsequently, a blue fluorescent emitting layer of ABH113 (Sun Fine Chemicals) doped with NUBD370 (Sun Fine Chemicals) (97:3 weight ratio) was deposited with a thickness of 20 nm. A 36 nm layer of the tested inventive or comparative compound was deposited on the emitting layer together with 50 wt. % D1 or 25 wt. % D2 as ETL. D1, D2 and the inventive and comparative compounds were deposited from separate sources. Subsequently, a layer of aluminium with a thickness of 100 nm was deposited. The observed voltages and quantum efficiencies at the current density 10 mA/cm² are reported in the Table 1.

The data underline the beneficial effect of introducing a phenylene spacer unit A into known triaryl phosphine oxide electron transport materials, especially if compound of formula (I) is used with compound of formula (II) as n-dopant. Moreover, new and particularly advantageous combinations of structural moieties forming the phenylene spacer unit A and/or the electron transport unit E have been identified.

The features disclosed in the foregoing description, in the claims and in the accompanying drawings may both separately and in any combination be material for realizing the invention in diverse forms thereof.

Used Acronyms and Abbreviations

CGL charge generating layer
CV cyclovoltammetry
DCM dichloromethane
DSC differential scanning calorimetry
DFT density functional theory
DME 1,2-dimethoxyethane
EA electron affinity
EE ethylester (ethyl acetate)
EI electron impact (direct inlet mass spectroscopy)
EIL electron injection layer
ESI electrospray ionization (mass spectroscopy)
ETL electron transporting layer
ETM electron transporting matrix
Fc⁺/Fc ferrocenium/ferrocene reference system
GC gas chromatography
HIL hole injection layer
HPLC high performance liquid chromatography
HOMO highest occupied molecular orbital
HTL hole transporting layer
HTM hole transporting matrix
IP ionisation potential
IPES inverted photoelectron spectroscopy
ITO indium tin oxide
LDA lithium diisopropyl amide
LUMO lowest unoccupied molecular orbital
MS mass spectroscopy
NBS N-brom-succinimide
NMR nuclear magnetic resonance
OLED organic light emitting diode
RT room temperature
SPS solvent purification system
TGA thermogravimetry thermal analysis
THF tetrahydrofuran
TLC thin layer chromatography
UPS ultraviolet photoelectron spectroscopy
UV spectroscopy in the ultra violet/visible range of light spectrum
VTE vacuum thermal evaporation
eq chemical equivalent
mol. % molar percent
vol. % volume percent
v/v volume to volume (ratio)
wt. % weight (mass) percent
mp melting point
n.a. not applicable

The invention claimed is:
1. A compound having the structure according to formula (I)

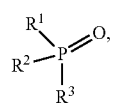

wherein in structure (I):
$R^1$, $R^2$ and $R^3$ are independently selected from $C_1$-$C_{30}$-alkyl, $C_3$-$C_{30}$ cycloalkyl, $C_2$-$C_{30}$-heteroalkyl, $C_6$-$C_{30}$-aryl, $C_2$-$C_{30}$-heteroaryl, $C_1$-$C_{30}$-alkoxy, $C_3$-$C_{30}$-cycloalkyloxy, $C_6$-$C_{30}$-aryloxy, and from a structural unit having general formula E-A-, and at least one group selected from $R^1$, $R^2$ and $R^3$ has the general formula E-A;
wherein
A is a $C_6$-$C_{30}$ phenylene spacer unit, and
E is an electron transport unit having the structure (Ib), (Ic), (Id) and/or (Ie):

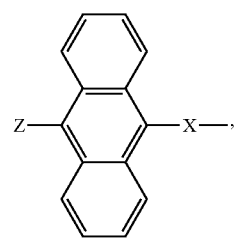

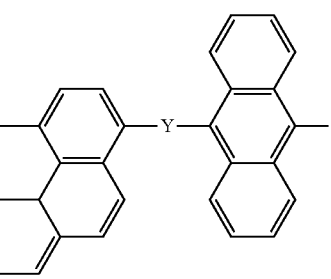

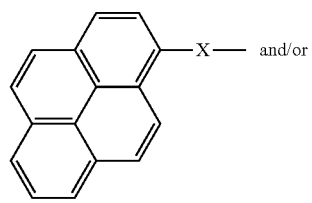

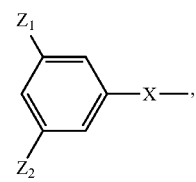

wherein in structure (Ib)
X is a single bond and
Z is selected from a group comprising dibenzo[b,d]furanyl, dibenzo[b,d]thiophenyl, 9-anthranyl, pyren-1-yl, pyren-2-yl, 9,9'-dialkylfluoren-2-yl, 9,9'-diarylfluoren-2-yl, 9-alkyl-9'-arylfluoren-2-yl, 9,9'-dialkylfluoren-3-yl, 9,9'-diarylfluoren-3-yl, 9-alkyl-9'-arylfluoren-3-yl, phenanthren-1-yl and phenanthren-3-yl; or wherein in structure (Ib)
X is selected from a group comprising phenylene, biphenyl, naphthalen-1,8-diyl, naphthalen-2,6-diyl, 9,9'-dialkylfluoren-2,7-diyl, 9,9'-diarylfluoren-2,7-diyl, 9-alkyl-9'-arylfluoren-2,7-diyl, 9,9'-dialkylfluoren-3,6-diyl, 9,9'-diarylfluoren-3,6-diyl and 9-alkyl-9'-arylfluoren-3,6-diyl; and
Z is selected from a group comprising hydrogen, dibenzo[b,d]furanyl, dibenzo[b,d]thiophenyl, 9-anthranyl, pyren-1-yl, pyren-2-yl, 9,9'-dialkylfluoren-2-yl, 9,9'-diarylfluoren-2-yl, 9-alkyl-9'-arylfluoren-2-yl, 9,9'-dialkylfluoren-3-yl, 9,9'-diarylfluoren-3-yl, 9-alkyl-9'-arylfluoren-3-yl, phenanthren-1-yl and phenanthren-3-yl;

wherein in structure (Ic)
X is selected from a single bond, phenylene and 1,1'-biphenyl-diyl; and
Y is phenylene;

wherein in structure (Id)
X is selected from a group comprising phenylene, 1,1'-biphenyl-diyl, naphthalen-1,8-diyl, naphthalen-2,6-diyl, 9,9'-dialkylfluoren-2,7-diyl, 9,9'-diarylfluoren-2,7-diyl, 9-alkyl-9'-arylfluoren-2,7-diyl, 9,9'-dialkylfluoren-3,6-diyl, 9,9'-diarylfluoren-3,6-diyl and 9-alkyl-9'-arylfluoren-3,6-diyl;

wherein in structure (Ie)
X is a single bond; and
$Z_1$ and $Z_2$ are independently selected from a group comprising phenyl, naphthyl, dibenzo[b,d]furanyl, dibenzo[b,d]thiophenyl, 9-anthranyl, pyren-1-yl, pyren-2-yl, 9,9'-dialkylfluoren-2-yl, 9,9'-diarylfluoren-2-yl, 9-alkyl-9'-arylfluoren-2-yl, 9,9'-dialkylfluoren-3-yl, 9,9'-diarylfluoren-3-yl, 9-alkyl-9'-arylfluoren-3-yl, phenanthrene-1-yl and phenanthrene-3-yl;

wherein the following structures are excluded:

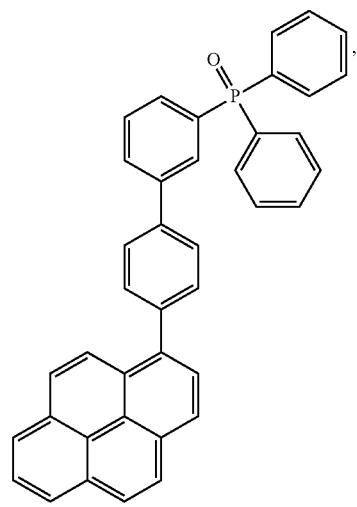

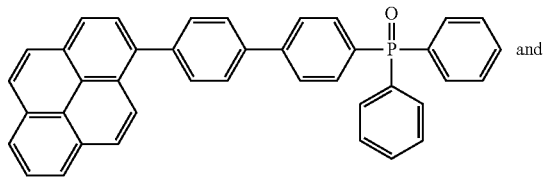

and

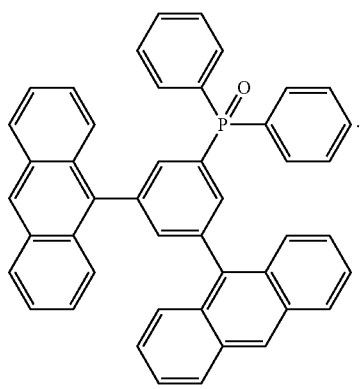

2. Compound according to claim 1, wherein at least one of substituents $R^1$, $R^2$ and/or $R^3$ is a phenyl.

3. Compound according to claim 1, wherein A is selected from the group comprising a phenylene spacer unit, m-phenylene spacer unit, p-phenylene spacer unit, biphenyl spacer unit, m-biphenyl spacer unit, p-biphenyl spacer unit, terphenyl spacer unit, m-terphenyl spacer unit or p-terphenyl spacer unit.

4. Compound according to claim 1, wherein
in structure (I):
$R^1$, $R^2$ and $R^3$ are independently selected from $C_1$-$C_{12}$-alkyl, $C_6$-$C_{20}$-aryl, and from the structural unit having general formula E-A-, wherein and at least one group selected from $R^1$, $R^2$ and $R^3$ has the general formula E-A.

5. Compound according to claim 1, wherein the compound of formula (I) is represented by any of the following formulas:

A8

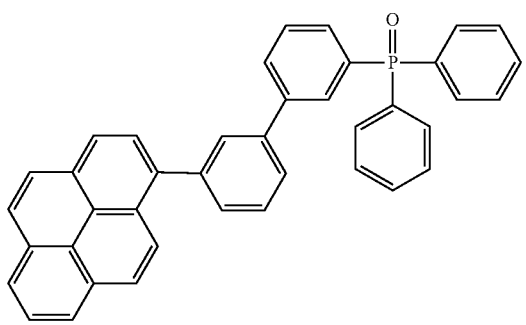

-continued
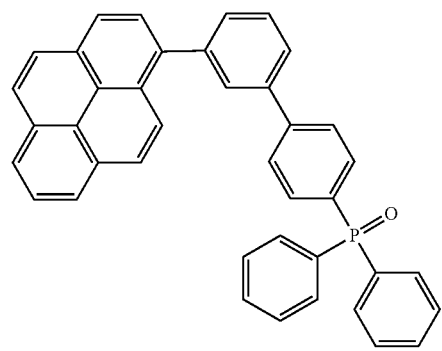
A9
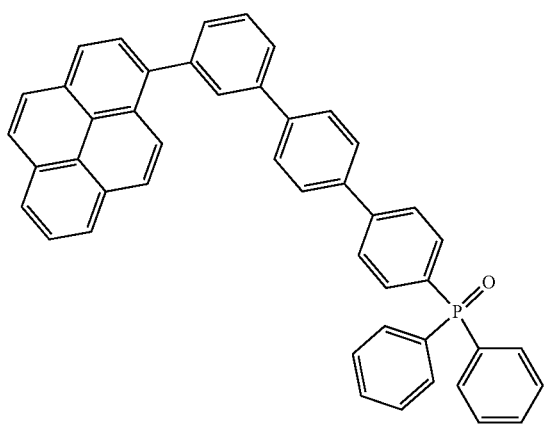
A13
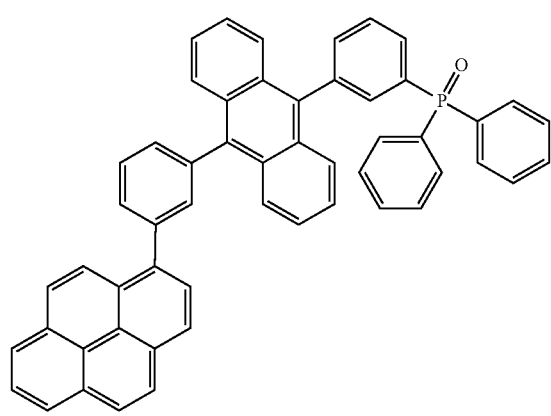
A10
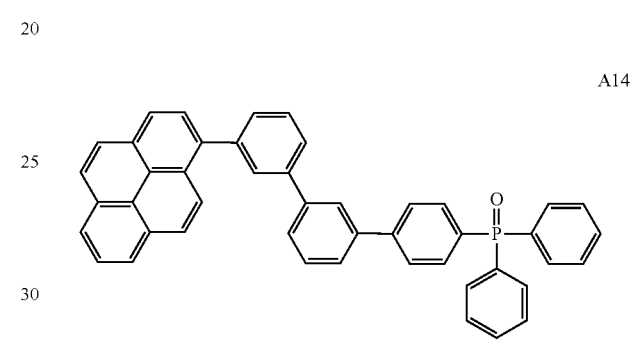
A14
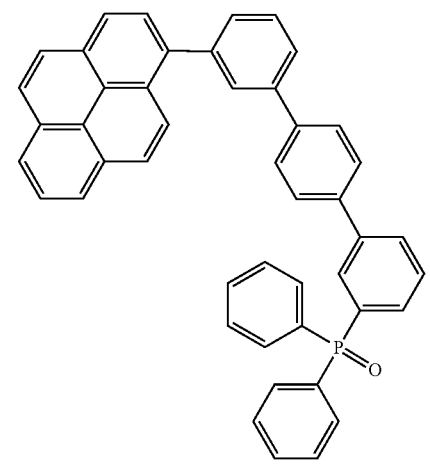
A11
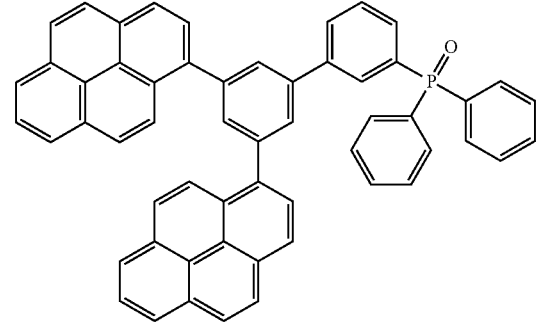
A15
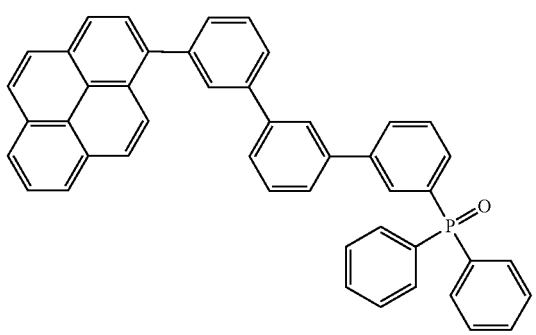
A12
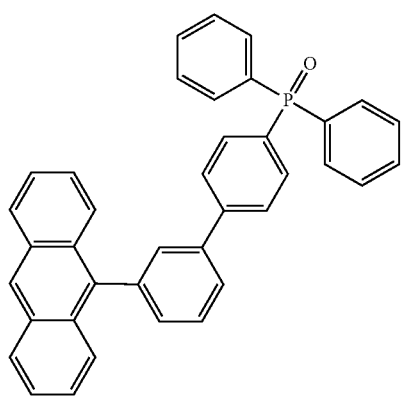
B12

B16 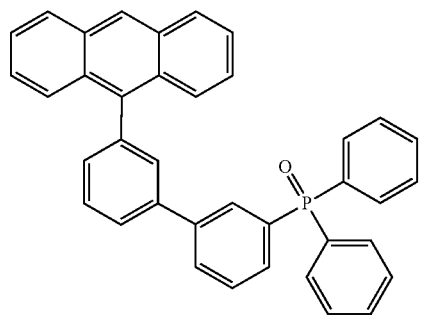
B22 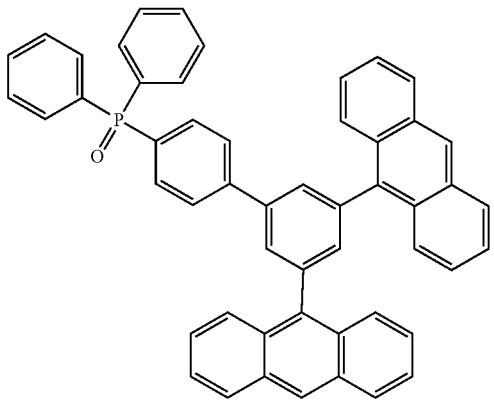
B17 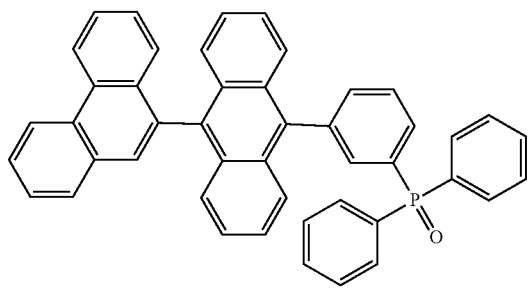
B23 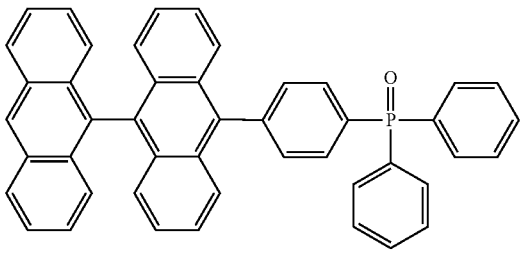
B19 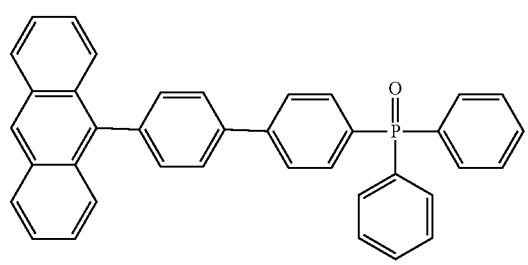
B24 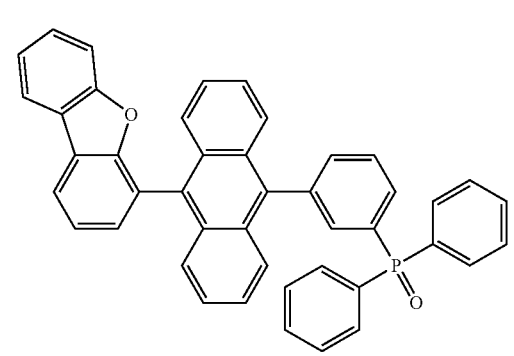
B20 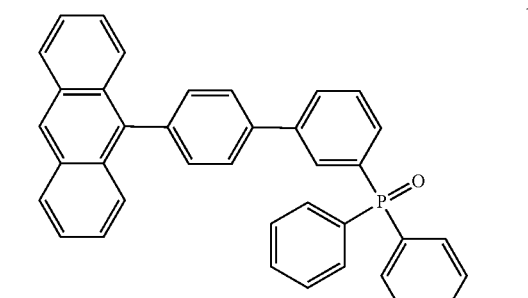
B25 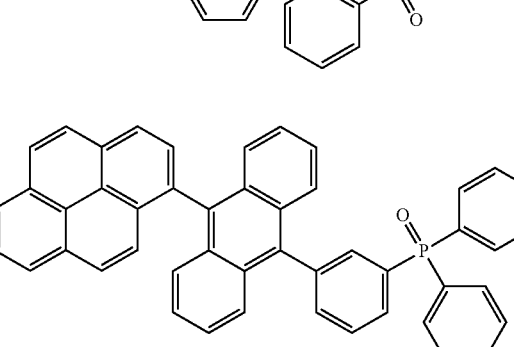
B21 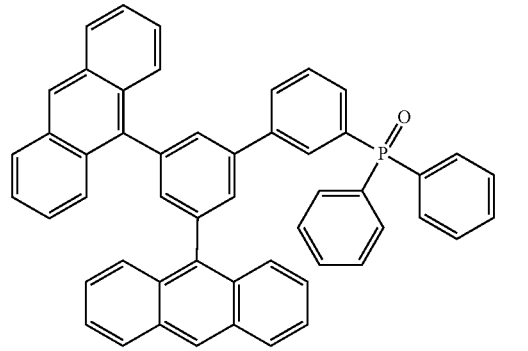
B26 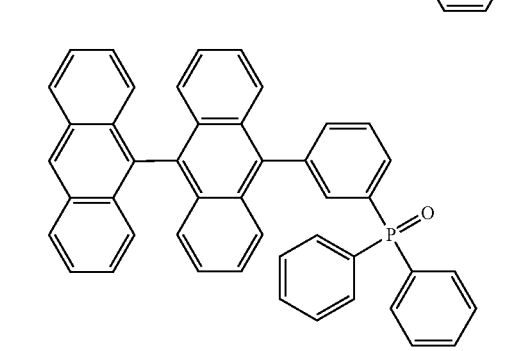

-continued
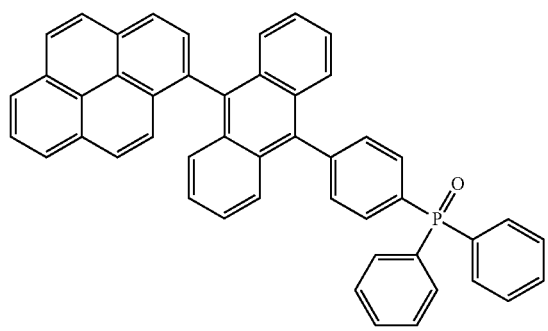
B27
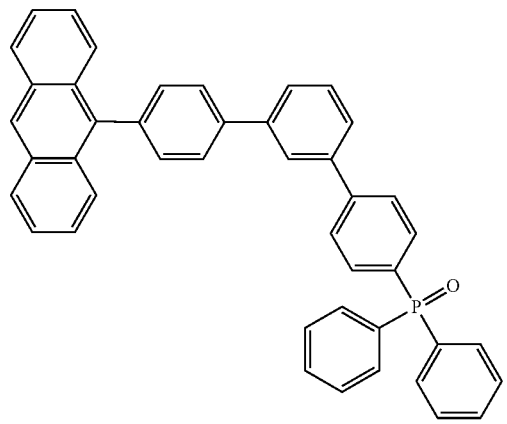
B31
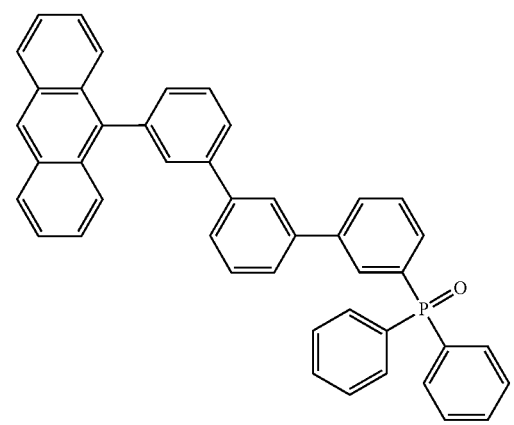
B28
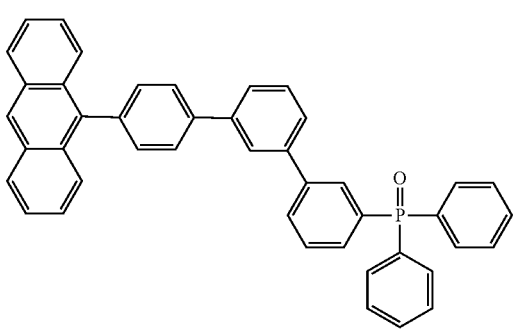
B32
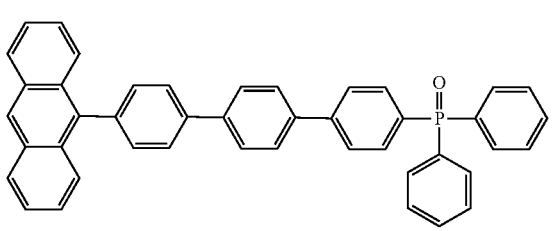
B29
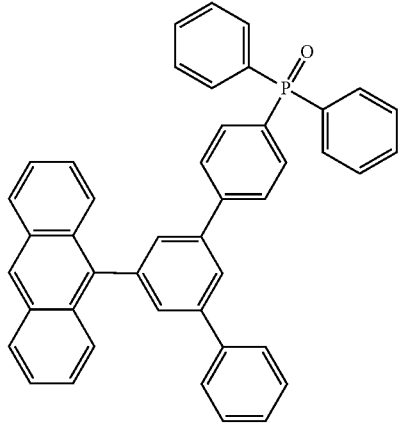
B37
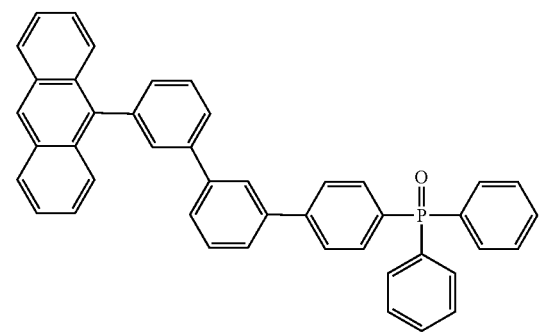
B30
6. Semiconducting material comprising:
i) a compound according to claim 1; and
ii) at least one complex of a monovalent metal having formula (II):
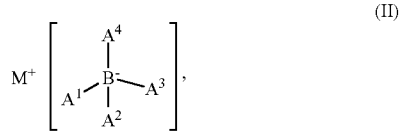
wherein
M⁺ is a positive metal ion bearing a single elementary charge, and
each of $A^1$, $A^2$, $A^3$ and $A^4$ is independently selected from H and substituted or unsubstituted $C_2$-$C_{20}$ heteroaryl, wherein a heteroaryl ring of at least 5 ring-forming atoms of the substituted or unsubstituted $C_2$-$C_{20}$ heteroaryl comprises at least one hetero atom selected from O, S and N.

7. Semiconducting material according to claim 6, comprising:
i) a compound according to claim 1,
wherein
$R^1$, $R^2$ and $R^3$ are independently selected from $C_6$-$C_{30}$-aryl or $C_2$-$C_{30}$-heteroaryl; and from structural unit having general formula E-A-;
wherein
in compound (I), at least one of substituents $R^1$, $R^2$ and/or $R^3$ is phenyl,
at least one group selected from $R^1$, $R^2$ and $R^3$ has the general formula E-A-; and
ii) at least one complex of a monovalent metal having formula (II):

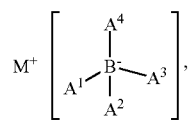

(II)

wherein
M⁺ is a lithium cation (Li⁺), and
each of $A^1$, $A^2$, $A^3$ and $A^4$ is a heteroaryl ring of at least 5 ring-forming atoms comprises at least one hetero atom N.

8. Semiconducting material according to claim 6, wherein in the compound (I) A is a $C_6$-$C_{30}$ phenylene spacer unit, or a $C_6$-$C_{30}$ m-phenylene spacer unit or $C_6$-$C_{30}$ p-phenylene spacer unit.

9. Semiconducting material according to claim 8, wherein A is a spacer unit selected from a group comprising phenylene, biphenyl, naphthalen-1,8-diyl, naphthalen-2,6-diyl, 9,9'-dialkylfluoren-2,7-diyl, 9,9'-diarylfluoren-2,7-diyl, 9-alkyl-9'-arylfluoren-2,7-diyl, 9,9'-dialkylfluoren-3,6-diyl, 9,9'-diarylfluoren-3,6-diyl and 9-alkyl-9'-arylfluoren-3,6-diyl, wherein alkyl is C1-C12 alkyl and aryl is C6-C20 aryl.

10. Semiconducting material according to claim 6, wherein in the compound (I), in any general formula E-A-
i) A is a $C_6$-$C_{30}$ m-phenylene or a p-phenylene spacer unit; or
ii) A is a $C_6$-$C_{30}$ m-phenylene spacer unit.

11. Semiconducting material according to claim 6, wherein the compound of formula (I) is represented by any of the following formulas:

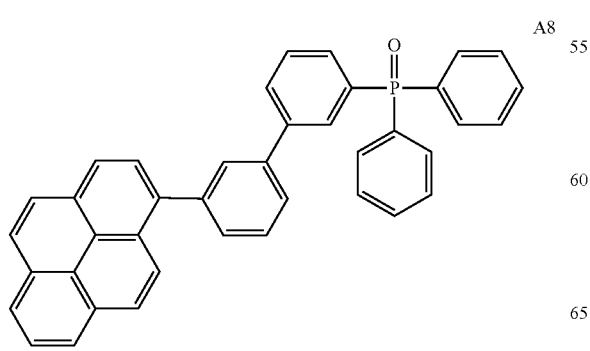

A8

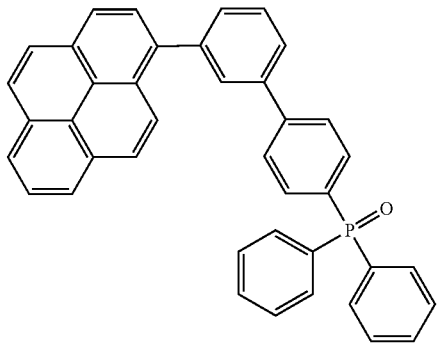

A9

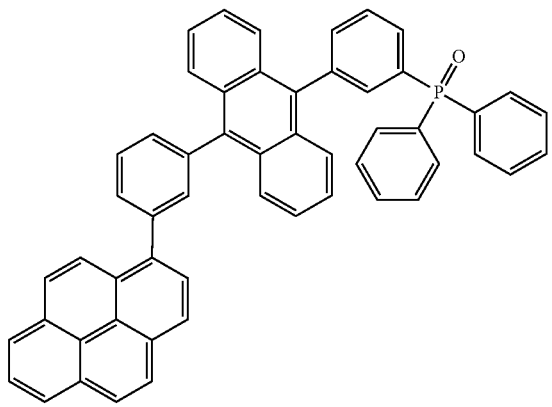

A10

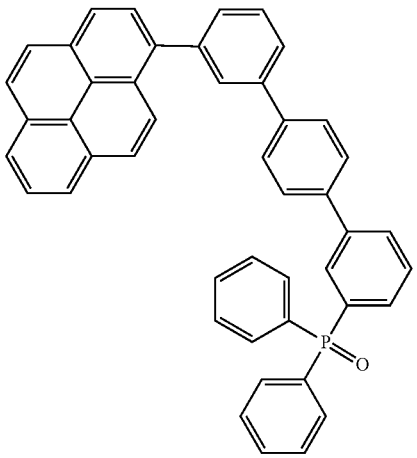

A11

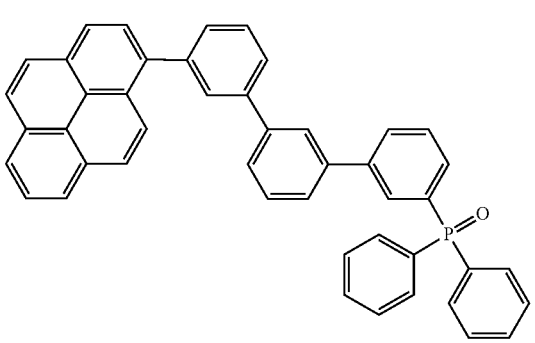

A12

A13
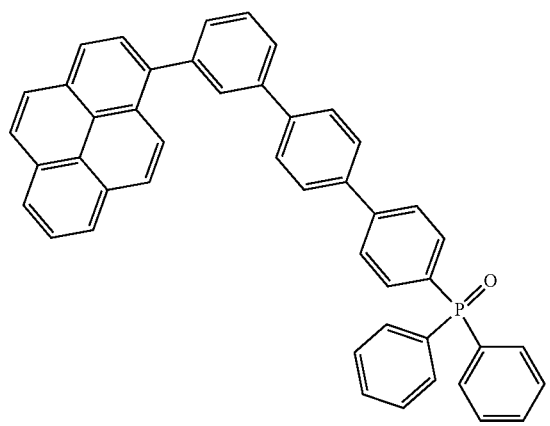
A14
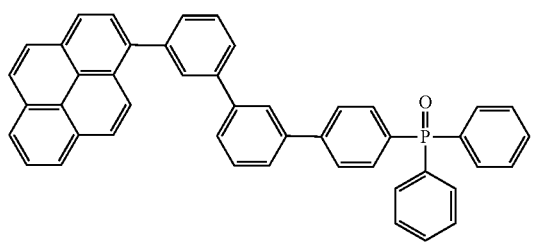
A15
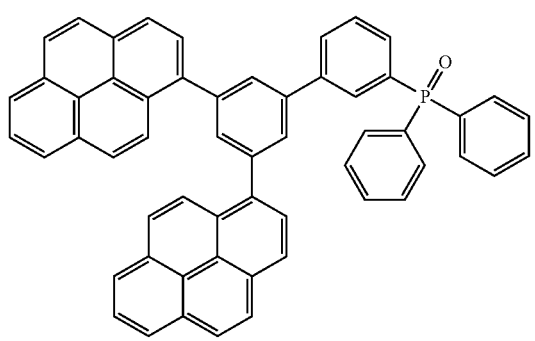
A16
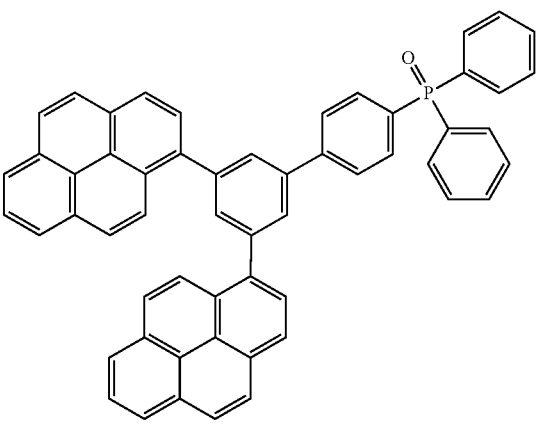
B12
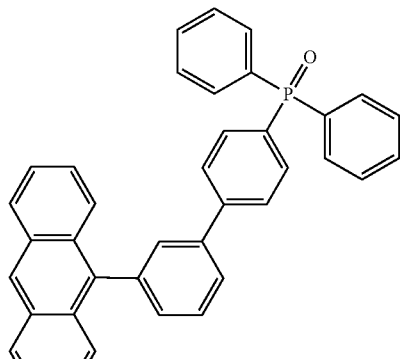
B16
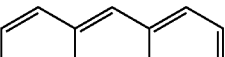
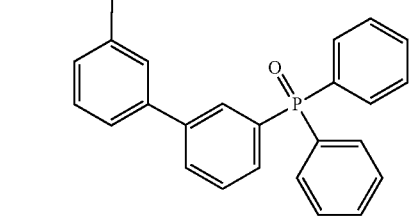
B17
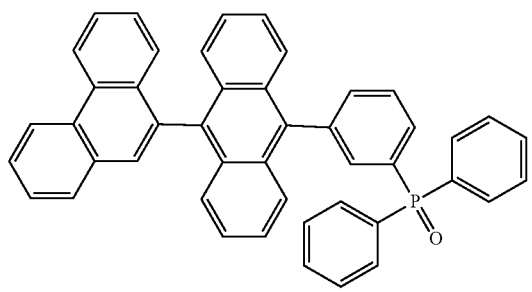
B19
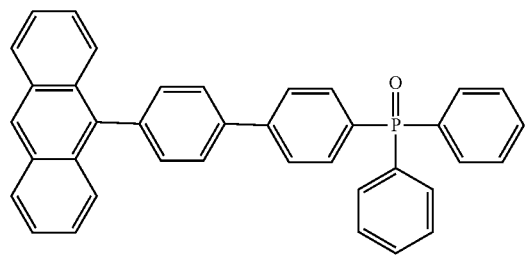
B20
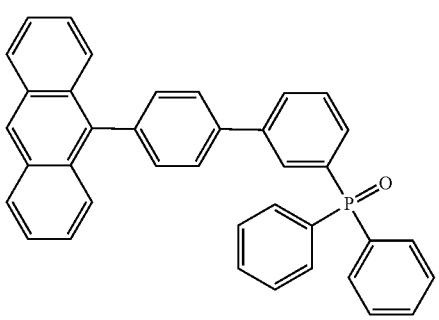

-continued
B21
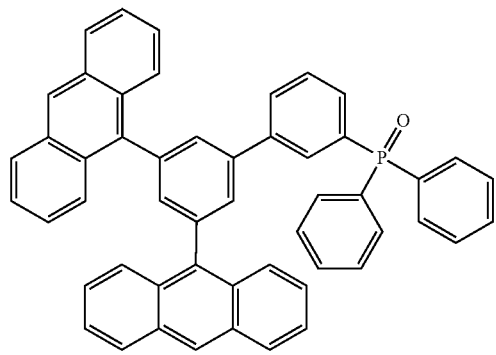
B22
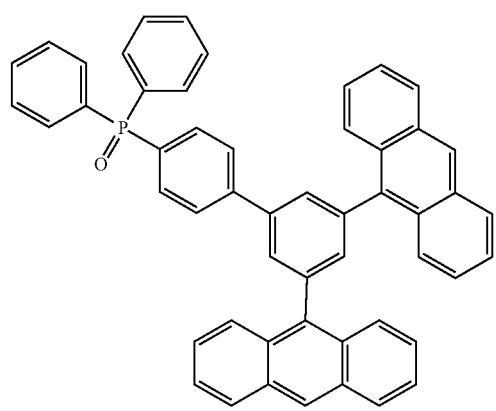
B23
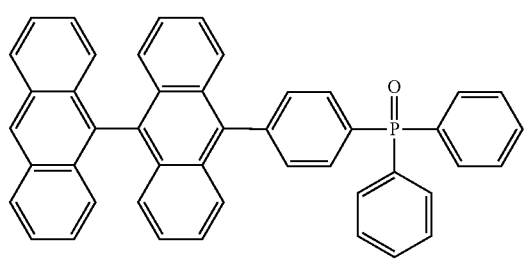
B24
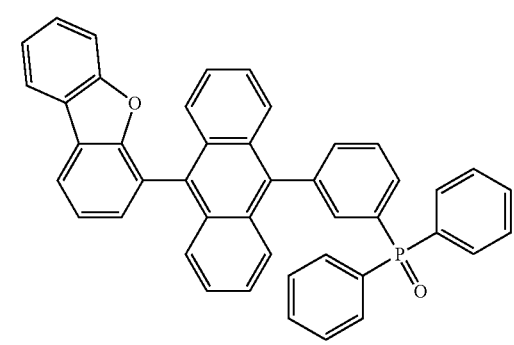
-continued
B25
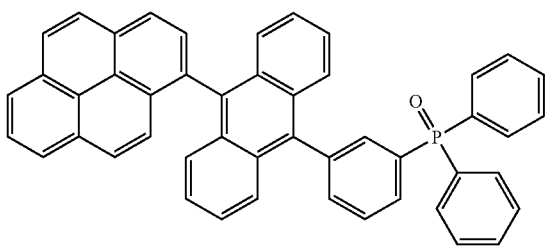
B26
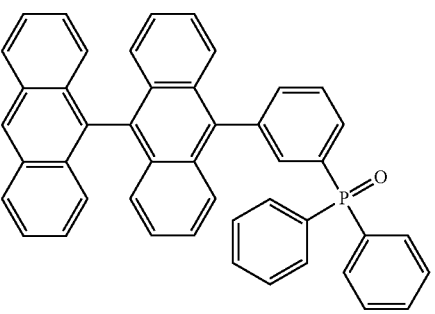
B27
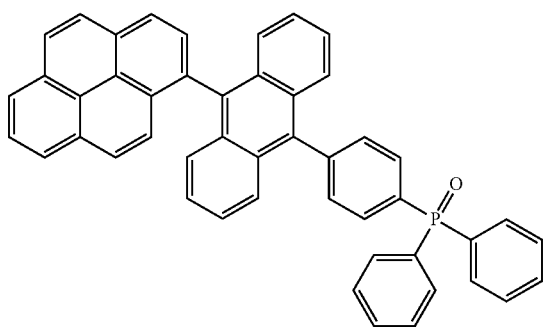
B28
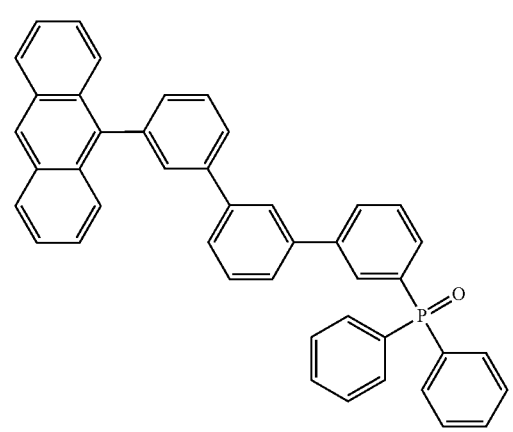

B29
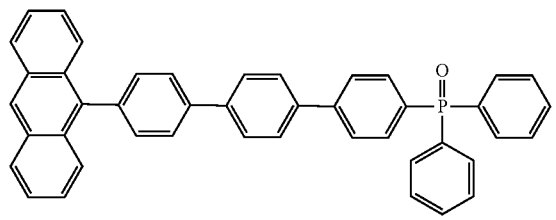

B30
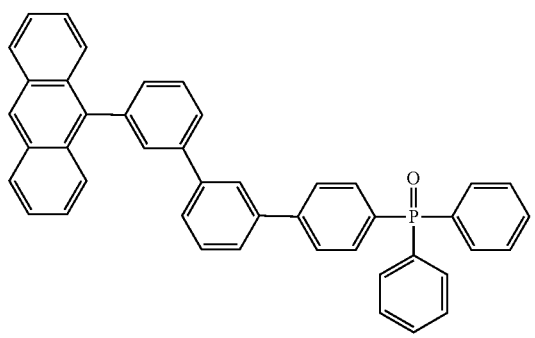

B31
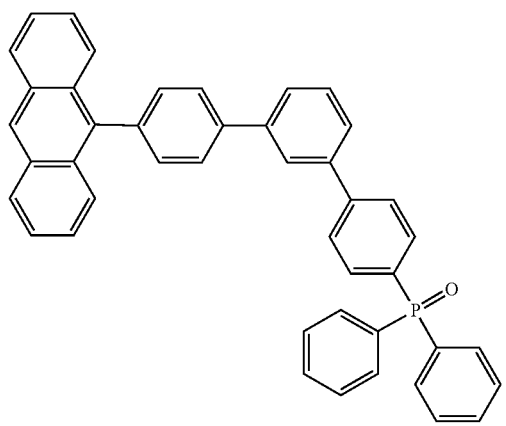

B32
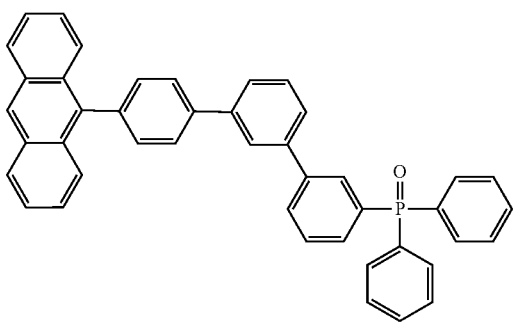

B37
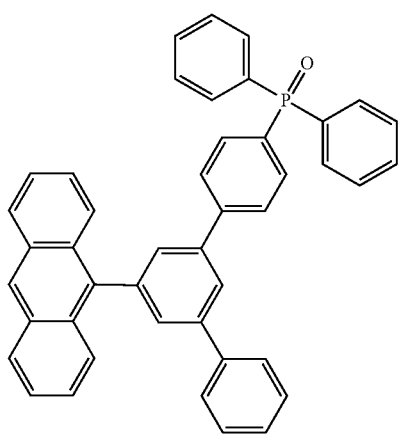

12. Semiconducting material according to claim 6, wherein in the compound (II), each nitrogen containing heteroaryl is attached to the central boron atom through a boron-nitrogen bond.

13. Electronic device comprising a cathode, an anode and the semiconducting material according to claim 6, wherein the semiconducting material is arranged between the cathode and the anode.

14. Electronic device according to claim 13, wherein the semiconducting material is contained in an electron transporting layer and/or electron injecting layer.

15. Electronic device according to claim 13, which is a light emitting device.

* * * * *